(12) United States Patent
Okuyama

(10) Patent No.: US 9,786,638 B2
(45) Date of Patent: *Oct. 10, 2017

(54) LIGHT-EMITTING DEVICE AND DISPLAY DEVICE

(71) Applicant: Sony Corporation, Tokyo (JP)

(72) Inventor: Hiroyuki Okuyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/167,410

(22) Filed: May 27, 2016

(65) Prior Publication Data

US 2016/0276323 A1    Sep. 22, 2016

Related U.S. Application Data

(62) Division of application No. 13/268,245, filed on Oct. 7, 2011, now Pat. No. 9,373,274.

(30) Foreign Application Priority Data

Oct. 15, 2010    (JP) .................................. 2010-232752

(51) Int. Cl.
*G09F 9/33*    (2006.01)
*H01L 25/075*    (2006.01)
(Continued)

(52) U.S. Cl.
CPC ............ *H01L 25/0753* (2013.01); *G09F 9/33* (2013.01); *H01L 25/167* (2013.01); *H01L 33/16* (2013.01);
(Continued)

(58) Field of Classification Search
CPC .. H01L 25/0753; H01L 33/16; H01L 27/3206
See application file for complete search history.

(56) References Cited

U.S. PATENT DOCUMENTS 6,072,197 A * 6/2000 Horino .................. H01L 27/153
257/103
9,373,274 B2 * 6/2016 Okuyama ................. G09F 9/33
(Continued)

FOREIGN PATENT DOCUMENTS

JP    2002-182580 A    6/2002
JP    2004-185972 A    7/2004
(Continued)

OTHER PUBLICATIONS

English translation provided by AIPN of JP 2010161221 A, Jul. 22, 2010.*
U.S. Appl. No. 13/268,245, filed Oct. 7, 2011, Okuyama.

*Primary Examiner* — Stephen Bradley
(74) *Attorney, Agent, or Firm* — Wolf, Greenfield & Sacks, P.C.

(57) ABSTRACT

Disclosed herein is a light-emitting device including a plurality of first light-emitting elements mounted in a matrix form on a common wiring board. Each of the first light-emitting elements has a single crystal semiconductor multilayer structure and is a semiconductor element in the form of a chip that emits light in a given band of wavelengths. When attention is focused on the plurality of first light-emitting elements that belong in a given area of all the plurality of first light-emitting elements, the orientations of the common crystal axes of the first light-emitting elements adjacent to each other at least in one of the row and column directions differ.

4 Claims, 41 Drawing Sheets

(51) Int. Cl.
*H01L 25/16* (2006.01)
*H01L 33/16* (2010.01)
*H01L 33/62* (2010.01)
*H04N 9/30* (2006.01)
*H01L 27/32* (2006.01)
*H01L 33/20* (2010.01)

(52) U.S. Cl.
CPC ............ *H01L 33/62* (2013.01); *H04N 9/30* (2013.01); *H01L 27/3206* (2013.01); *H01L 33/20* (2013.01); *H01L 2924/0002* (2013.01)

(56) References Cited

U.S. PATENT DOCUMENTS

2008/0258156 A1* 10/2008 Hata ..................... H01L 33/20
 257/88
2012/0092389 A1 4/2012 Okuyama

FOREIGN PATENT DOCUMENTS

| JP | 2005-306189 A | 11/2005 |
| JP | 2006-041283 A | 2/2006 |
| JP | 2008-109098 A | 5/2008 |
| JP | 2010-161221 A | 7/2010 |
| JP | 2010161221 A * | 7/2010 |

\* cited by examiner

FIG.18

|  | 20R | | | | | | | | 400 |
|---|---|---|---|---|---|---|---|---|---|
| | ↑ R018 | ↑ R017 | ↑ R016 | ↑ R015 | ↑ R014 | ↑ R013 | ↑ R012 | ↑ R011 | |
| | ↑ R028 | ↑ R027 | ↑ R026 | ↑ R025 | ↑ R024 | ↑ R023 | ↑ R022 | ↑ R021 | |
| | ↑ R038 | ↑ R037 | ↑ R036 | ↑ R035 | ↑ R034 | ↑ R033 | ↑ R032 | ↑ R031 | |
| | ↑ R048 | ↑ R047 | ↑ R046 | ↑ R045 | ↑ R044 | ↑ R043 | ↑ R042 | ↑ R041 | |
| | ↑ R058 | ↑ R057 | ↑ R056 | ↑ R055 | ↑ R054 | ↑ R053 | ↑ R052 | ↑ R051 | |
| | ↑ R068 | ↑ R067 | ↑ R066 | ↑ R065 | ↑ R064 | ↑ R063 | ↑ R062 | ↑ R061 | |
| | ↑ R078 | ↑ R077 | ↑ R076 | ↑ R075 | ↑ R074 | ↑ R073 | ↑ R072 | ↑ R071 | |
| | ↑ R088 | ↑ R087 | ↑ R086 | ↑ R085 | ↑ R084 | ↑ R083 | ↑ R082 | ↑ R081 | |
| | ↑ R098 | ↑ R097 | ↑ R096 | ↑ R095 | ↑ R094 | ↑ R093 | ↑ R092 | ↑ R091 | |
| | ↑ R108 | ↑ R107 | ↑ R106 | ↑ R105 | ↑ R104 | ↑ R103 | ↑ R102 | ↑ R101 | |
| | ↑ R118 | ↑ R117 | ↑ R116 | ↑ R115 | ↑ R114 | ↑ R113 | ↑ R112 | ↑ R111 | |
| | ↑ R128 | ↑ R127 | ↑ R126 | ↑ R125 | ↑ R124 | ↑ R123 | ↑ R122 | ↑ R121 | |

| R011 | R012 | R013 | R014 | R015 | R016 | R017 | R018 | R019 |
| R021 | R022 | R023 | R024 | R025 | R026 | R027 | R028 | R029 |
| R031 | R032 | R033 | R034 | R035 | R036 | R037 | R038 | R039 |
| R041 | R042 | R043 | R044 | R045 | R046 | R047 | R048 | R049 |
| R051 | R052 | R053 | R054 | R055 | R056 | R057 | R058 | R059 |
| R061 | R062 | R063 | R064 | R065 | R066 | R067 | R068 | R069 |
| R071 | R072 | R073 | R074 | R075 | R076 | R077 | R078 | R079 |
| R081 | R082 | R083 | R084 | R085 | R086 | R087 | R088 | R089 |
| R091 | R092 | R093 | R094 | R095 | R096 | R097 | R098 | R099 |

| R019 | R018 | R017 | R016 | R015 | R014 | R013 | R012 | R011 |
| R029 | R028 | R027 | R026 | R025 | R024 | R023 | R022 | R021 |
| R039 | R038 | R037 | R036 | R035 | R034 | R033 | R032 | R031 |
| R049 | R048 | R047 | R046 | R045 | R044 | R043 | R042 | R041 |
| R059 | R058 | R057 | R056 | R055 | R054 | R053 | R052 | R051 |
| R069 | R068 | R067 | R066 | R065 | R064 | R063 | R062 | R061 |
| R079 | R078 | R077 | R076 | R075 | R074 | R073 | R072 | R071 |
| R089 | R088 | R087 | R086 | R085 | R084 | R083 | R082 | R081 |
| R099 | R098 | R097 | R096 | R095 | R094 | R093 | R092 | R091 |

| | 20R | | | | | | | 400 |
|---|---|---|---|---|---|---|---|---|

| ↑ R018 | ↑ R017 | ↑ R016 | ↑ R015 | ↑ R014 | ↑ R013 | ↑ R012 | ↑ R011 |
|---|---|---|---|---|---|---|---|
| ↑ R028 | ↑ R027 | ↑ R026 | ↑ R025 | ↑ R024 | ↑ R023 | ↑ R022 | ↑ R021 |
| ↑ R038 | ↑ R037 | ↑ R036 | ↑ R035 | ↑ R034 | ↑ R033 | ↑ R032 | ↑ R031 |
| ↑ R048 | ↑ R047 | ↑ R046 | ↑ R045 | ↑ R044 | ↑ R043 | ↑ R042 | ↑ R041 |
| ↑ R058 | ↑ R057 | ↑ R056 | ↑ R055 | ↑ R054 | ↑ R053 | ↑ R052 | ↑ R051 |
| ↑ R068 | ↑ R067 | ↑ R066 | ↑ R065 | ↑ R064 | ↑ R063 | ↑ R062 | ↑ R061 |
| ↑ R078 | ↑ R077 | ↑ R076 | ↑ R075 | ↑ R074 | ↑ R073 | ↑ R072 | ↑ R071 |
| ↑ R088 | ↑ R087 | ↑ R086 | ↑ R085 | ↑ R084 | ↑ R083 | ↑ R082 | ↑ R081 |
| ↑ R098 | ↑ R097 | ↑ R096 | ↑ R095 | ↑ R094 | ↑ R093 | ↑ R092 | ↑ R091 |
| ↑ R108 | ↑ R107 | ↑ R106 | ↑ R105 | ↑ R104 | ↑ R103 | ↑ R102 | ↑ R101 |
| ↑ R118 | ↑ R117 | ↑ R116 | ↑ R115 | ↑ R114 | ↑ R113 | ↑ R112 | ↑ R111 |
| ↑ R128 | ↑ R127 | ↑ R126 | ↑ R125 | ↑ R124 | ↑ R123 | ↑ R122 | ↑ R121 |

LIGHT-EMITTING DEVICE AND DISPLAY DEVICE

CROSS REFERENCE TO RELATED APPLICATIONS

This application is a divisional of and claims the benefit under 35 U.S.C. §120 of U.S. patent application Ser. No. 13/268,245, titled "LIGHT-EMITTING DEVICE AND DISPLAY DEVICE," filed on Oct. 7, 2011, which claims priority to Japanese Patent Application JP 2010-232752, filed Oct. 15, 2010, each of which is hereby incorporated by reference in its entirety.

BACKGROUND

The present disclosure relates to a light-emitting device having one or a plurality of light-emitting elements and a display device having the same.

LED (light-emitting diode) displays using light-emitting diodes (LEDs) as display pixels have been drawing attention in recent years as lightweight and slim displays. LED displays feature freedom from viewing angle dependence, a characteristic that causes the contrast and hue to change depending on the viewing angle, and offers high response speed for changing the color. However, a 40-inch diagonal full HD (High Definition) full color display, for example, has 1920 by 1080 pixels, with subpixels of three different colors necessary for each pixel. In this case, therefore, about six million LEDs are mounted in the display. In an LED display, it is necessary to mount a huge number of LEDs as described above on a wiring board with high yield and connect them together. As a result, a method is necessary that can achieve high yield with a simple process.

In related art, enlargement and transfer which will be described later is performed rather than mounting by a mounter (refer to Japanese Patent Laid-Open No. 2002-182580). First, a support wafer with an adhesive layer on its front surface is prepared. Next, the surface of the support wafer on the side of the adhesive layer is brought into contact with the surface of a wafer on the LED side where a plurality of LEDs are formed in a matrix form. Then, the LEDs are peeled off from the wafer at predetermined spacings and transferred to the support wafer by laser liftoff. This provides sparsely pitched LEDs. Next, a circuit board (glass substrate) is prepared on which connection electrodes are formed at the same pitches as those of the sparsely arranged LEDs. The LEDs are transferred from the support wafer to the circuit board. A mounted board having LEDs mounted on a circuit board can be manufactured as described above.

SUMMARY

Incidentally, the following problem occurs if red, green and blue LEDs are used as the three primary colors of the LED display. First, in the red LED, when an AlGaInP crystal is grown on a GaAs substrate, for example, the crystal axis is tilted by an angle from 8 to 20 degrees to avoid the occurrence of a natural superlattice. As a result, the red LED has an off-angle. An off-angle leads to asymmetrical facets, thus tilting the radiation angle. Both wet and dry methods can be used to form the facets. In wet etching, crystal surfaces manifest themselves in a conspicuous manner, certainly resulting in asymmetrical facets. In dry etching, on the other hand, the facets become slightly asymmetrical because they are affected by the crystal surfaces although not as much as in wet etching. In the case of the red LED, therefore, both wet and dry methods lead to a tilted radiation angle, thus resulting in uneven color and luminance.

Further, in the case of the green and blue LEDs, when a crystal of an AlGaInN-based material is grown on a sapphire substrate, for example, the crystal axis is tilted by about 0.4 degrees. Such a growth of a crystal of an AlGaInN-based material by tilting the crystal axis leads to step bunching (stripes) on the wafer surface. Dicing the LEDs from a wafer having such a surface results in the LEDs having a striped surface. When the LED emits light by electroluminescence, this striped pattern causes a striped pattern to appear in the in-plane light intensity distribution. Therefore, uneven color and luminance occurs in the green and blue LEDs due to step bunching.

It should be noted that the above problem occurs not only in LED displays but also those devices having a huge number of LEDs arranged two-dimensionally.

The present disclosure has been made in light of the foregoing, and firstly it is desirable to provide a light-emitting device with uneven color and luminance improved, and secondly it is desirable to provide a display device having the same.

A light-emitting device according to an embodiment of the present disclosure includes a plurality of first light-emitting elements mounted in a matrix form on a common wiring board. A display device according to the present disclosure includes a display panel and drive circuit. The display panel has a plurality of first light-emitting elements mounted in a matrix form on a common wiring board. The drive circuit drives the plurality of first light-emitting elements based on a video signal. In the light-emitting device and display device according to the present disclosure, each of the first light-emitting elements has a single crystal semiconductor multilayer structure and is a semiconductor element in the form of a chip that emits light in a given band of wavelengths. Here, when attention is focused on the plurality of first light-emitting elements that belong in a given area of all the plurality of first light-emitting elements, the orientations of the common crystal axes of the first light-emitting elements adjacent to each other at least in one of the row and column directions differ. It should be noted that the term "orientation of the crystal axis" refers more exactly to the orientation of an arrow projected onto a plane when the crystal axis is represented by the arrow. Also, the term "mounted in a matrix form" refers to the concept that includes not only mounting in a matrix (grid) form but also mounting in a honeycomb form.

In the light-emitting device and display device according to an embodiment of the present disclosure, the orientations of the crystal axes of the first light-emitting elements mounted in a matrix form on a common wiring board are not all the same, and the orientations of the common crystal axes of the first light-emitting elements adjacent to each other at least in one of the row and column directions differ. As a result, if, for example, the light-emitting elements of one type are provided in the display device, and when the light-emitting elements of one type equivalent to the first light-emitting elements are red LEDs, the inclinations of the radiation angles of the red LEDs are not uniform in plane. Further, if, for example, the light-emitting elements of one type are provided in the display device, and when the light-emitting elements of one type equivalent to the first light-emitting elements are green or blue LEDs, the striped patterns formed on the front surfaces of the green or blue LEDs are not uniform in plane. Still further, if, for example, the light-emitting elements of a plurality of different types adapted to emit light of different colors are provided in the display device, and when the light-emitting elements of one type equivalent to the first light-emitting elements are red LEDs, the inclinations of the radiation angles of the red LEDs are not uniform in plane. Still further, if, for example, the light-emitting elements of a plurality of different types adapted to emit light of different colors are provided in the display device, and when the light-emitting elements of one type equivalent to the first light-emitting elements are green or blue LEDs, the striped patterns formed on the front surfaces of the green or blue LEDs are not uniform in plane.

In the light-emitting device and display device according to an embodiment of the present disclosure, a plurality of second light-emitting elements may be provided that are mounted in a matrix form on the wiring board together with the plurality of first light-emitting elements. Here, each of the second light-emitting elements is made of a single crystal and is a semiconductor element in the form of a chip that emits light in a band of wavelengths different from that for the first light-emitting elements. When attention is focused on the plurality of second light-emitting elements that belong in a given area of all the plurality of second light-emitting elements, the orientations of the common crystal axes of the second light-emitting elements adjacent to each other at least in one of the row and column directions are different. In this case, if, for example, the light-emitting elements of a plurality of different types adapted to emit light of different colors are provided in the display device, when the light-emitting elements equivalent to the first light-emitting elements are red LEDs, and when the light-emitting elements equivalent to the second light-emitting elements are green or blue LEDs, the inclinations of the radiation angles of the red LEDs are not uniform in plane, and the striped patterns formed on the front surfaces of the green or blue LEDs are not uniform in plane. Further, if, for example, the light-emitting elements of a plurality of different types adapted to emit light of different colors are provided in the display device, when the light-emitting elements equivalent to the first light-emitting elements are green LEDs, and when the light-emitting elements equivalent to the second light-emitting elements are blue LEDs, the striped patterns formed on the front surfaces of the green and blue LEDs are not uniform in plane.

Further, in the light-emitting device and display device according to an embodiment of the present disclosure, if each of the first and second light-emitting elements has a plurality of electrodes, it is preferred that the electrode layout should be the same for some or all of the first light-emitting elements and the plurality of second light-emitting elements that belong in a given area of all the plurality of first and second light-emitting elements. That is, in this case, the electrode layouts of the first and second light-emitting elements are uniform in plane on one hand. On the other hand, the orientations of the crystal axes of the first and second light-emitting elements are not uniform in plane.

In the light-emitting device and display device according to an embodiment of the present disclosure, the orientations of the crystal axes of the first light-emitting elements are not uniform in plane. This provides improved robustness against uneven color and luminance as compared to if the orientations of the crystal axes of the first light-emitting elements are uniform in plane.

Further, in the light-emitting device and display device according to an embodiment of the present disclosure, if the plurality of first and second light-emitting elements are mounted in a matrix form on the circuit board, when the orientations of the crystal axes of the first light-emitting elements are not uniform in plane, and when the orientations of the crystal axes of the second light-emitting elements are not uniform in plane, improved robustness against uneven color and luminance can be achieved as compared to if the orientations of the crystal axes of the first light-emitting elements are uniform in plane, and if the orientations of the crystal axes of the second light-emitting elements are uniform in plane.

BRIEF DESCRIPTION OF THE DRAWINGS

FIG. 18 is a conceptual diagram illustrating an example of in-plane distribution of crystal axes of a substrate to which light-emitting elements on the wafer shown in FIG. 17 are temporarily fastened;

FIG. 24 is a conceptual diagram illustrating another example of in-plane distribution of crystal axes of the wafer shown in FIG. 11;

FIG. 25 is a conceptual diagram illustrating an example of in-plane distribution of crystal axes of the substrate to which the light-emitting elements on the wafer shown in FIG. 24 are temporarily fastened;

FIG. 31 is a conceptual diagram illustrating another example of in-plane distribution of crystal axes of the substrate to which the light-emitting elements on the wafer shown in FIG. 17 are temporarily fastened;

FIG. 33 is a schematic diagram illustrating an example of elements selected for the transfer after the step shown in FIG. 32;

FIG. 38 is a conceptual diagram illustrating an example of in-plane distribution of crystal axes of the substrate to which light-emitting elements on the wafer shown in FIG. 37 are temporarily fastened;

FIG. 40 is a schematic diagram illustrating an example of elements selected for the transfer after the step shown in FIG. 39;

DETAILED DESCRIPTION OF THE PREFERRED EMBODIMENTS

Figure 1:
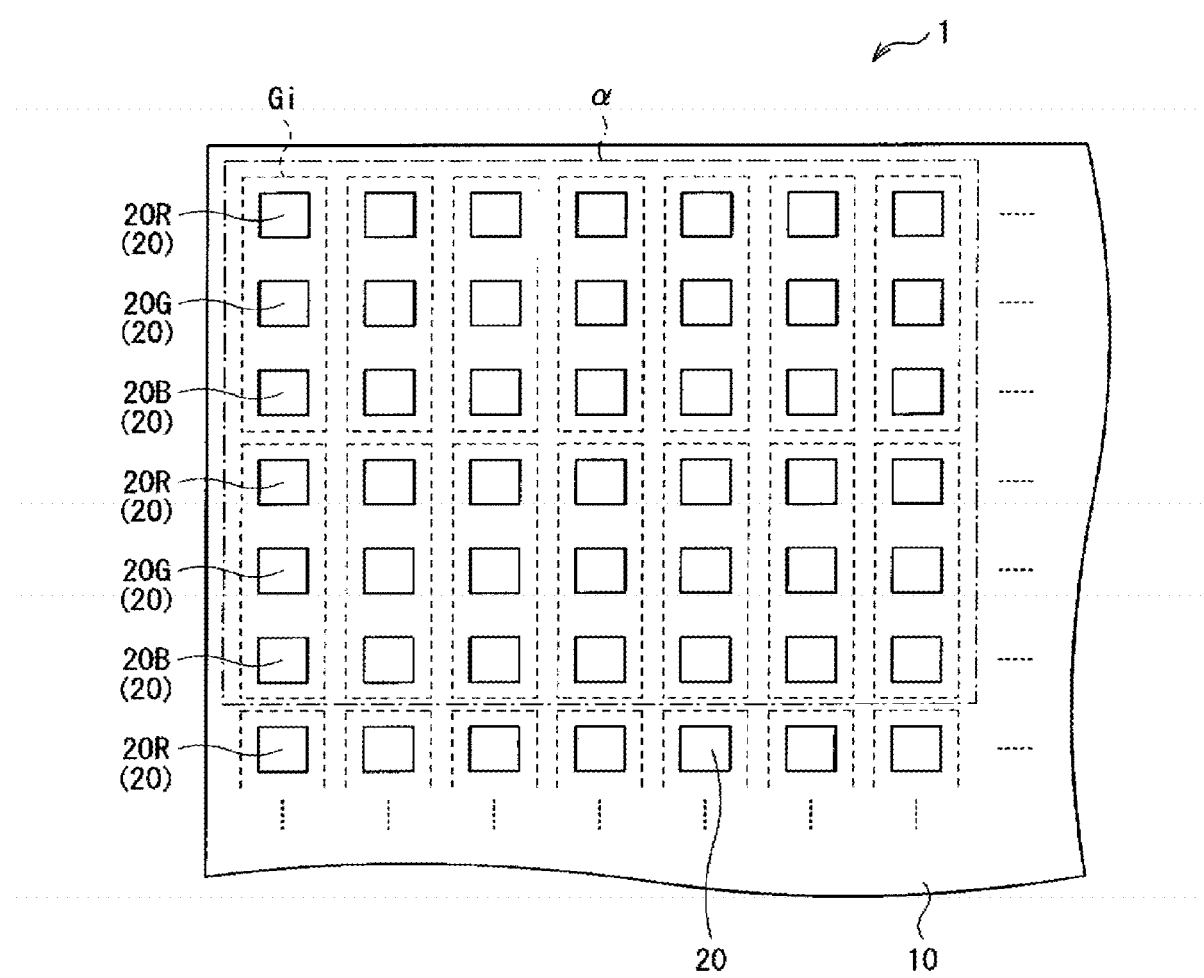
FIG. 1 is a plan view illustrating an example of configuration of a light-emitting device according to a first embodiment of the present disclosure.

A detailed description will be given below of the preferred embodiments for carrying out the present disclosure with reference to the accompanying drawings. It should be noted that the description will be given in the following order.

1. First embodiment (light-emitting device)

Example in which light-emitting elements of three different types (three different colors) are provided Example in which the orientations of the crystal axes of the light-emitting elements of different types (different colors) are not uniform in plane 2. Modification examples of first embodiment (light-emitting device)

Example in which the light-emitting elements of two different types (two different colors) are provided Example in which the light-emitting elements of one type (one color) are provided Example in which the orientations of the crystal axes of the light-emitting elements of one type (one color) of all the light-emitting elements of three different types (three different colors) are not uniform in plane Example in which the orientations of the crystal axes of the light-emitting elements of two types (two different colors) of all the light-emitting elements of three different types (three different colors) are not uniform in plane Example in which the light-emitting elements of only two different types (two different colors) are provided Example in which the light-emitting elements of only one type (one color) are provided 3. Second embodiment (display device)

Example in which the light-emitting device according to the first embodiment is used in the display panel 4. Modification examples of second embodiment (display device)

Same as the modification examples of the first embodiment

5. Third embodiment (lighting device)

Example in which the light-emitting device according to the first embodiment is used in the lighting panel 6. Modification examples of third embodiment (lighting device)
Same as the modification examples of the first embodiment

1. First Embodiment

[Configuration]

A description will be given first of a light-emitting device 1 according to a first embodiment. FIG. 1 illustrates an example of planar configuration of the light-emitting device 1. The light-emitting device 1 is suitably applicable to the display panel of a display device that is referred to as a so-called "LED display." As illustrated in FIG. 1, the light-emitting device 1 includes a wiring board 10 and a plurality of light-emitting elements 20 that are arranged in a matrix form on the wiring board 10. It should be noted that various wires in the wiring board 10 are not shown.

(Light-Emitting Elements 20)

Each of the light-emitting elements 20 is a solid-state light-emitting element (semiconductor element) in the form of a chip that emits light in a given band of wavelengths from its top surface. More specifically, the light-emitting elements 20 are LED chips. The term "LED chip" refers to a chip, diced from a crystal growth wafer, which is not a packaged chip whose light extraction surface is covered, for example, with spherically-molded resin. The LED chip is sized from 5 μm to 100 mm and referred to as a so-called "micro LED." The LED chip is, for example, roughly square in planar shape. The LED chip is in the form of a thin slice with an aspect ratio of, for example, from 0.1 to 1.

Every plurality of the light-emitting elements 20 adjacent to each other are grouped together. More specifically, as illustrated in FIG. 1, every three light-emitting elements 20 adjacent to each other in the column direction are grouped together into a group Gi (where i is a positive integer). The three light-emitting elements 20 included in each group Gi are a light-emitting element 20R adapted to emit light in the red band, a light-emitting element 20G adapted to emit light in the green band, and a light-emitting element 20B adapted to emit light in the blue band.

The light-emitting element 20R is arranged, for example, at one end of the column because of its relationship with the other light-emitting elements 20G and 20B in the group Gi. The light-emitting element 20B is arranged, for example, at the other end of the column because of its relationship with the other light-emitting elements 20R and 20G in the group Gi. The light-emitting element 20G is arranged, for example, between the light-emitting elements 20R and 20B. Therefore, the light-emitting elements 20R, 20G and 20B are arranged periodically in the column direction. When attention is focused only on the light-emitting elements 20R and 20G, the same elements 20R and 20G are arranged alternately in the column direction. Similarly, when attention is focused only on the light-emitting elements 20R and 20B, the same elements 20R and 20B are arranged alternately in the column direction. When attention is focused only on the light-emitting elements 20G and 20B, the same elements 20G and 20B are arranged alternately in the column direction. It should be noted that the positions of the light-emitting elements 20R, 20G and 20B are not limited to the above.

Figure 2A:
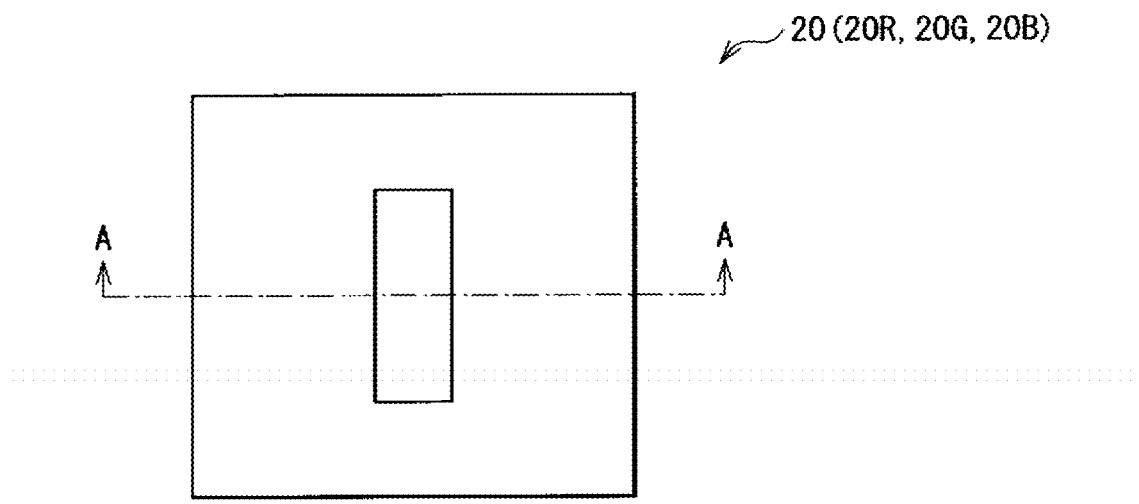
FIGS. 2A and 2B are a plan view and cross-sectional view illustrating an example of configuration of optical elements shown in FIG. 1.
Figure 2B:
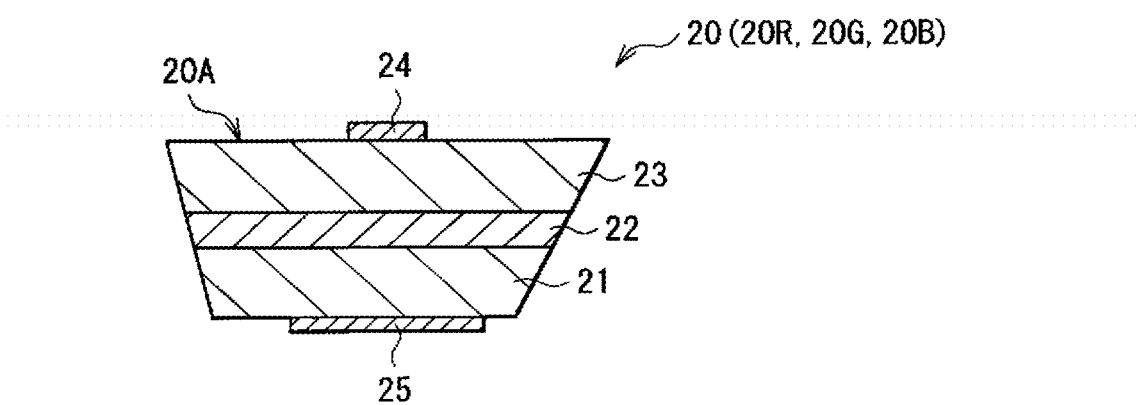

FIG. 2A illustrates an example of a top surface configuration of the light-emitting element 20. FIG. 2B illustrates an example of cross-sectional configuration of the light-emitting element 20 in the direction of an arrow A-A shown in FIG. 2A. Each of the light-emitting elements 20 has a semiconductor multilayer structure made up, for example, of a first conductivity type layer 21, active layer 22 and second conductivity type layer 23 that are stacked in this order as illustrated in FIG. 2B. The top surface of each of the light-emitting elements 20 (more specifically, the top surface of the second conductivity type layer 23) serves as a light emission surface 20A adapted to emit light produced by the active layer 22.

Figure 3A:
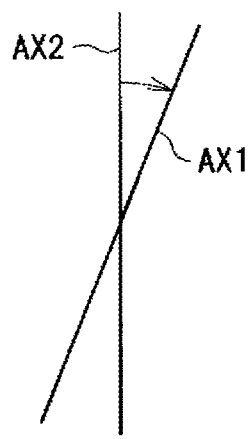
FIGS. 3A and 3B are conceptual diagrams for describing the orientation of the crystal axis of the optical element shown in FIG. 1.

In the light-emitting element 20R, the first conductivity type layer 21, active layer 22 and second conductivity type layer 23 are made of InP-based compound semiconductors such as GaInP, AlGaInP and AlInP. The light-emitting element 20R is manufactured by crystal growth using a GaAs substrate as a crystal growth substrate. That is, each of the first conductivity type layer 21, active layer 22 and second conductivity type layer 23 (excluding the contact layer (not shown) if the contact layer is included in the second conductivity type layer 23) of the light-emitting element 20R is made of a single crystal. In the light-emitting element 20R, an off-angle is provided on the crystal growth surface of the crystal growth substrate when an InP-based semiconductor is crystal-grown on the crystal growth substrate. As illustrated in FIG. 3A, for example, a crystal axis AX1 of the light-emitting element 20R is tilted, for example, by 8 to 20 degrees relative to a normal AX2 of the stacking surface of the same element 20R. Therefore, the facets are asymmetrical in the light-emitting element 20R. It should be noted that the crystal axis AX1 is, for example, a <001> axis and oriented in the direction inclined by the off-angle from the normal of the stacking surface. That is, the crystal axis AX1 has a vector component in the in-plane direction of the stacking surface of the light-emitting element 20R.

Figure 3B:
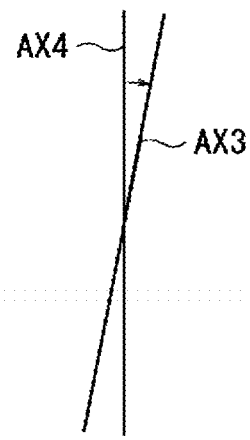

In the light-emitting elements 20G and 20B, on the other hand, the first conductivity type layer 21, active layer 22 and second conductivity type layer 23 are made of nitride semiconductor materials having a wurtzite crystal structure and made, for example, of InGaN-based semiconductor materials. The light-emitting elements 20G and 20B are manufactured by crystal growth using a sapphire or GaN substrate as a crystal growth substrate. That is, each of the first conductivity type layer 21, active layer 22 and second conductivity type layer 23 (excluding the contact layer (not shown) if the contact layer is included in the second conductivity type layer 23) of the light-emitting elements 20G and 20B is made of a single crystal. In the light-emitting elements 20G and 20B, an off-angle is provided on the crystal growth surface of the crystal growth substrate when a nitride semiconductor material is crystal-grown on the crystal growth substrate. As illustrated in FIG. 3B, for example, a crystal axis AX3 of each of the light-emitting elements 20G and 20B is tilted, for example, by 0.4 degrees relative to a normal AX4 of the stacking surface of the light-emitting element 20G or 20B. Therefore, the facets are slightly asymmetrical in the light-emitting elements 20G and 20B. It should be noted that the crystal axis AX3 is, for example, a C axis and oriented in the direction inclined by the off-angle from the normal of the stacking surface. That is, the crystal axis AX3 has a vector component in the in-plane direction of the stacking surface of the light-emitting elements 20G and 20B.

Each of the light-emitting elements 20 has a pair of electrodes 24 and 25 adapted to allow for injection of a current into the same element 20. The electrode 24 is electrically connected to the second conductivity type layer 23, and the electrode 25 is electrically connected to the first conductivity type layer 21. The electrode 24 is formed, for example, in contact with the top surface of the light-emitting element 20 (more specifically, the top surface of the second conductivity type layer 23), and the electrode 25 is formed, for example, in contact with the bottom surface of the light-emitting element 20 (more specifically, the bottom surface of the first conductivity type layer 21).

It should be noted that the positions of the electrodes 24 and 25 are not limited to the above. For example, both of the electrodes 24 and 25 may be provided on the top or bottom surface of the light-emitting element 20. It should be noted, however, that various descriptions will be given below assuming that the electrodes 24 and 25 are located at the positions shown in FIGS. 2A and 2B.

The electrodes 24 and 25 are, for example, 90- or 180-degree rotationally symmetrical when the light-emitting element 20 is rotated in plane about the in-plane center of the same element 20 as the central axis. If the electrodes 24 and 25 are 90-degree rotationally symmetrical, the electrodes 24 and 25 are, for example, square in shape. On the other hand, if the electrodes 24 and 25 are 180-degree rotationally symmetrical, the electrodes 24 and 25 are, for example, rectangular in shape. It should be noted that the electrode 24 may be 90-degree rotationally symmetrical, and that the electrode 25 may be 180-degree rotationally symmetrical. Alternatively, the electrode 24 may be 180-degree rotationally symmetrical, and the electrode 25 may be 90-degree rotationally symmetrical.

A description will be given next of the orientations of the crystal axes of the light-emitting elements 20R, 20G and 20B. FIGS. 4 to 9 illustrate examples of in-plane layout of the crystal axes of the light-emitting elements 20R, 20G and 20B. The arrow in each of the boxes marked "20R" in FIGS. 4 to 9 represents the orientation of the single crystal axis common to the light-emitting elements 20R and represents, for example, the orientation of the <001> axis. On the other hand, the arrow in each of the boxes marked "20G" in FIGS. 4 to 9 represents the orientation of the single crystal axis common to the light-emitting elements 20G and represents, for example, the orientation of the C axis. Similarly, the arrow in each of the boxes marked "20B" in FIGS. 4 to 9 represents the orientation of the single crystal axis common to the light-emitting elements 20B and represents, for example, the orientation of the C axis.

It should be noted that each of the arrows in FIGS. 4 to 9 indicates the orientation of that arrow when a given crystal axis is represented by that arrow and when that arrow is projected onto a plane. Mention is made of the orientation of the crystal axis in the present specification. At this time, the term "the orientation of the crystal axis" refers to the orientation of the arrow when a given crystal axis is represented by an arrow and when that arrow is projected onto a plane (e.g., panel surface).

In the present embodiment, when attention is focused on the plurality of light-emitting elements 20 of the same type (same emission color) that belong in a given area α, the orientations of the common crystal axes of the light-emitting elements 20 of the same type (same emission color) adjacent to each other at least in one of the row and column directions are different. Here, it is more preferred that the orientations of the common crystal axes of the light-emitting elements 20 of the same type (same emission color) adjacent to each other at least in one of the row and column directions in the given area α should differ, with the difference falling within the range of 90±5 degrees or within the range of 180±5 degrees. The above range of "±5 degrees" has been determined in consideration of a possible transfer error in the transfer process described later. It should be noted that although the arrows in the boxes marked "20R," "20G" and "20B" in the leftmost column in FIGS. 4 to 9 are oriented in the same direction, it is not necessary for these arrows to be oriented in the same direction.

It should be noted that the area α is defined to exclude the light-emitting elements 20 that have been mounted by a method (e.g., manual mounting) different from a normal mounting method (transfer), due, for example, to repair of the light-emitting elements 20 found to be defective in the light-emitting device 1 in the manufacturing process. Therefore, it is preferred that the above area α should include, of all the plurality of light-emitting elements 20 in the light-emitting device 1, all the light-emitting elements 20 other than those mounted by a method (e.g., manual mounting) different from a normal mounting method (transfer).

Figure 4:
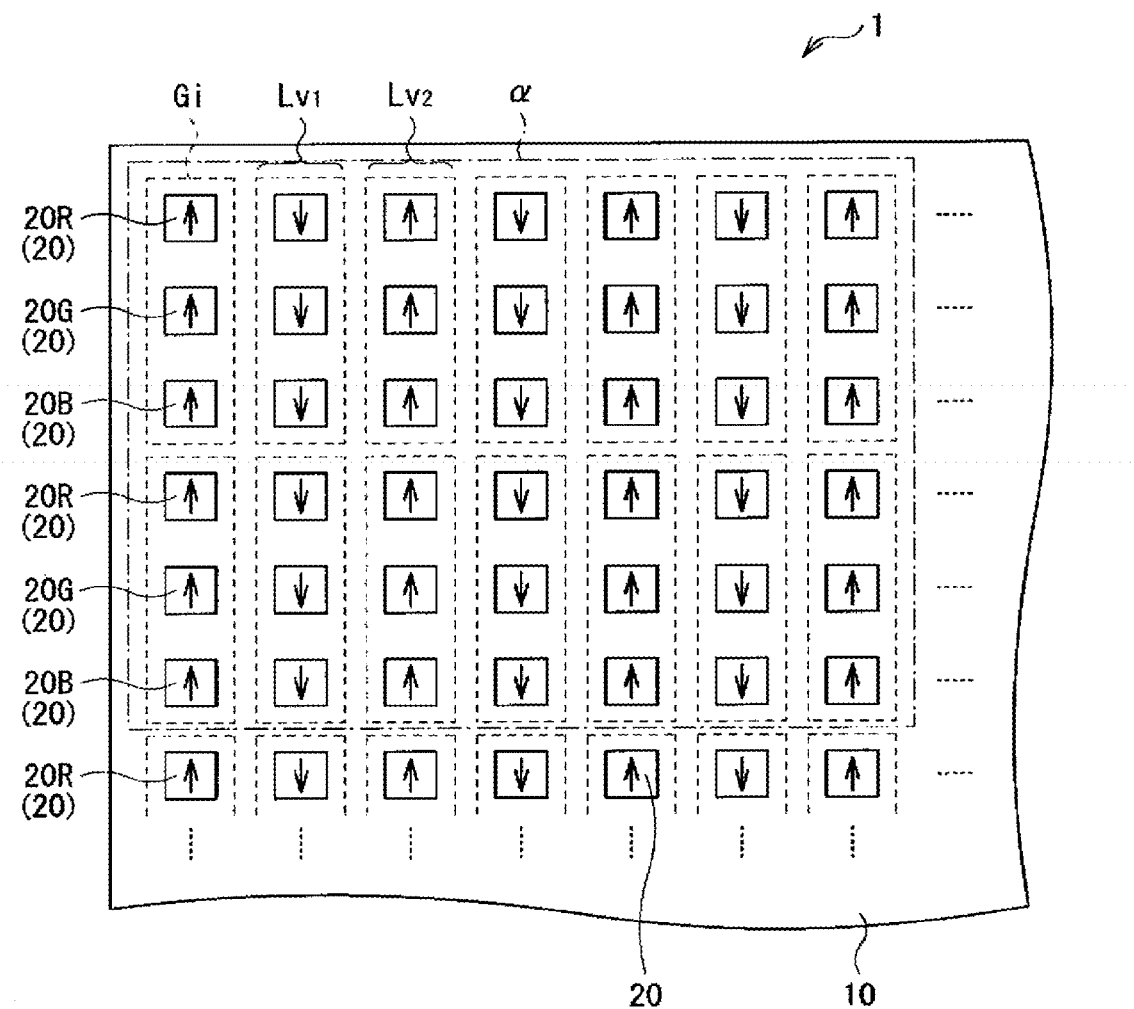
FIG. 4 is a conceptual diagram for describing an example of in-plane distribution of orientations of the crystal axes of the optical elements shown in FIG. 1.
Figure 5:
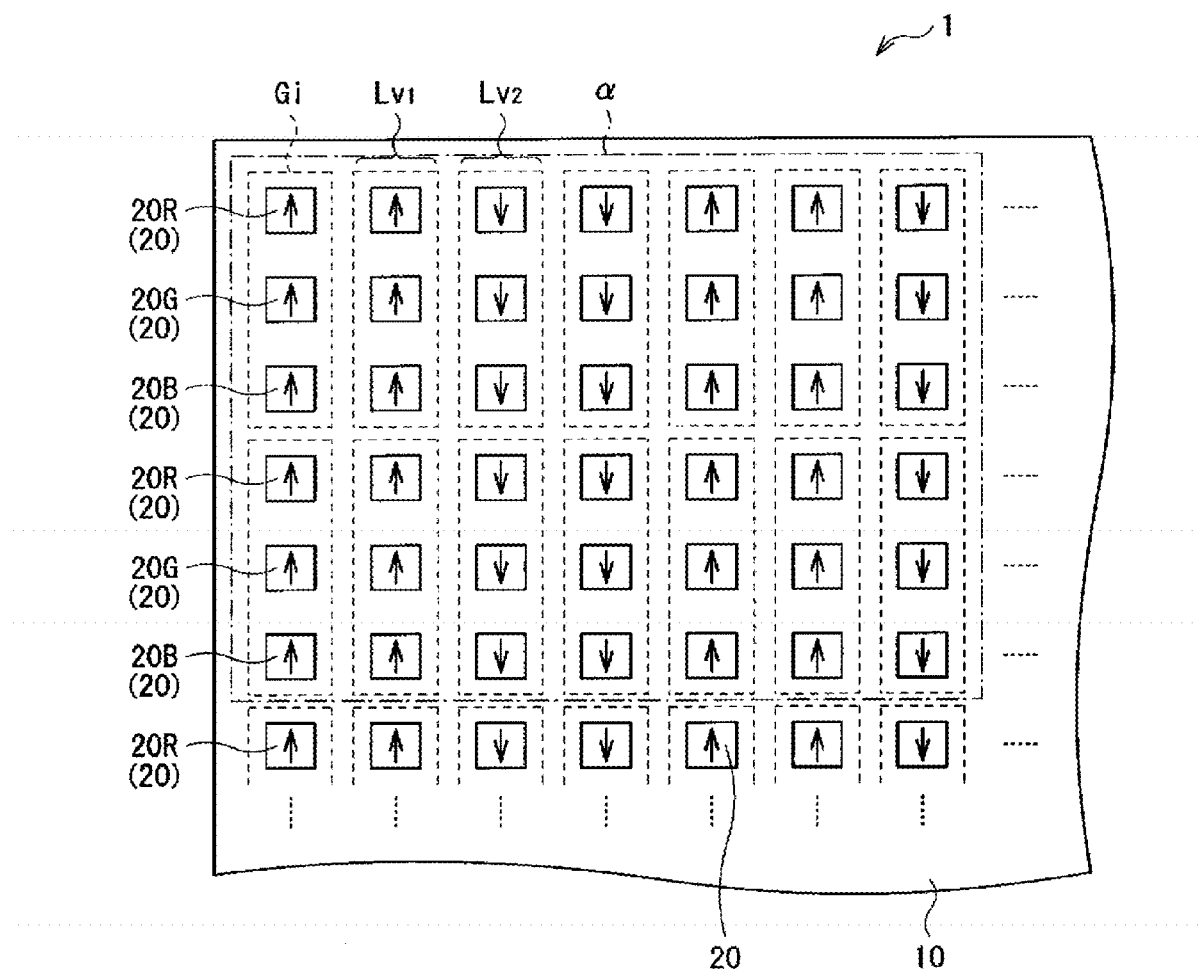
FIG. 5 is a conceptual diagram for describing a first modification example of in-plane distribution of orientations of the crystal axes of the optical elements shown in FIG. 1.

In the examples shown in FIGS. 4 and 5, for example, when attention is focused on the plurality of light-emitting elements 20 of the same type (same emission color) that belong in the given area α, the orientations of the common crystal axes of the light-emitting elements 20 of the same type (same emission color) adjacent to each other in the row direction differ by 180 degrees. Further, in the examples shown in FIGS. 4 and 5, when attention is focused on the plurality of light-emitting elements 20 of the same type (same emission color) that belong in the given area α, the orientations of the common crystal axes of the light-emitting elements 20 of the same type (same emission color) adjacent to each other in the column direction are the same. In the examples shown in FIGS. 4 and 5, for example, when attention is focused on two columns Lv1 and Lv2 adjacent to each other of all the rows and columns made up of the plurality of light-emitting elements 20 of the same type (same emission color) (attention is focused on the two columns adjacent to each other in FIGS. 4 and 5), the orientations of the common crystal axes in the columns Lv1 and Lv2 differ (more specifically, differ by 180 degrees). Further, in FIG. 4, the common crystal axes alternate their orientations every column. In FIG. 5, the common crystal axes alternate their orientations every two columns. It should be noted that although not shown, the common crystal axes may alternate their orientations every three or more columns.

Figure 6:
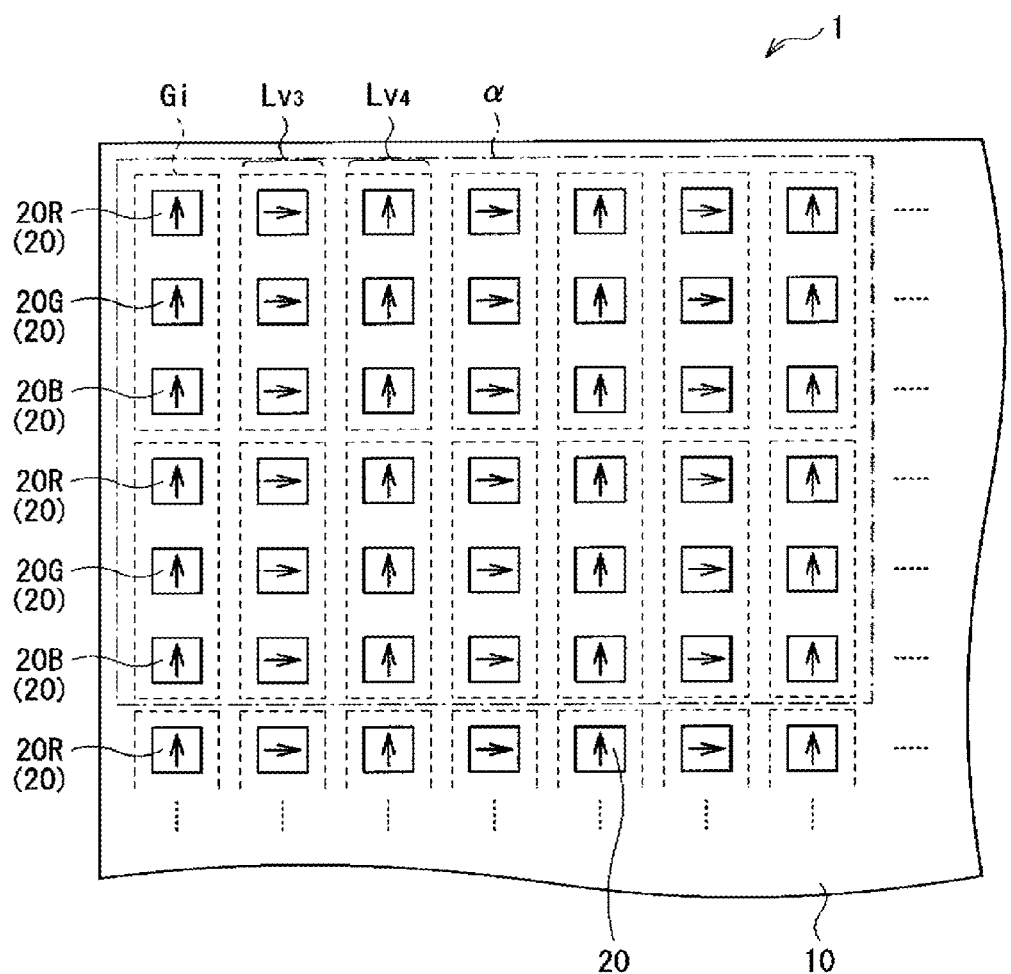
FIG. 6 is a conceptual diagram for describing a second modification example of in-plane distribution of orientations of the crystal axes of the optical elements shown in FIG. 1.
Figure 7:
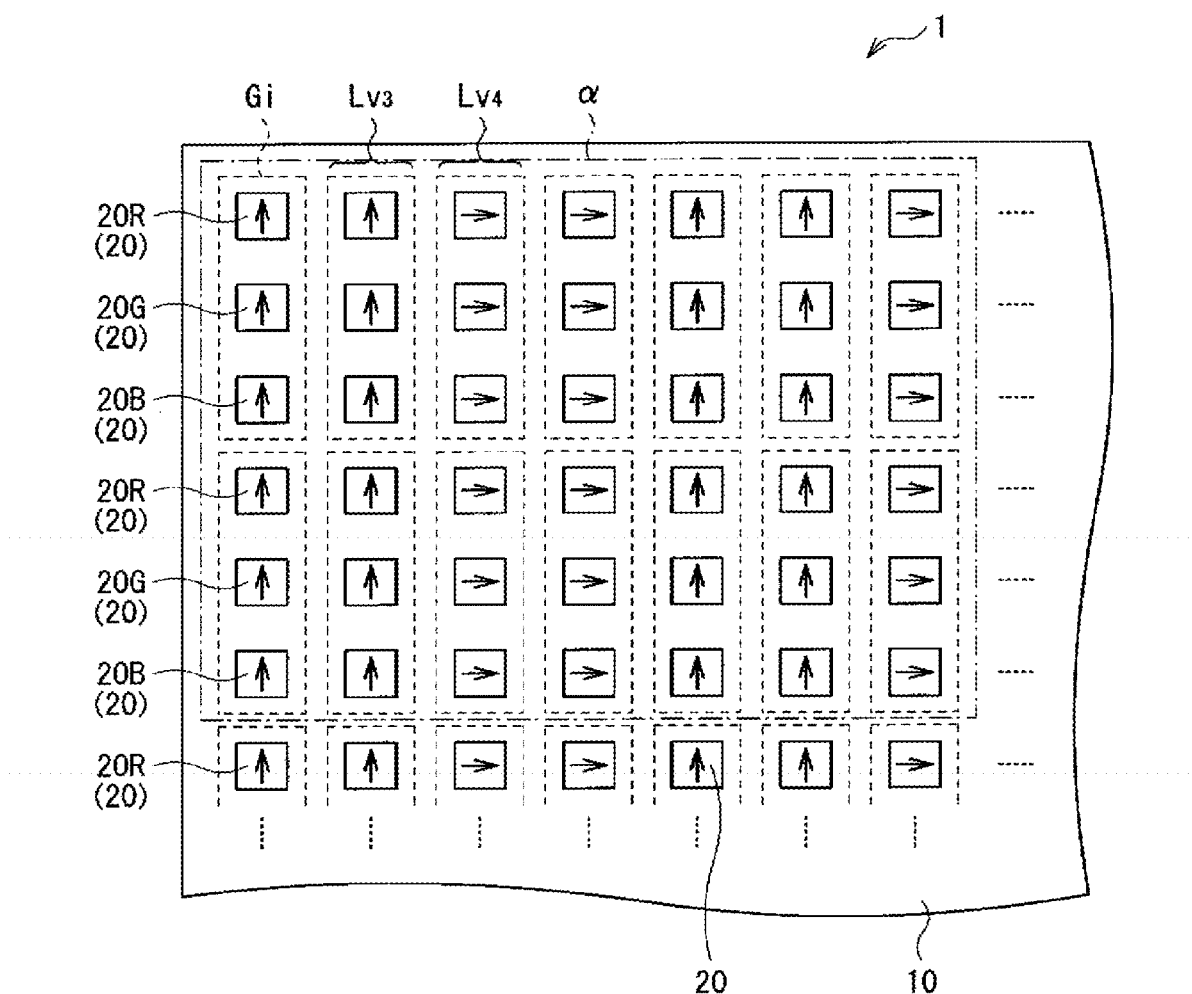
FIG. 7 is a conceptual diagram for describing a third modification example of in-plane distribution of orientations of the crystal axes of the optical elements shown in FIG. 1.

Further, in the examples shown in FIGS. 6 and 7, for example, when attention is focused on the plurality of light-emitting elements 20 of the same type (same emission color) that belong in the given area α, the orientations of the common crystal axes of the light-emitting elements 20 of the same type (same emission color) adjacent to each other in the row direction differ by 90 degrees. Still further, in the examples shown in FIGS. 6 and 7, when attention is focused on the plurality of light-emitting elements 20 of the same type (same emission color) that belong in the given area α, the orientations of the common crystal axes of the light-emitting elements 20 of the same type (same emission color) adjacent to each other in the column direction are the same. In the examples shown in FIGS. 6 and 7, for example, when attention is focused on two columns Lv3 and Lv4 adjacent to each other of all the rows and columns made up of the plurality of light-emitting elements 20 of the same type (same emission color) (attention is focused on the two columns adjacent to each other in FIGS. 6 and 7), the orientations of the common crystal axes in the columns Lv3 and Lv4 differ (more specifically, differ by 90 degrees). Further, in FIG. 6, the common crystal axes alternate their orientations every column. In FIG. 7, the common crystal axes alternate their orientations every two columns. It should be noted that although not shown, the common crystal axes may alternate their orientations every three or more columns.

Figure 8:
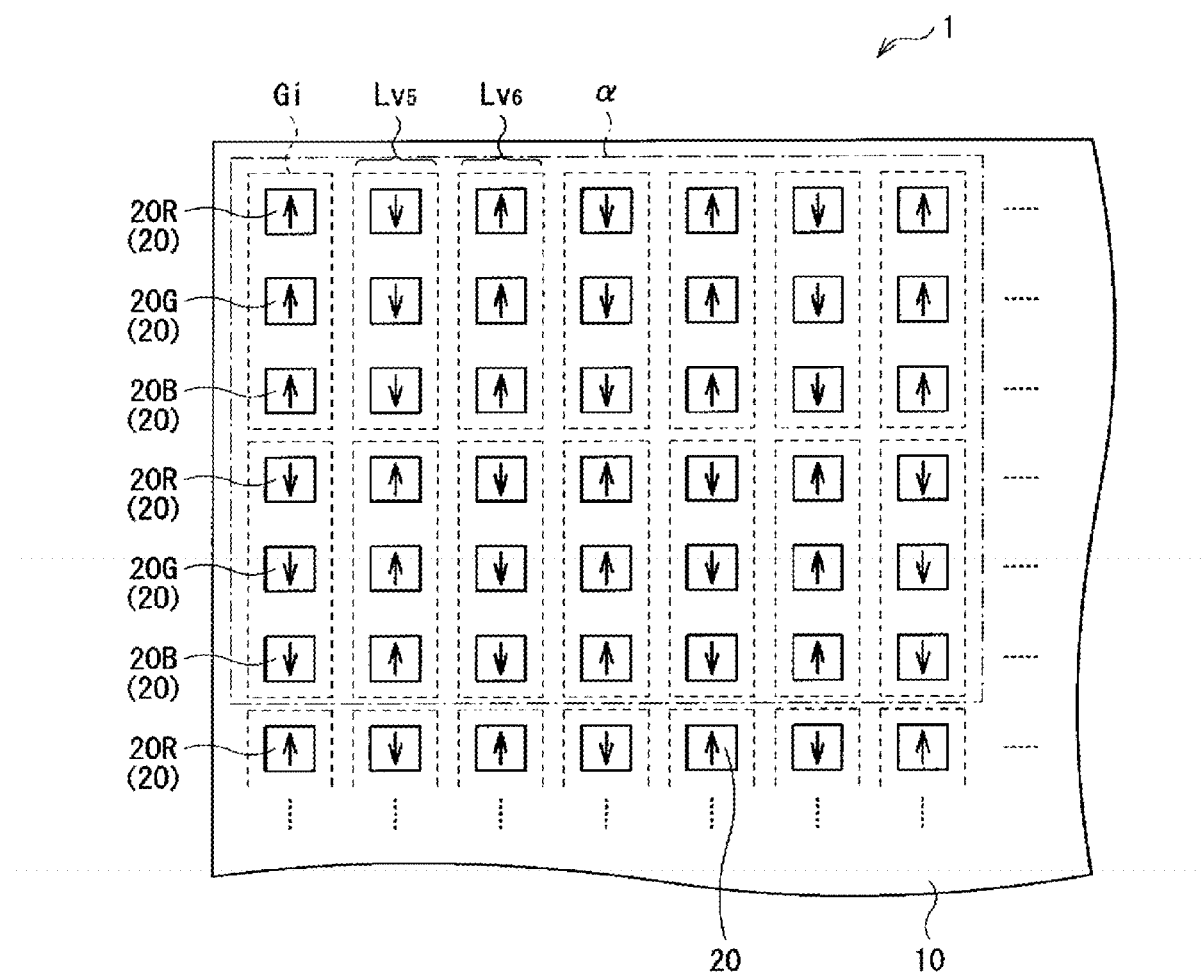
FIG. 8 is a conceptual diagram for describing a fourth modification example of in-plane distribution of orientations of the crystal axes of the optical elements shown in FIG. 1.

Further, in the example shown in FIG. 8, for example, when attention is focused on the plurality of light-emitting elements 20 of the same type (same emission color) that belong in the given area α, the orientations of the common crystal axes of the light-emitting elements 20 of the same type (same emission color) adjacent to each other in the row direction differ by 180 degrees. Still further, in the example shown in FIG. 8, when attention is focused on the plurality of light-emitting elements 20 of the same type (same emission color) that belong in the given area α, the orientations of the common crystal axes of the light-emitting elements 20 of the same type (same emission color) adjacent to each other in the column direction also differ by 180 degrees. In the example shown in FIG. 8, for example, when attention is focused on two columns Lv5 and Lv6 adjacent to each other of all the rows and columns made up of the plurality of light-emitting elements 20 of the same type (same emission color), the orientations of the common crystal axes adjacent to each other differ (more specifically, differ by 180 degrees) in the in-plane layout of the common crystal axes of all the light-emitting elements 20 of the same type (same emission color) included in the columns Lv5 and Lv6. Further, in FIG. 8, the light-emitting elements 20 whose common crystal axes are oriented in the same direction are staggered every two adjacent columns.

Figure 9:
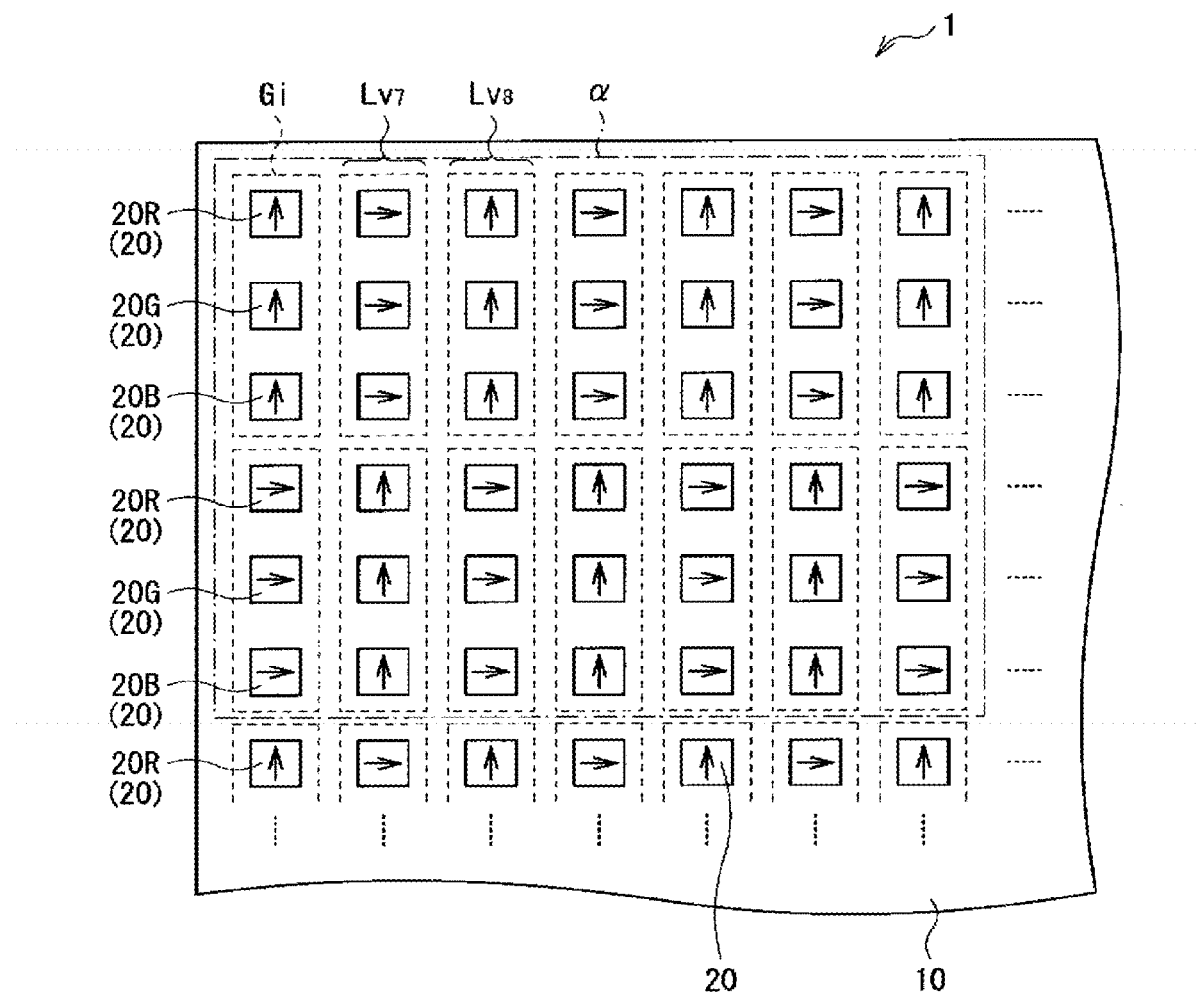
FIG. 9 is a conceptual diagram for describing a fifth modification example of in-plane distribution of orientations of the crystal axes of the optical elements shown in FIG. 1.

Further, in the example shown in FIG. 9, for example, when attention is focused on the plurality of light-emitting elements 20 of the same type (same emission color) that belong in the given area α, the orientations of the common crystal axes of the light-emitting elements 20 of the same type (same emission color) adjacent to each other in the row direction differ by 90 degrees. Still further, in the example shown in FIG. 9, when attention is focused on the plurality of light-emitting elements 20 of the same type (same emission color) that belong in the given area α, the orientations of the common crystal axes of the light-emitting elements 20 of the same type (same emission color) adjacent to each other in the column direction also differ by 90 degrees. In the example shown in FIG. 9, for example, when attention is focused on two columns Lv7 and Lv8 adjacent to each other of all the rows and columns made up of the plurality of light-emitting elements 20 of the same type (same emission color), the orientations of the common crystal axes adjacent to each other differ (more specifically, differ by 90 degrees) in the in-plane layout of the common crystal axes of all the light-emitting elements 20 of the same type (same emission color) included in the columns Lv7 and Lv8. Further, in FIG. 9, the light-emitting elements 20 whose common crystal axes are oriented in the same direction are staggered every two adjacent columns.

(Wiring Board 10)

Figure 10A:
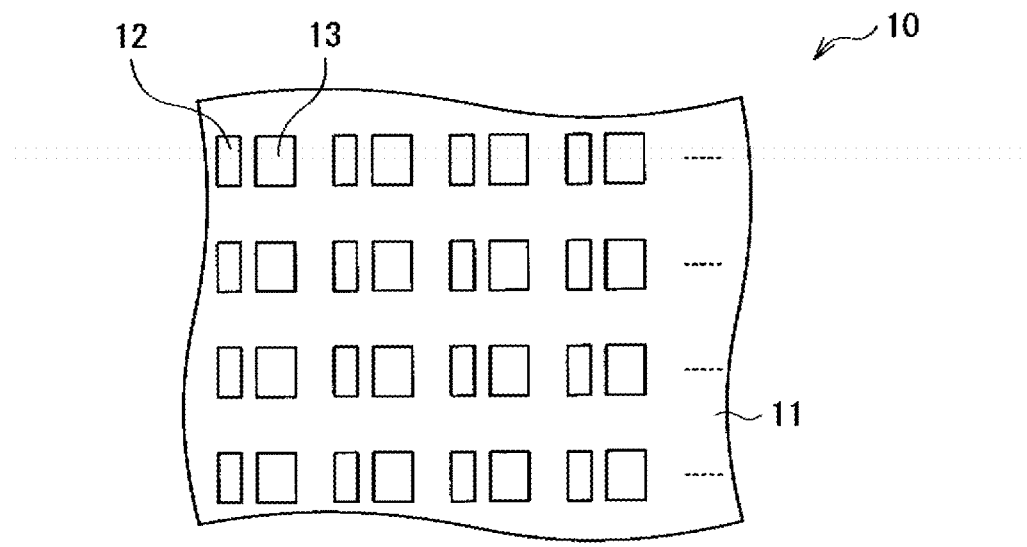
FIGS. 10A and 10B are plan views illustrating an example of configuration of a wiring board shown in FIG. 1.

The wiring board 10 has pairs of pad electrodes 12 and 13 arranged in a matrix (grid) form on a support substrate 11, for example, as illustrated in FIG. 10A. It should be noted that the pairs of pad electrodes 12 and 13 may be arranged in a honeycomb form. Each of the light-emitting elements 20 is provided on one of the pad electrodes 13. Therefore, the plurality of light-emitting elements 20 are arranged in the same manner as the pairs of pad electrodes 12 and 13. More specifically, the light-emitting elements 20 are arranged in a matrix (grid) or honeycomb form. The electrode 25 of each of the light-emitting elements 20 is electrically connected to one of the pad electrodes 13, and the electrode 24 of each of the light-emitting elements 20 is electrically connected to one of the pad electrodes 12. The connection between the electrode 25 and pad electrode 13 is achieved, for example, by soldering. The connection between the electrode 24 and pad electrode 12 is achieved, for example, by wire buildup interconnection.

Figure 10B:
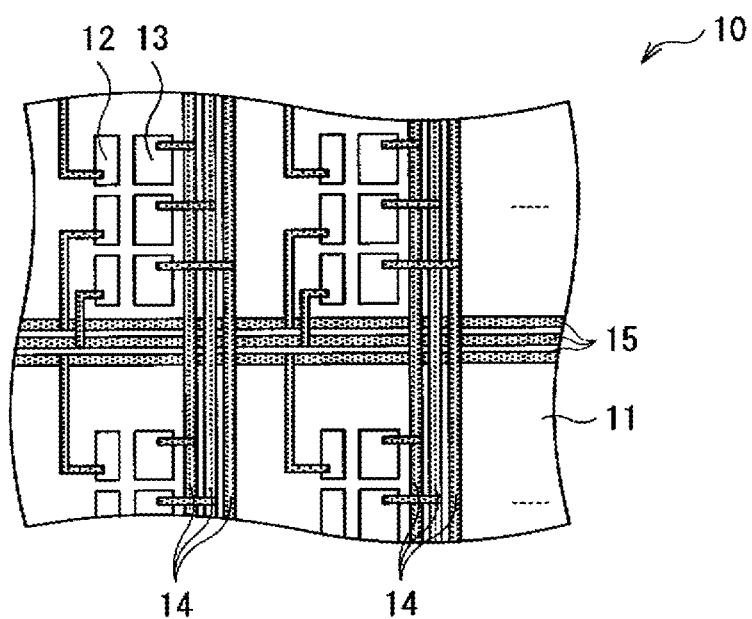

It should be noted that the wiring board 10 may further have wires arranged on the support substrate 11 as illustrated in FIG. 10B. The wiring board 10 includes a plurality of data wires 14 and a plurality of scan wires 15. The plurality of data wires 14 are formed to extend, for example, in the column direction and arranged parallel to each other at a predetermined pitch. On the other hand, the plurality of scan wires 15 are formed to extend, for example, in the row direction and arranged parallel to each other at a predetermined pitch. Here, every three pairs of the pad electrodes 12 and 13, for example, are grouped together. Each of the data wires 14 is electrically connected to one of the pad electrodes 13 included in each group. Each of the scan wires 15 is electrically connected to one of the pad electrodes 12 included in each group. The data wires 14 and scan wires 15 are made, for example, of a conductive material such as Cu (copper). On the other hand, the data wires 14 and scan wires 15 are laid out identically in relation to all the light-emitting elements 20R, 20G and 20B that belong in the area α. That is, the data wires 14 and scan wires 15 are laid out identically in relation to the light-emitting elements 20R, 20G and 20B irrespective of the orientations of the crystal axes of the light-emitting elements 20.

[Manufacturing Method]

A description will be given next of an example of a manufacturing method of the light-emitting device 1 according to the present embodiment.

Figure 11A:
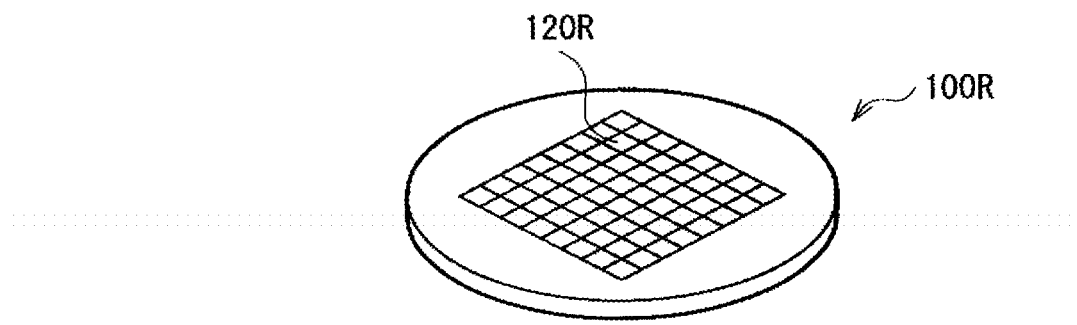
FIGS. 11A to 11C are perspective views illustrating an example of a wafer used to manufacture the light-emitting device shown in FIG. 1.
Figure 11B:
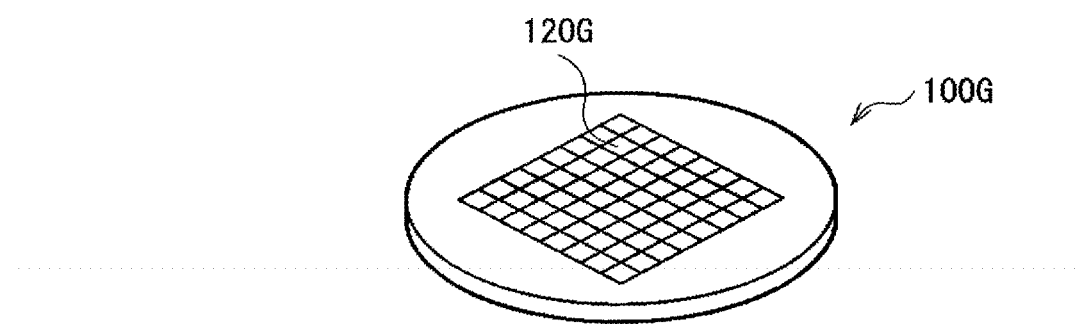
Figure 11C:
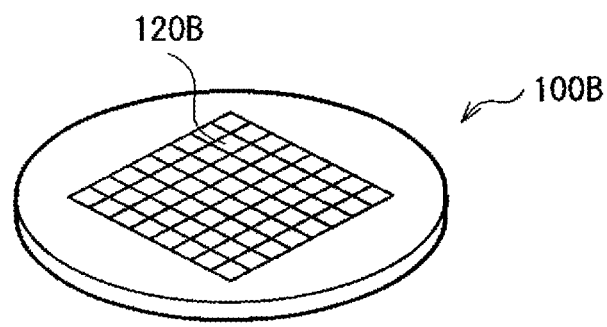

First, a wafer 100R is prepared that has a number of portions (light-emitting elements 120R) of the light-emitting elements 20R, each without the electrode 24, formed on a crystal growth substrate (FIG. 11A). Further, a wafer 100G is prepared that has a number of portions (light-emitting elements 120G) of the light-emitting elements 20G, each without the electrode 24, formed on a crystal growth substrate (FIG. 11B). Still further, a wafer 100B is prepared that has a number of portions (light-emitting elements 120B) of the light-emitting elements 20B, each without the electrode 24, formed on a crystal growth substrate (FIG. 11C). It should be noted that each of the light-emitting elements 120R, 120G and 120B has a multilayer structure made up of the second conductivity type layer 23, active layer 22, first conductivity type layer 21 and electrode 25 stacked in this order from the side of the crystal growth substrate, and that the cross-section thereof is trapezoidal in shape. That is, the second conductivity type layer 23, active layer 22, first conductivity type layer 21 are separated from each other for each of the light-emitting elements 120R, 120G and 120B at this stage.

Figure 12A:
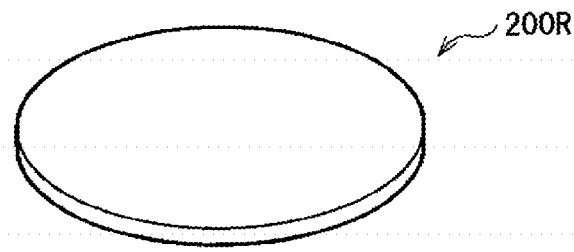
FIGS. 12A to 12C are perspective views illustrating an example of a temporary fastening substrate used to manufacture the light-emitting device shown in FIG. 1.
Figure 12B:
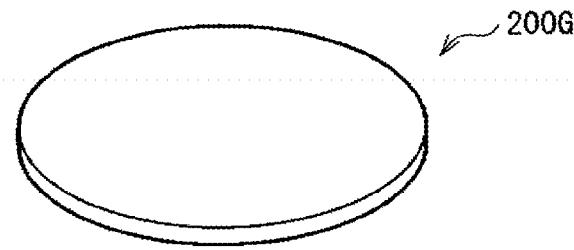
Figure 12C:
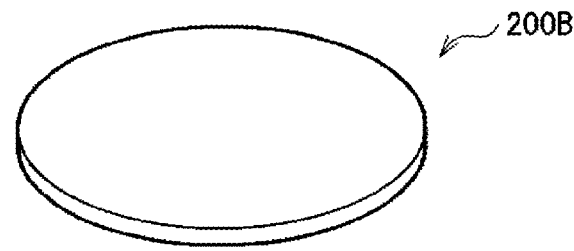

Further, a temporary fastening substrate 200R is prepared that is used to temporarily fasten the light-emitting elements 120R on the wafer 100R (FIG. 12A). Similarly, a temporary fastening substrate 200G is prepared that is used to temporarily fasten the light-emitting elements 120G on the wafer 100G, and a temporary fastening substrate 200B is prepared that is used to temporarily fasten the light-emitting elements 120B on the wafer 100B (FIGS. 12B and 12C). Each of the temporary fastening substrates 200R, 200G and 200B includes a transparent substrate (e.g., quartz or sapphire substrate) and an unhardened adhesive layer provided on the transparent substrate.

Next, the wafer 100R and temporary fastening substrate 200R are attached to each other in such a manner that the light-emitting elements 120R on the wafer 100R come into contact with the adhesive layer on the temporary fastening substrate 200R, after which the adhesive layer is hardened. Next, the substrate of the wafer 100R is removed, for example, by lapping, thus exposing the second conductivity type layer 23. Then, the electrode 24 is formed on the exposed second conductivity type layer 23. Thus, the plurality of light-emitting elements 20R are formed on the temporary fastening substrate 200R.

Further, the wafer 100G and temporary fastening substrate 200G are attached to each other in such a manner that the light-emitting elements 120G on the wafer 100G come into contact with the adhesive layer on the temporary fastening substrate 200G, after which the adhesive layer is hardened. Next, the substrate of the wafer 100G is removed, for example, by laser irradiation, thus exposing the second conductivity type layer 23. Then, the electrode 24 is formed on the exposed second conductivity type layer 23. Thus, the plurality of light-emitting elements 20G are formed on the temporary fastening substrate 200G.

Similarly, the wafer 100B and temporary fastening substrate 200B are attached to each other in such a manner that the light-emitting elements 120B on the wafer 100B come into contact with the adhesive layer on the temporary fastening substrate 200B, after which the adhesive layer is hardened. Next, the substrate of the wafer 100B is removed, for example, by laser irradiation, thus exposing the second conductivity type layer 23. Then, the electrode 24 is formed on the exposed second conductivity type layer 23. Thus, the plurality of light-emitting elements 20B are formed on the temporary fastening substrate 200B.

Figure 13:
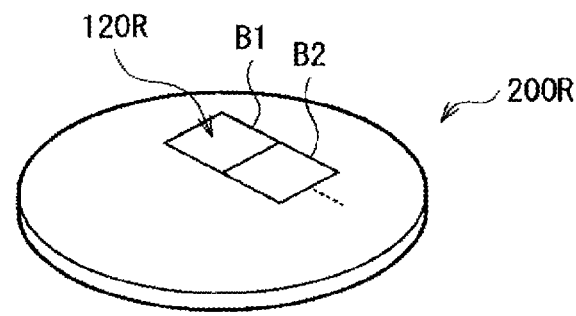
FIG. 13 is a perspective view describing a step following the steps shown in FIG. 12.
Figure 14:
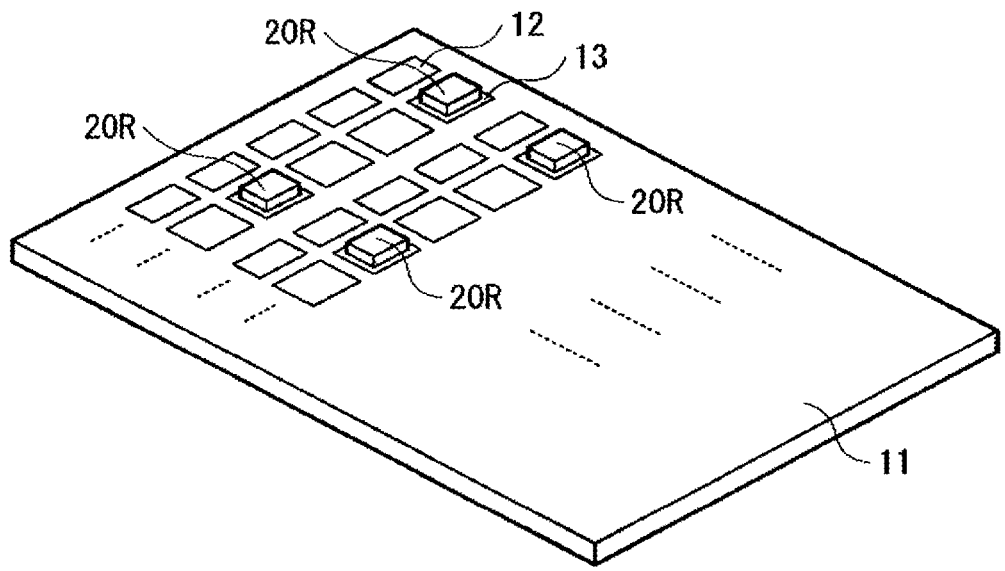
FIG. 14 is a perspective view describing a step following the step shown in FIG. 13.
Figure 15:
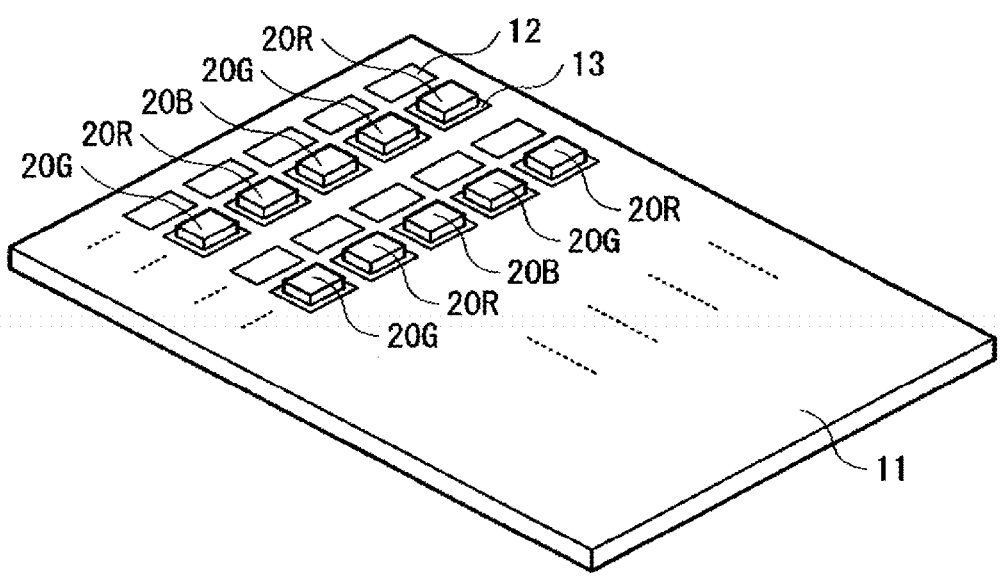
FIG. 15 is a perspective view describing a step following the step shown in FIG. 14.

Next, the wiring board 10 is prepared to which the light-emitting elements 20R, 20G and 20B will be mounted (FIG. 10A or 10B). Next, the light-emitting elements 20R, 20G and 20B are mounted to the pad electrodes 13 on the wiring board 10. More specifically, the temporary fastening substrate 200R and wiring board 10 are attached to each other, after which the light-emitting elements 20R are peeled from the temporary fastening substrate 200R by laser irradiation. At this time, laser is irradiated onto some of the light-emitting elements 20R on the temporary fastening substrate 200R rather than irradiating laser onto all the light-emitting elements 20R on the temporary fastening substrate 200R at the same time. To put it simply, transfer is performed in a thinned-out fashion. As illustrated in FIG. 13, for example, all the light-emitting elements 20R on the temporary fastening substrate 200R are divided into a plurality of blocks B1, B2, ... i and so on (where i is a positive integer) so that the light-emitting element 20R is peeled by laser irradiation for every Bi blocks. Thus, the light-emitting elements 20R are transferred to the wiring board 10 at large pitches. At this time, the light-emitting elements 20R are each positioned right on one of the predetermined pad electrodes 13 (FIG. 14). Further, the light-emitting elements 20G on the temporary fastening substrate 200G and the light-emitting elements 20B on the temporary fastening substrate 200B are transferred to the surface of the wiring board 10 in the same manner (FIG. 15). It should be noted that the wiring board 10 shown in FIGS. 14 and 15 includes not only that shown in FIG. 10A but also that shown in FIG. 10B.

It should be noted that if the above mounting method is used, the top surface of each of the light-emitting elements 20R, 20G and 20B (surface on the side of the electrode 24) faces the wiring board 10. If it is desired that the top surface of each of the light-emitting elements 20R, 20G and 20B (surface on the side of the electrode 24) should face the side opposite to the wiring board 10, it is only necessary, for example, to transfer the light-emitting elements 20R, 20G and 20B to the temporary fastening substrates again before mounting the same elements 20R, 20G and 20B to the wiring board 10, flip the same elements 20R, 20G and 20B vertically and then mount the same elements 20R, 20G and 20B to the wiring board 10.

Figures 16, 17:
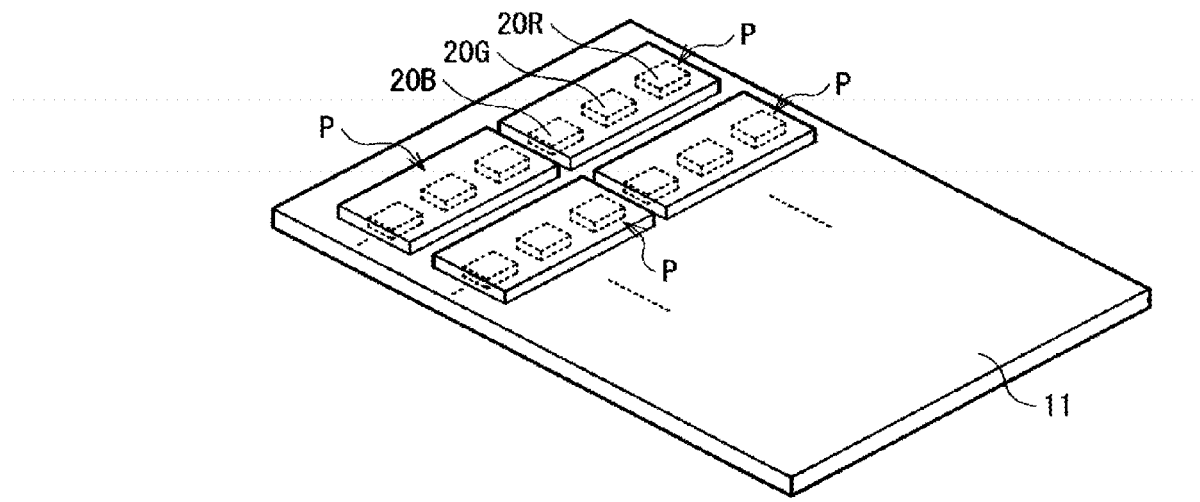
FIG. 16 is a perspective view describing a step following the step shown in FIG. 15.
FIG. 17 is a conceptual diagram illustrating an example of in-plane distribution of crystal axes of the wafer shown in FIG. 11.

Further, if the plurality of light-emitting elements 20R, 20G and 20B are formed on the wiring board 10 shown in FIG. 10A, minute packages P may be formed, for example, as illustrated in FIG. 16, by covering every three light-emitting elements adjacent to each other, one 20R, one 20G and one 20B, with a resin. At this time, the top surface of each of the light-emitting elements 20R, 20G and 20B (surface on the side of the electrode 24) may face the wiring board 10 or the side opposite to the wiring board 10.

If the minute packages P are formed as described above, the same packages P may be separated one from another and mounted to other wiring board. For example, a temporary fastening substrate is prepared first that is used to temporarily fasten all the minute packages P on a wiring board 11. Next, the temporary fastening substrate and the wiring board 10 having the plurality of minute packages P formed thereon are attached to each other, after which the minute packages P are peeled from the base material of the wiring board 10, for example, by laser irradiation. Next, the temporary fastening substrate having the minute packages P temporarily fastened thereto and the new wiring board are attached to each other, after which the minute packages P are peeled from the temporary fastening substrate and mounted to the wiring board. At this time, the new wiring board should preferably have the pairs of pad electrodes 12 and 13 arranged in a matrix form, the plurality of data wires 14 formed to extend in the column direction and the plurality of scan wires 15 formed to extend in the row direction, for example, as does the wiring board 10 shown in FIG. 10B. It should be noted that the pairs of pad electrodes 12 and 13 may be arranged in a honeycomb form.

It should be noted that if the orientations of the top and bottom surfaces of the minute packages P are opposite to those desired when the same packages P are mounted to the wiring board after having gone through the above process, it is only necessary, for example, to transfer the minute packages P to the temporary fastening substrate again before mounting the same packages P to the wiring board, flip the same packages P vertically and then mount the same packages P to the wiring board.

Incidentally, in the present embodiment, when the light-emitting elements 20R, 20G and 20B are mounted to the wiring board 10, the orientations of the crystal axes of at least the light-emitting elements 20R included in the given area α are not uniform in plane. Similarly, the orientations of the crystal axes of at least the light-emitting elements 20G included in the given area α are not uniform in plane, and the orientations of the crystal axes of at least the light-emitting elements 20B included in the given area α are not uniform in plane.

For example, a wafer 300 is prepared that has the plurality of light-emitting elements 120R formed thereon (FIG. 17). At this time, the orientations of the crystal axes (arrows in FIG. 17) of the light-emitting elements 120R are the same. It should be noted that, in FIG. 17, the coordinate of each of the light-emitting elements 120R is shown together with an arrow indicating the orientation of its crystal axis. Next, all the light-emitting elements 120R on the wafer 300 are transferred to a temporary fastening substrate 400, after which the light-emitting elements 20R are formed by the same method as described above (FIG. 18). The temporary fastening substrate 400 includes a transparent substrate (e.g., quartz or sapphire substrate) and an unhardened adhesive layer provided on the transparent substrate. It should be noted that the coordinates of the elements resulting from the transfer shown in FIG. 18 are flipped horizontally from those shown in FIG. 17.

Figure 19:
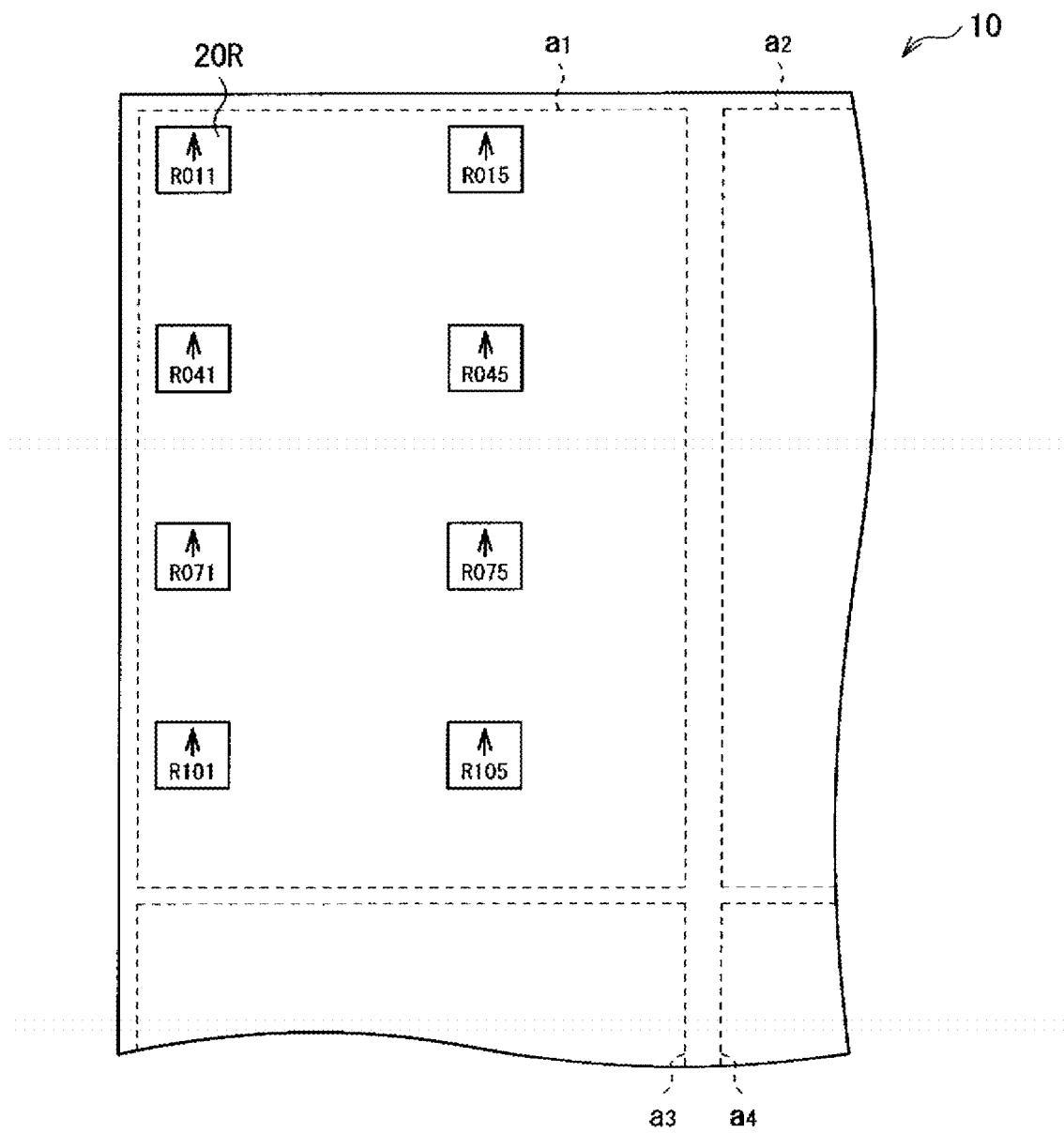
FIG. 19 is a schematic diagram illustrating an example of the manner in which the wiring board appears when some of the light-emitting elements are transferred from the temporary fastening substrate shown in FIG. 18 to the wiring board.
Figure 20:
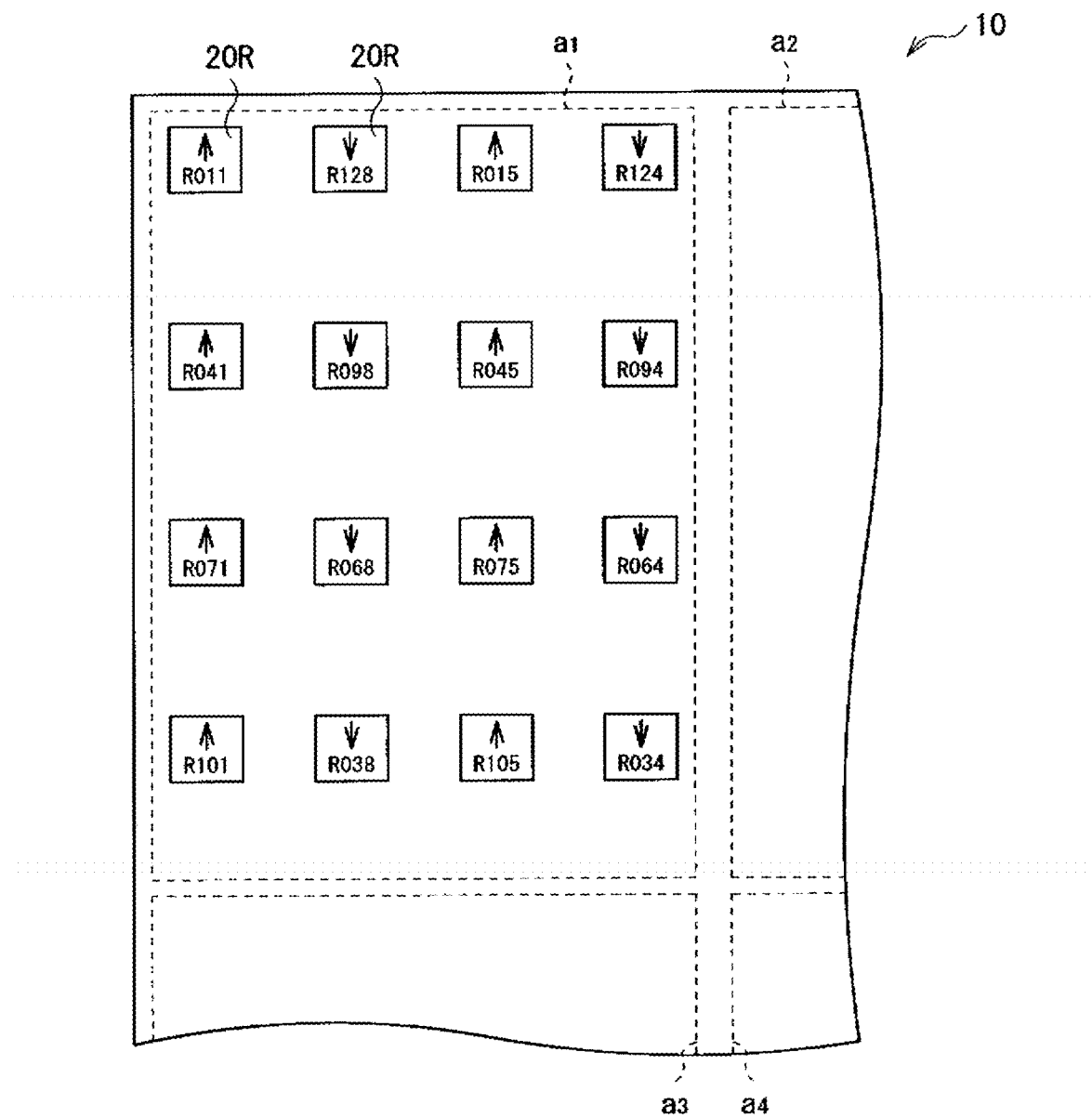
FIG. 20 is a schematic diagram illustrating an example of the manner in which the wiring board appears when the transfer continues after the step shown in FIG. 19.
Figure 21:
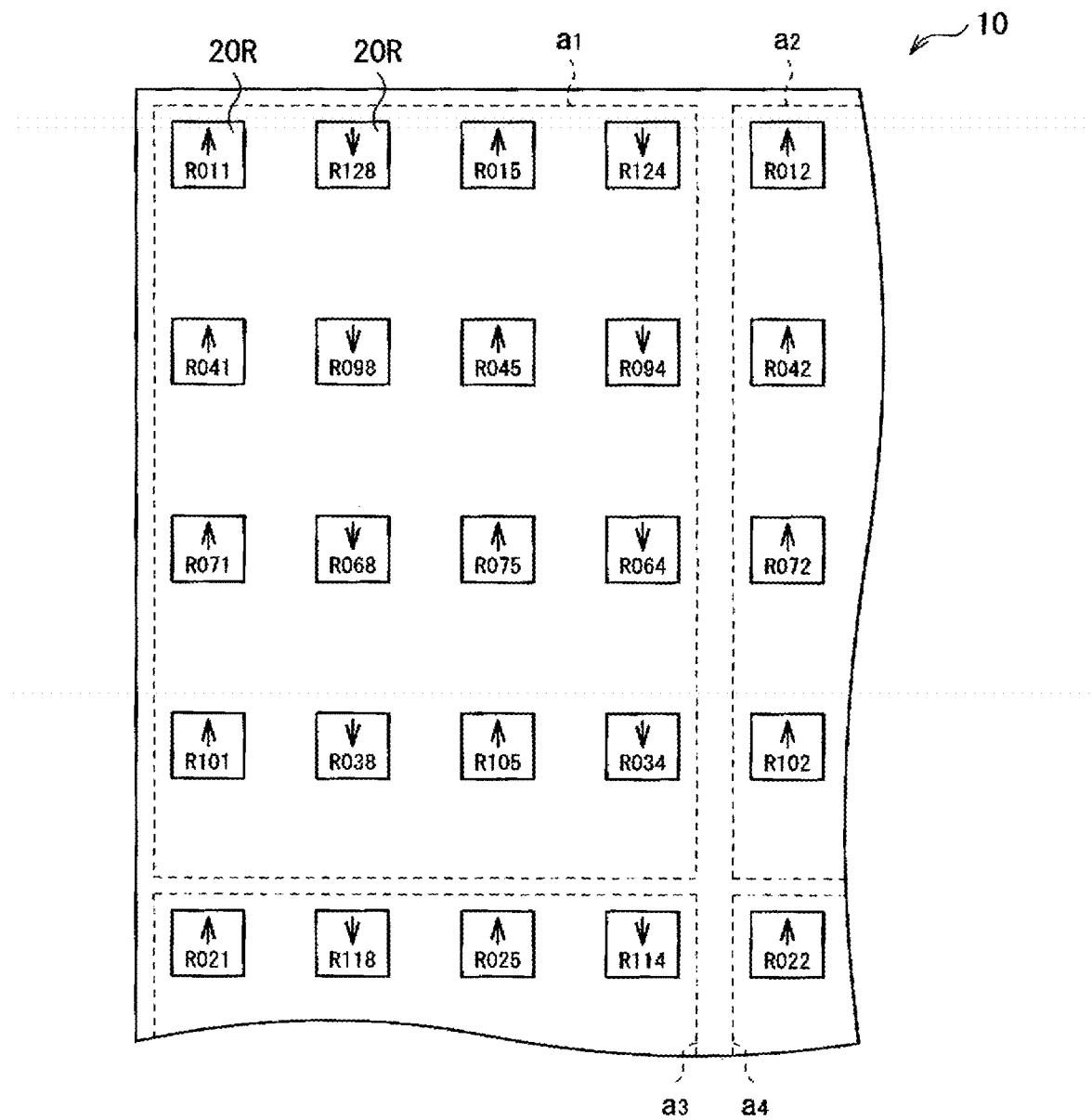
FIG. 21 is a schematic diagram illustrating an example of the manner in which the wiring board appears when the transfer continues after the step shown in FIG. 20.
Figure 22:
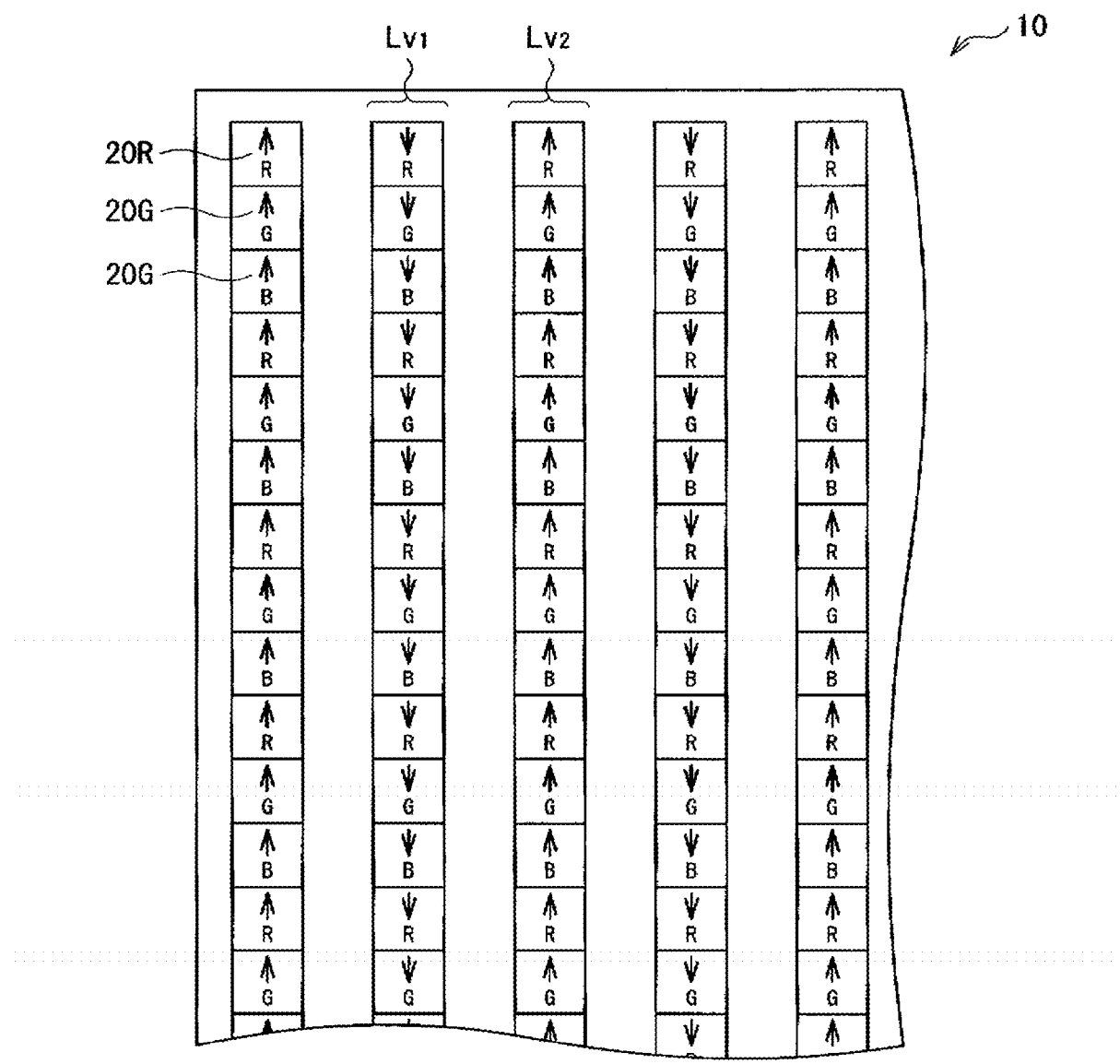
FIG. 22 is a schematic diagram illustrating an example of the manner in which the wiring board appears when the transfer continues after the step shown in FIG. 21.

Next, of all the plurality of light-emitting elements 20R on the temporary fastening substrate 400, the specific ones (those enclosed by circles in FIG. 18) are transferred to a given area a1 on the wiring board 10 (FIG. 19). For example, of the plurality of light-emitting elements 20R included in specific columns (e.g., first and fifth columns from right), one in every three light-emitting elements 20R is transferred to the wiring board 10. Next, the orientations of the crystal axes of the light-emitting elements 20R on the temporary fastening substrate 400 are rotated by 180 degrees by rotating the temporary fastening substrate 400 by 180 degrees, after which of all the plurality of light-emitting elements 20R on the temporary fastening substrate 400, only the specific ones are transferred to the given area a1 on the wiring board 10 (FIG. 20). For example, of the plurality of light-emitting elements 20R included in columns different from those from which the light-emitting elements 20R have been transferred (e.g., first and fifth columns from left in FIG. 18), one in every three light-emitting elements 20R is transferred between the same elements 20R on the wiring board 10. The light-emitting elements 20R are similarly transferred to other areas a2, a3, a4 and so on of the wiring board 10 (FIG. 21). Further, the light-emitting elements 20G and 20B are similarly transferred to the wiring board 10 (FIG. 22).

As a result, when attention is focused on the plurality of light-emitting elements 20 of the same type (same emission color), the orientations of the common crystal axes of the light-emitting elements 20 of the same type (same emission color) adjacent to each other in the row direction differ by 180 degrees. Further, when attention is focused on the plurality of light-emitting elements 20 of the same type (same emission color), the orientations of the common crystal axes of the light-emitting elements 20 of the same type (same emission color) adjacent to each other in the column direction are the same. When attention is focused on the two columns Lv1 and Lv2 adjacent to each other of all the rows and columns made up of the plurality of light-emitting elements 20 of the same type (same emission color) (attention is focused on the two columns adjacent to each other in FIG. 22), the orientations of the common crystal axes in the columns Lv1 and Lv2 differ (more specifically, differ by 180 degrees). Further, the common crystal axes alternate their orientations every column. The light-emitting device 1 according to the present embodiment is manufactured as described above.

Figure 23:
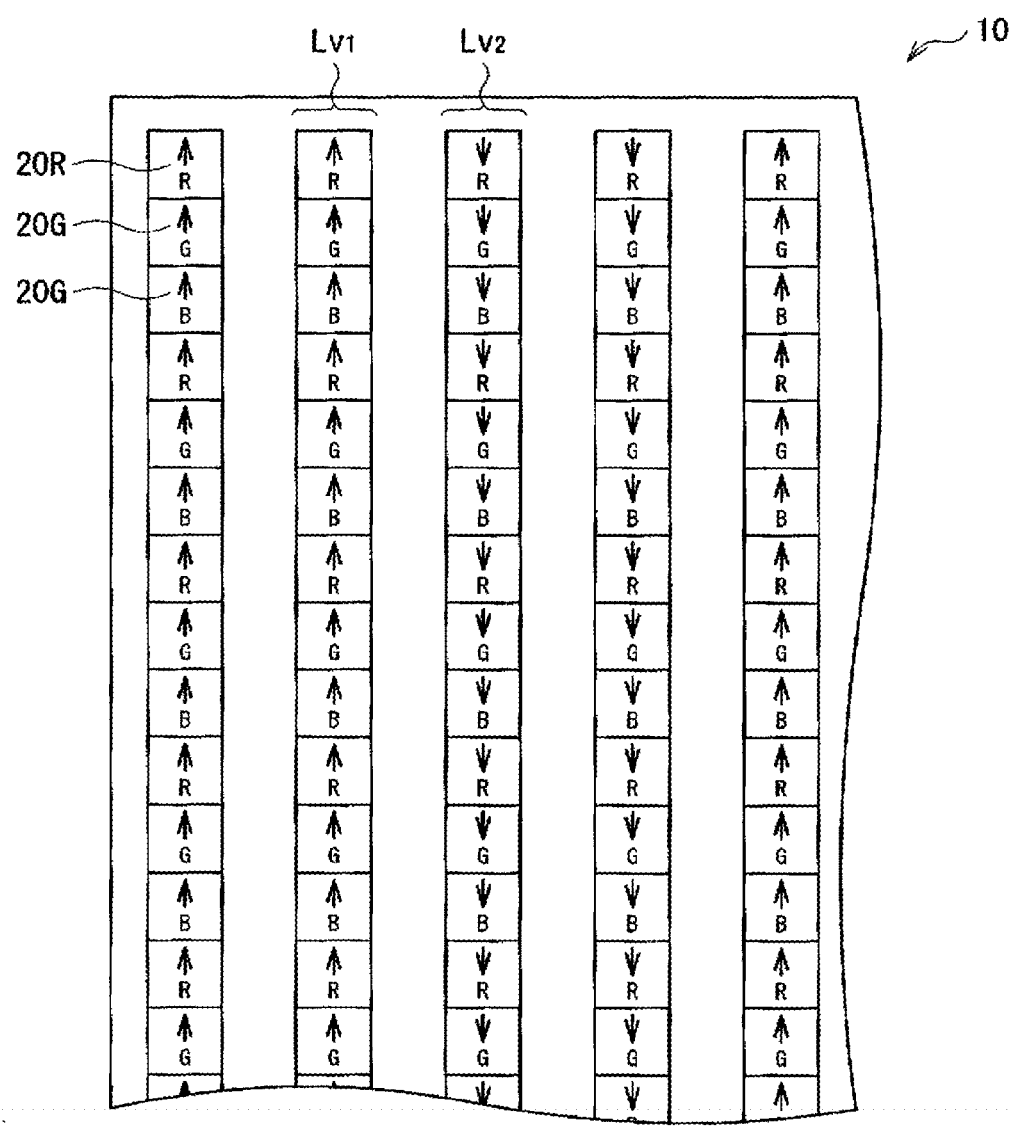
FIG. 23 is a schematic diagram illustrating another example of the manner in which the wiring board appears when the transfer continues after the step shown in FIG. 21.

It should be noted that the common crystal axes may alternate their orientations every two columns, for example, as illustrated in FIG. 23 by using the same method as described above. Further, although not shown, the common crystal axes may alternate their orientations every three or more columns.

On the other hand, if it is desired that the top surface of each of the light-emitting elements 20R (surface on the side of the electrode 24) as mounted to the wiring board 10 should face the side opposite to the wiring board 10, it is only necessary, for example, to transfer the light-emitting elements 20R to the temporary fastening substrate again before mounting the same elements 20R to the wiring board 10, flip the same elements 20R vertically and then mount the specific light-emitting elements 20R to the wiring board 10.

Further, the light-emitting device 1 according to the present embodiment can also be manufactured, for example, in any of the following manners.

(Manufacturing Method 1)

First, a wafer 500 is prepared that has the plurality of light-emitting elements 120R formed thereon (FIG. 24). At this time, the orientations of the crystal axes (arrows in FIG. 24) of the light-emitting elements 120R are the same. It should be noted that, in FIG. 24, the coordinate of each of the light-emitting elements 120R is shown together with an arrow indicating the orientation of its crystal axis. Next, all the light-emitting elements 120R on the wafer 500 are transferred to a temporary fastening substrate 600, after which the light-emitting elements 20R are formed by the same method as described above (FIG. 25). The temporary fastening substrate 600 includes a transparent substrate (e.g., quartz or sapphire substrate) and an unhardened adhesive layer provided on the transparent substrate. It should be noted that the coordinates of the elements resulting from the transfer shown in FIG. 25 are flipped horizontally from those shown in FIG. 24.

Figure 26:
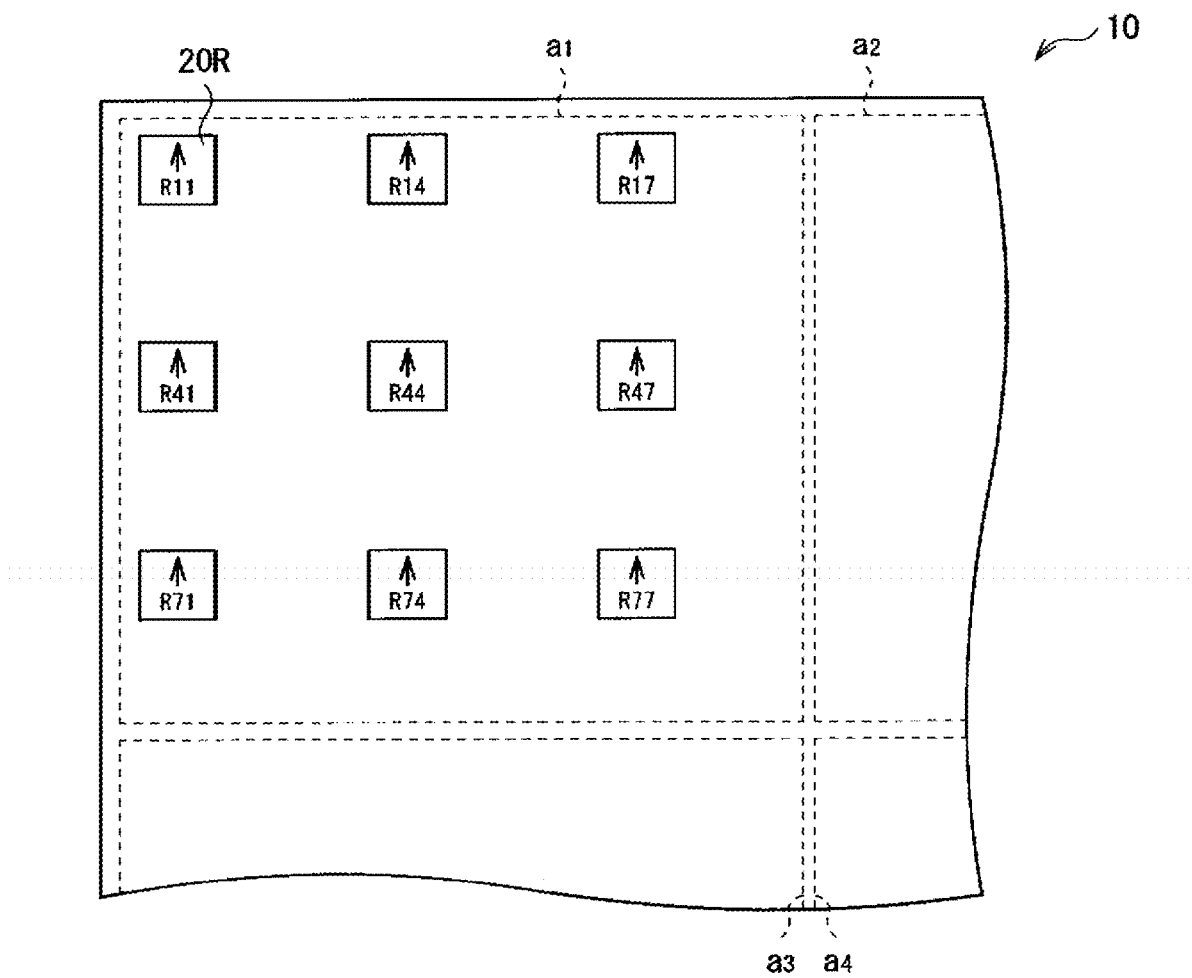
FIG. 26 is a schematic diagram illustrating an example of the manner in which the wiring board appears when some of the light-emitting elements are transferred from the temporary fastening substrate shown in FIG. 25 to the wiring board.
Figure 27:
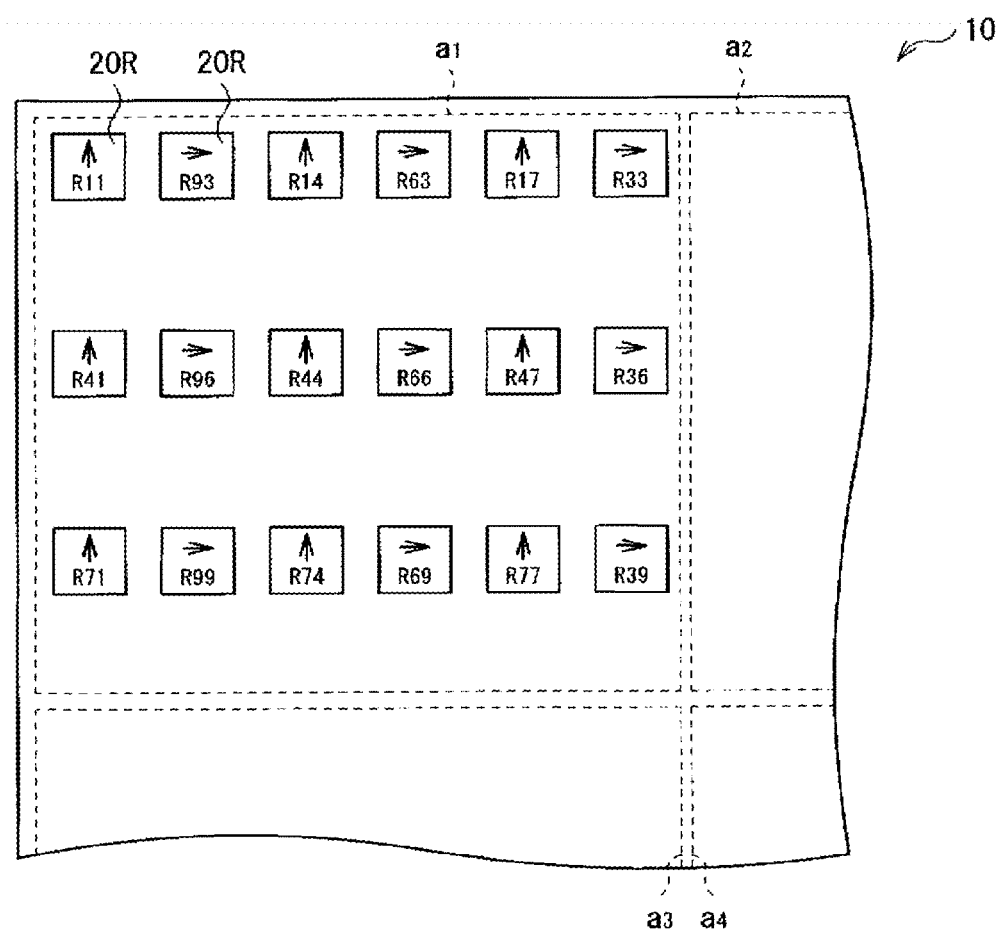
FIG. 27 is a schematic diagram illustrating an example of the manner in which the wiring board appears when the transfer continues after the step shown in FIG. 26.
Figure 28:
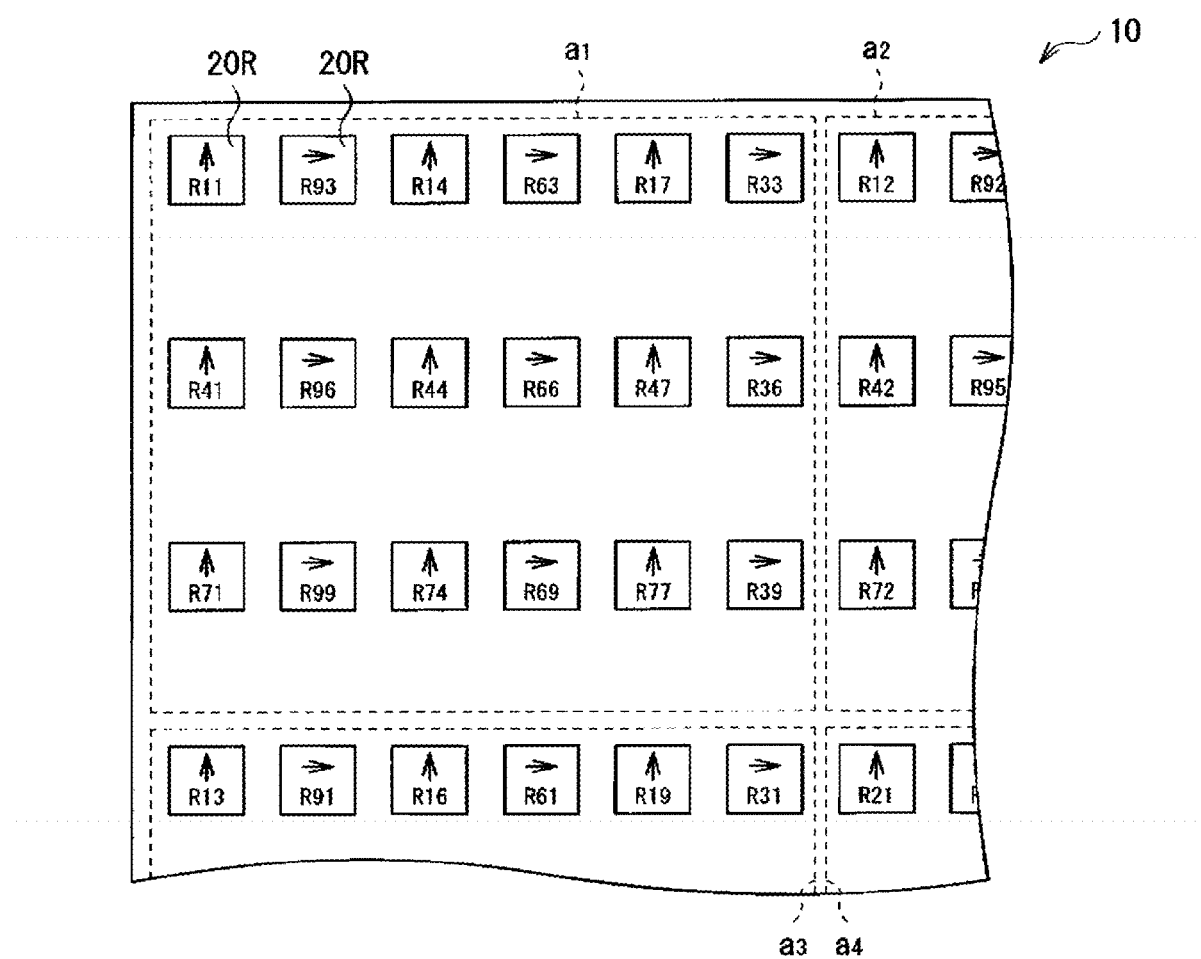
FIG. 28 is a schematic diagram illustrating an example of the manner in which the wiring board appears when the transfer continues after the step shown in FIG. 27.
Figure 29:
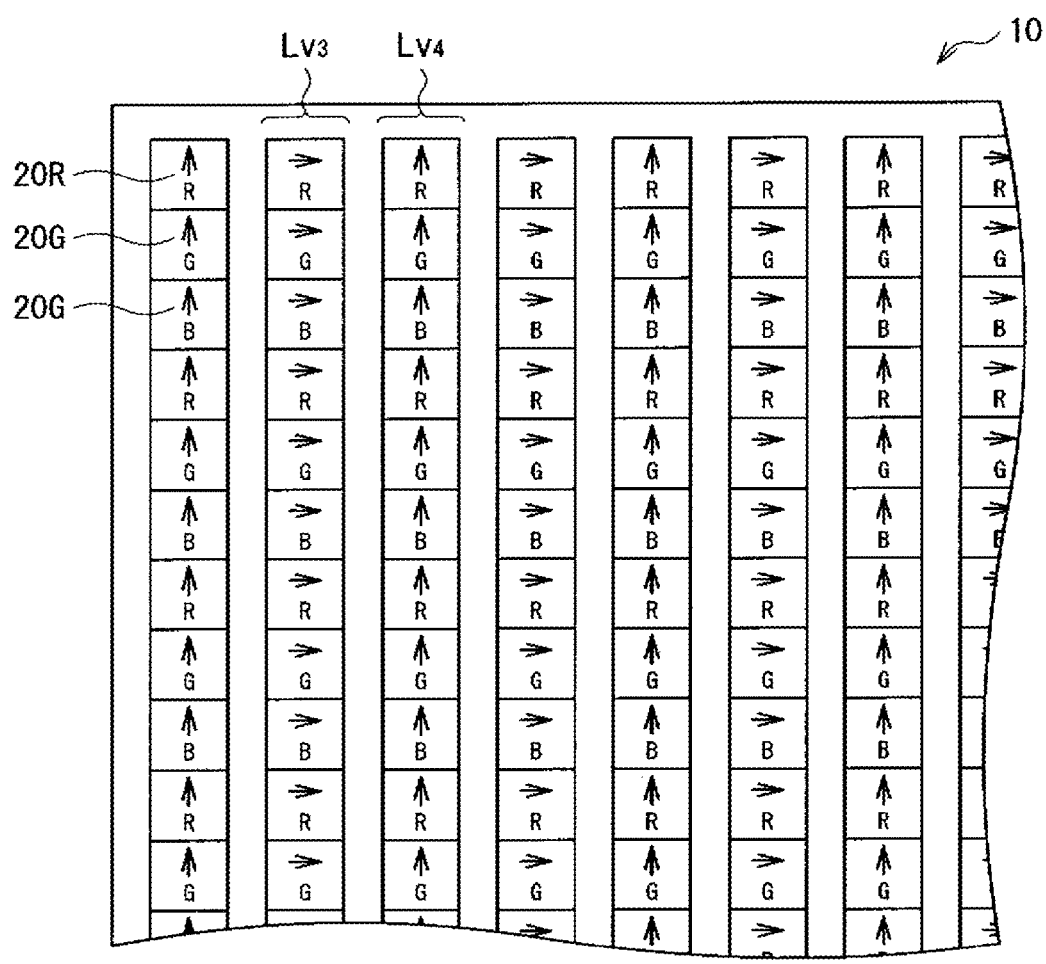
FIG. 29 is a schematic diagram illustrating an example of the manner in which the wiring board appears when the transfer continues after the step shown in FIG. 28.

Next, of all the plurality of light-emitting elements 20R on the temporary fastening substrate 600, the specific ones (those enclosed by circles in FIG. 25) are transferred to the given area a1 on the wiring board 10 (FIG. 26). For example, of the plurality of light-emitting elements 20R included in specific columns (e.g., first, fourth and seventh columns from right), one in every three light-emitting elements 20R is transferred to the wiring board 10. Next, the orientations of the crystal axes of the light-emitting elements 20R on the temporary fastening substrate 600 are rotated by 90 degrees by rotating the temporary fastening substrate 600 by 90 degrees, then which of all the plurality of light-emitting elements 20R on the temporary fastening substrate 600, the specific ones are transferred to the given area a1 on the wiring board 10 (FIG. 27). For example, of the plurality of light-emitting elements 20R included in columns different from those from which the light-emitting elements 20R have been transferred (e.g., first, fourth and seventh columns from left in FIG. 25), one in every three light-emitting elements 20R is transferred between the same elements 20R on the wiring board 10. The light-emitting elements 20R are similarly transferred to the other areas a2, a3, a4 and so on of the wiring board 10 (FIG. 28). Further, the light-emitting elements 20G and 20B are similarly transferred to the wiring board 10 (FIG. 29).

As a result, when attention is focused on the plurality of light-emitting elements 20 of the same type (same emission color), the orientations of the common crystal axes of the light-emitting elements 20 of the same type (same emission color) adjacent to each other in the row direction differ by 90 degrees. Further, when attention is focused on the plurality of light-emitting elements 20 of the same type (same emission color), the orientations of the common crystal axes of the light-emitting elements 20 of the same type (same emission color) adjacent to each other in the column direction are the same. When attention is focused on the two columns Lv3 and Lv4 adjacent to each other of all the rows and columns made up of the plurality of light-emitting elements 20 of the same type (same emission color) (attention is focused on the two columns adjacent to each other in FIG. 29), the orientations of the common crystal axes in the columns Lv3 and Lv4 differ (more specifically, differ by 90 degrees). Further, the common crystal axes alternate their orientations every column.

Figure 30:
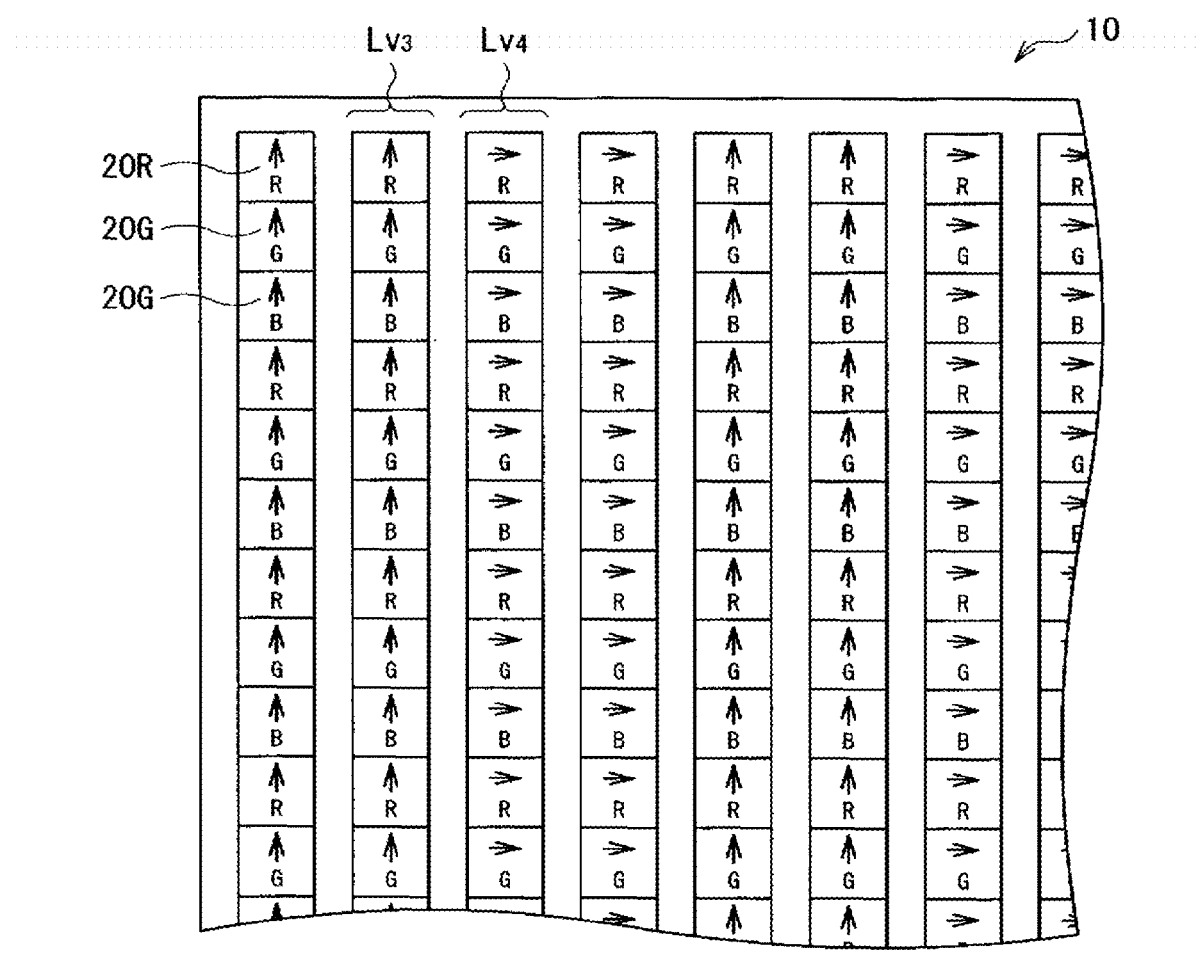
FIG. 30 is a schematic diagram illustrating another example of the manner in which the wiring board appears when the transfer continues after the step shown in FIG. 28.

It should be noted that the common crystal axes may alternate their orientations every two columns, for example, as illustrated in FIG. 30 by using the same method as described above. Further, although not shown, the common crystal axes may alternate their orientations every three or more columns.

(Manufacturing Method 2)

Figure 31:
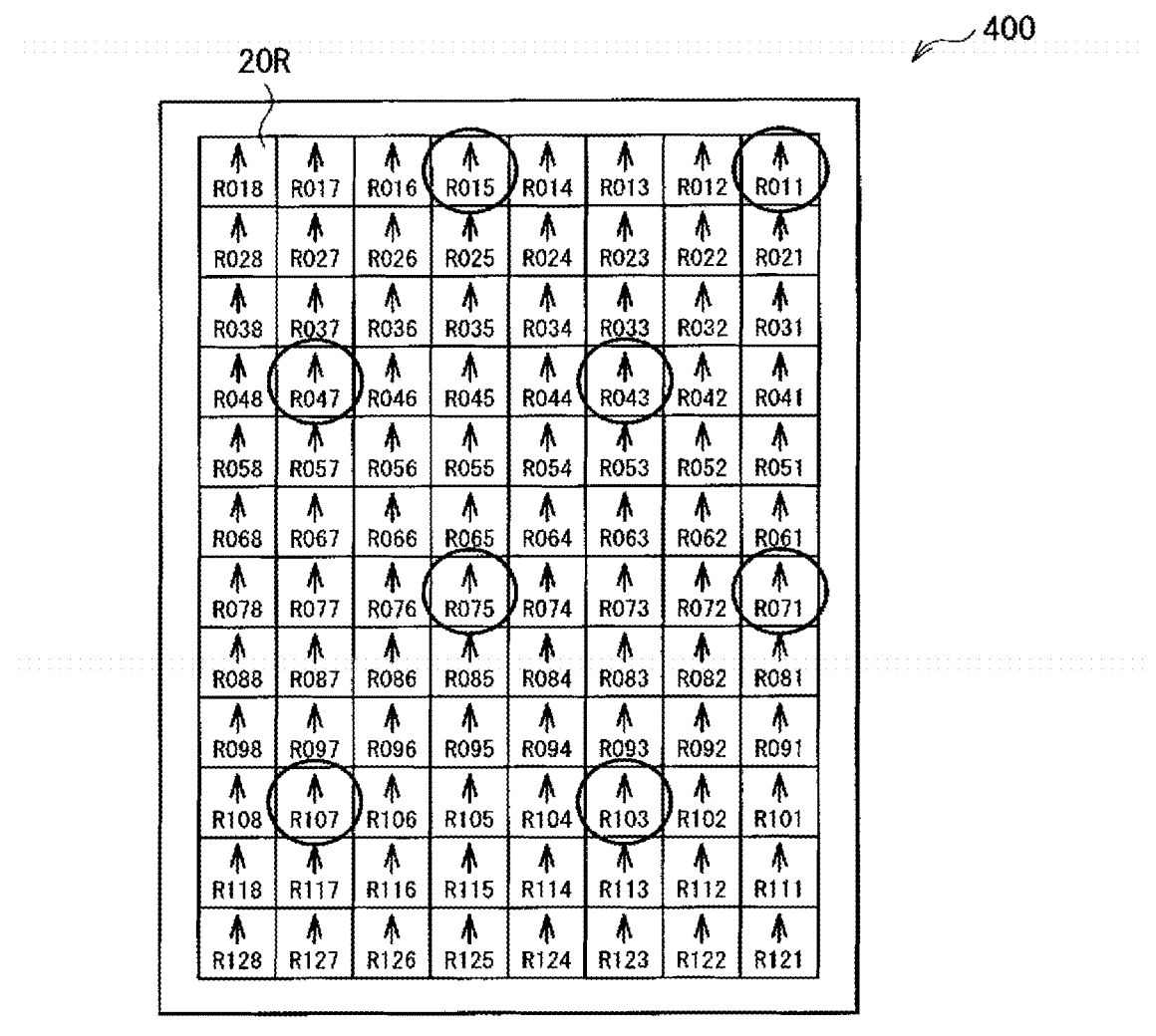
Figure 32:
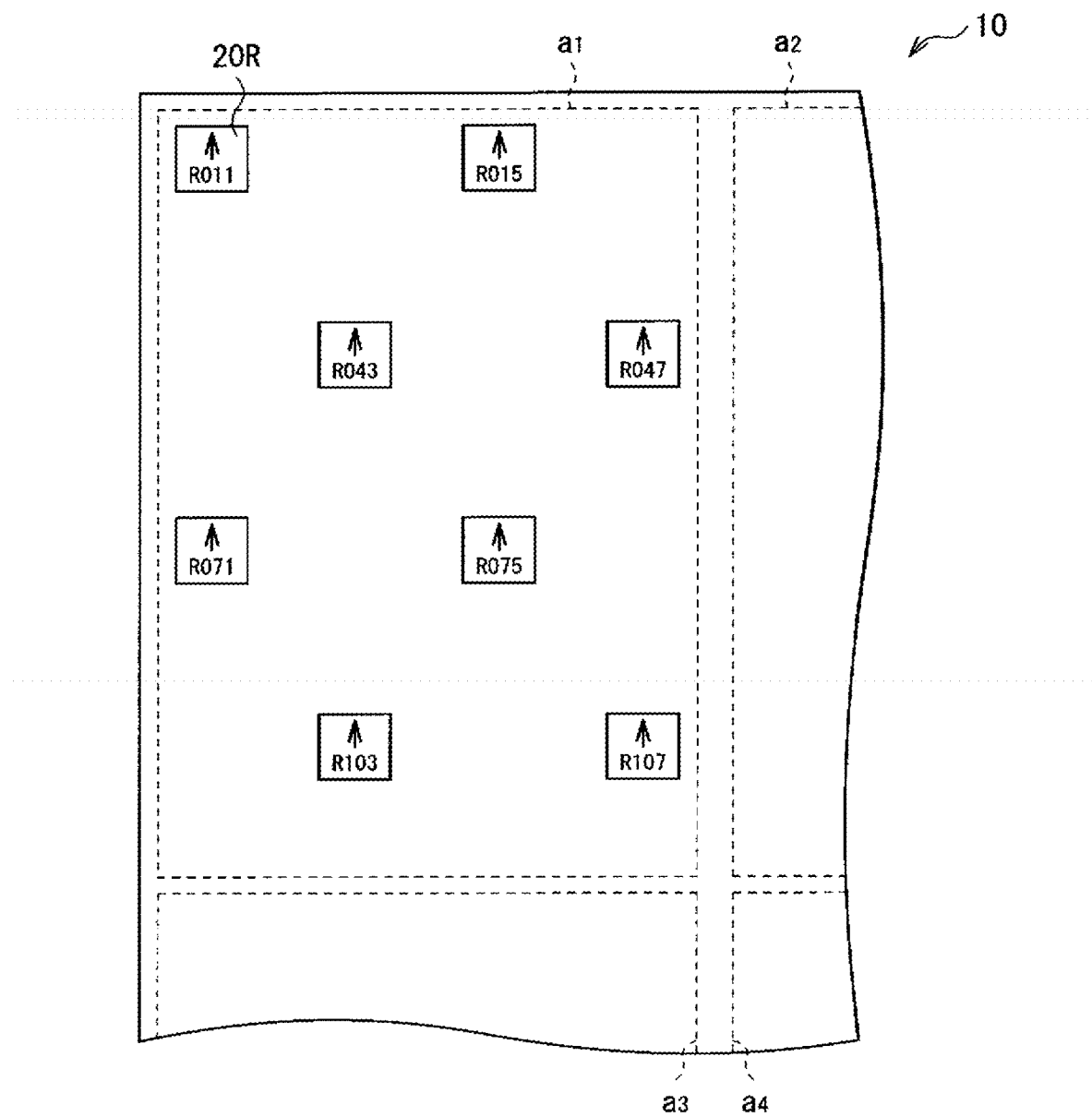
FIG. 32 is a schematic diagram illustrating an example of the manner in which the wiring board appears when some of the light-emitting elements are transferred from the temporary fastening substrate shown in FIG. 31 to the wiring board.
Figure 34:
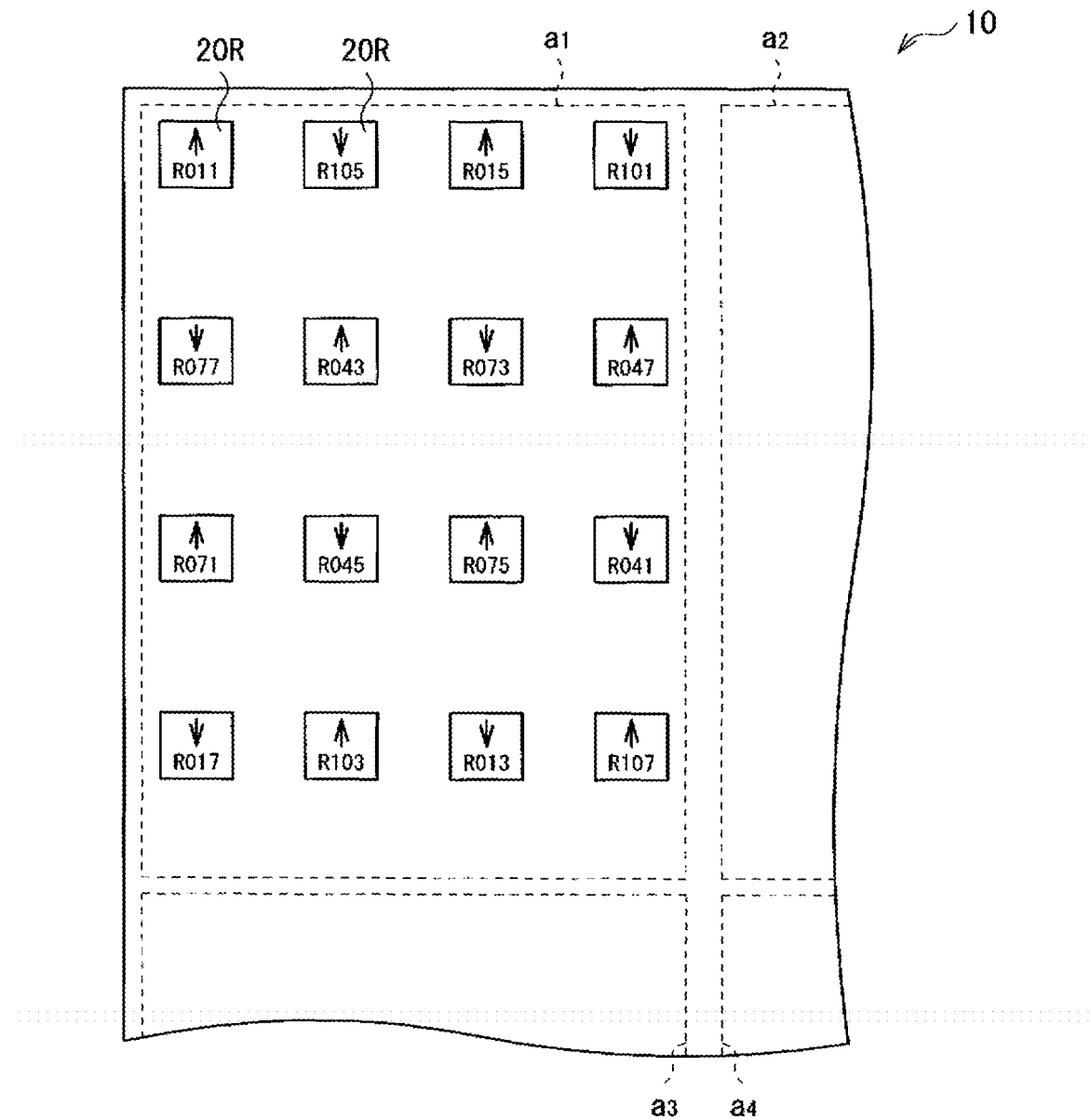
FIG. 34 is a schematic diagram illustrating an example of the manner in which the wiring board appears when the transfer continues after the step shown in FIG. 32.
Figure 35:
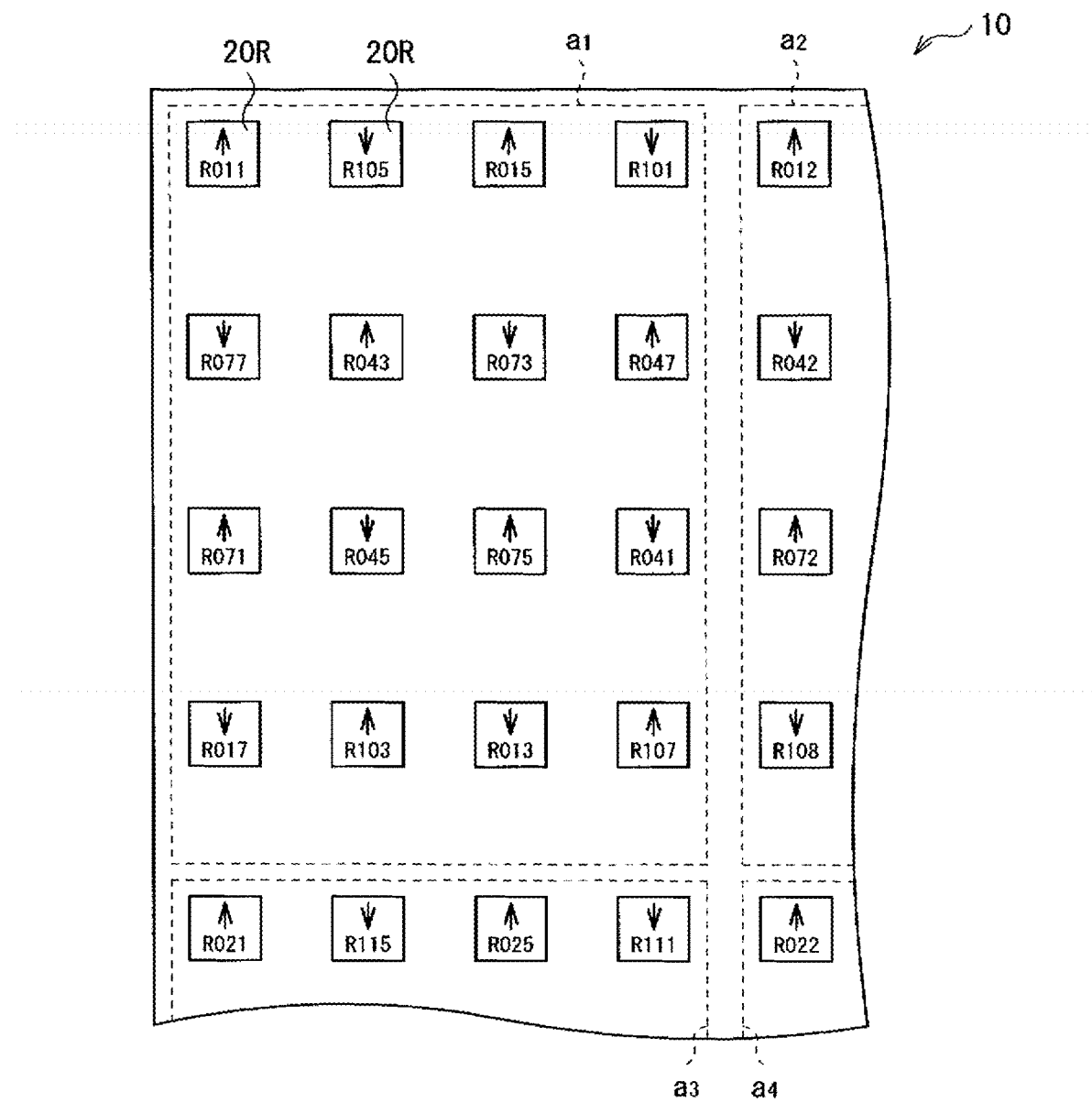
FIG. 35 is a schematic diagram illustrating an example of the manner in which the wiring board appears when the transfer continues after the step shown in FIG. 34.
Figure 36:
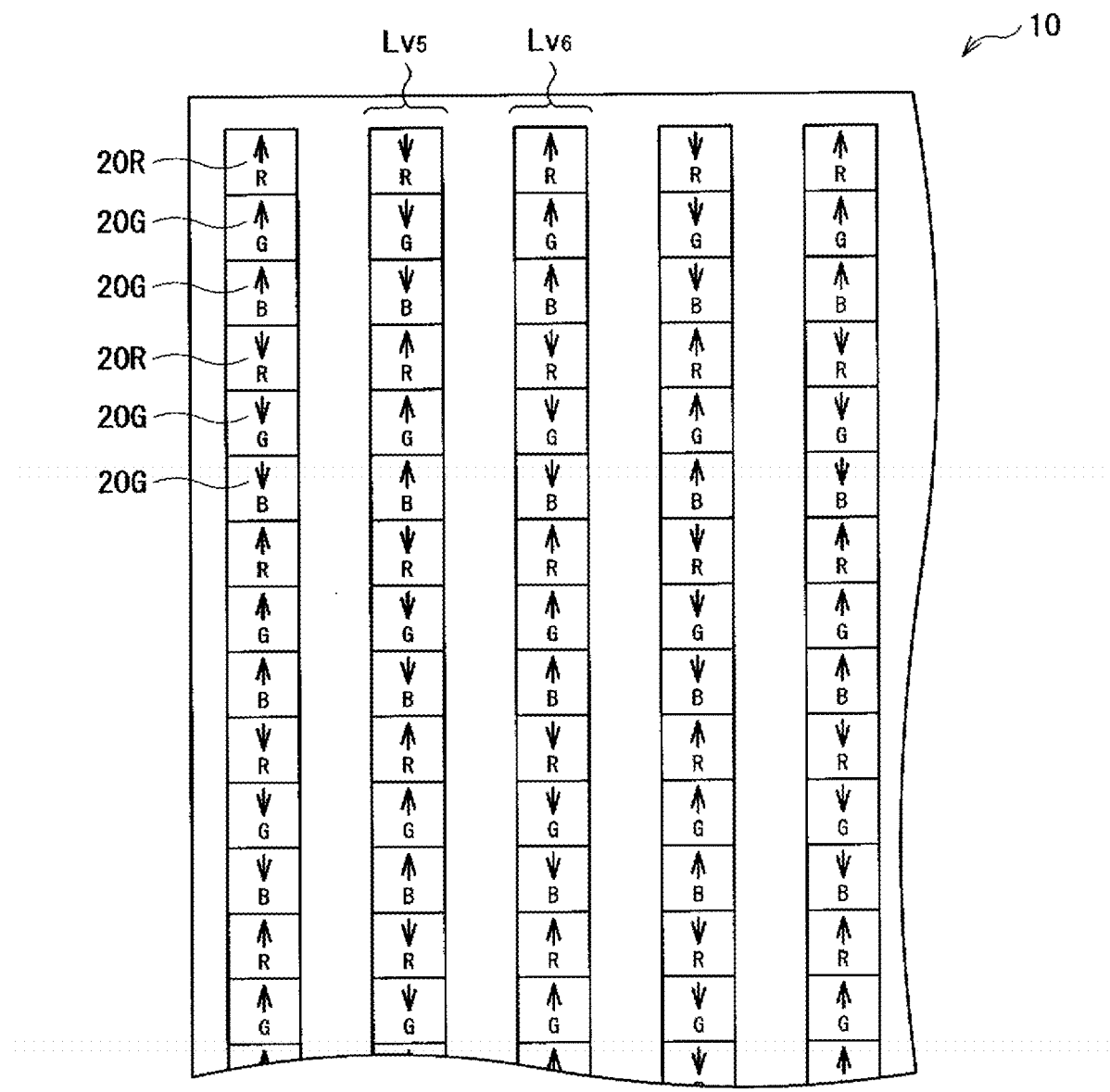
FIG. 36 is a schematic diagram illustrating an example of the manner in which the wiring board appears when the transfer continues after the step shown in FIG. 35.

First, the wafer 300 is prepared that has the plurality of light-emitting elements 120R formed thereon (FIG. 17), then the plurality of light-emitting elements 20R are formed on the temporary fastening substrate 400 (FIG. 18). Next, of all the plurality of light-emitting elements 20R on the temporary fastening substrate 400, the specific ones (those enclosed by circles in FIG. 31) are transferred to the given area a1 on the wiring board 10 (FIG. 32). For example, of the plurality of light-emitting elements 20R included in specific columns (e.g., first, third, fifth and seventh columns from right in FIG. 32), one in every six light-emitting elements 20R is transferred to the wiring board 10. At this time, the light-emitting elements 20R are transferred to the wiring board 10 in a staggered manner as illustrated in FIG. 32. Next, the orientations of the crystal axes of the light-emitting elements 20R on the temporary fastening substrate 400 are rotated by 180 degrees by rotating the temporary fastening substrate 400 by 180 degrees, then which of all the plurality of light-emitting elements 20R on the temporary fastening substrate 400, only the specific ones (those enclosed by circles in FIG. 33) are transferred to the given area a1 on the wiring board 10 (FIG. 34). For example, of the plurality of light-emitting elements 20R included in specific columns (e.g., first, third, fifth and seventh columns from right in FIG. 33), some are transferred to the wiring board 10 in a staggered manner. The light-emitting elements 20R are similarly transferred to the other areas a2, a3, a4 and so on of the wiring board 10 (FIG. 35). Further, the light-emitting elements 20G and 20B are similarly transferred to the wiring board 10 (FIG. 36).

As a result, when attention is focused on the plurality of light-emitting elements 20 of the same type (same emission color), the orientations of the common crystal axes of the light-emitting elements 20 of the same type (same emission color) adjacent to each other in the row direction differ by 180 degrees. Further, when attention is focused on the plurality of light-emitting elements 20 of the same type (same emission color), the orientations of the common crystal axes of the light-emitting elements 20 of the same type (same emission color) adjacent to each other in the column direction also differ by 180 degrees. For example, when attention is focused on the two columns Lv5 and Lv6 adjacent to each other of all the rows and columns made up of the plurality of light-emitting elements 20 of the same type (same emission color), the orientations of the common crystal axes adjacent to each other differ (more specifically, differ by 180 degrees) in the in-plane layout of the common crystal axes of all the light-emitting elements 20 of the same type (same emission color) included in the columns Lv5 and Lv6. Further, the light-emitting elements 20 having the common crystal axes oriented in the same direction are arranged in a staggered manner every two adjacent columns.

(Manufacturing Method 3)

Figure 37:
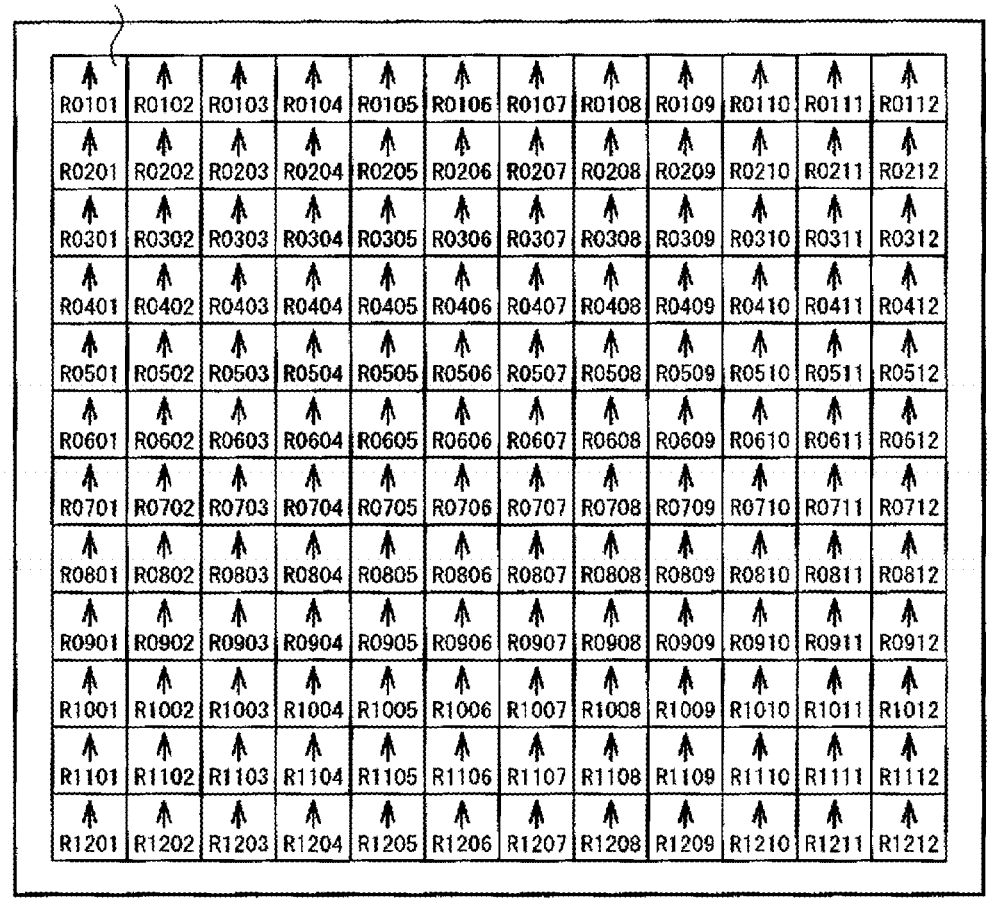
FIG. 37 is a conceptual diagram illustrating an example of in-plane distribution of crystal axes of the wafer shown in FIG. 11.
Figure 38:
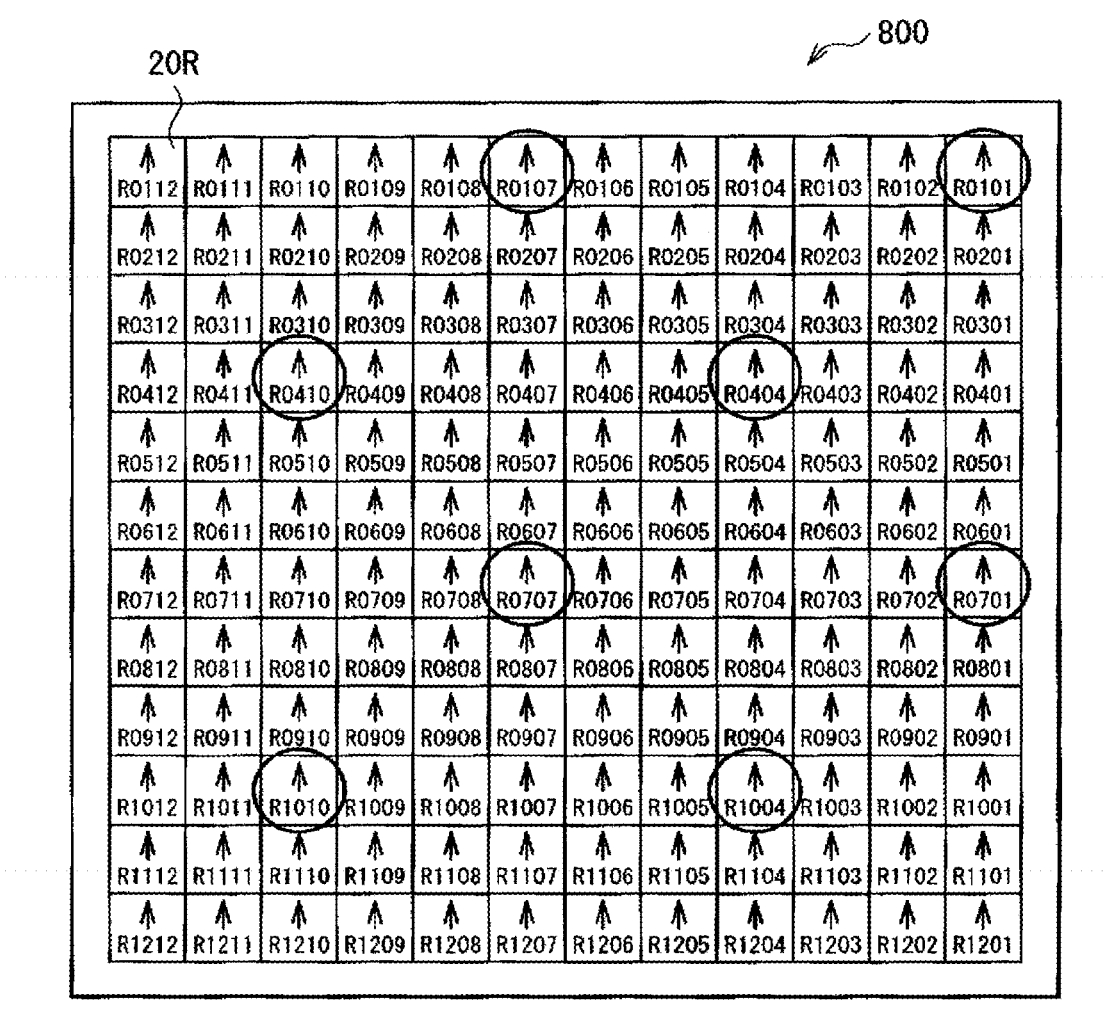

First, a wafer 700 is prepared that has the plurality of light-emitting elements 120R formed thereon (FIG. 37). At this time, the orientations of the crystal axes (arrows in FIG. 37) of the light-emitting elements 120R are the same. It should be noted that, in FIG. 37, the coordinate of each of the light-emitting elements 120R is shown together with an arrow indicating the orientation of its crystal axis. Next, all the light-emitting elements 120R on the wafer 700 are transferred to a temporary fastening substrate 800, then the light-emitting elements 20R are formed by the same method as described above (FIG. 38). The temporary fastening substrate 800 includes a transparent substrate (e.g., quartz or sapphire substrate) and an unhardened adhesive layer provided on the transparent substrate. It should be noted that the coordinates of the elements resulting from the transfer shown in FIG. 38 are flipped horizontally from those shown in FIG. 37.

Figure 39:
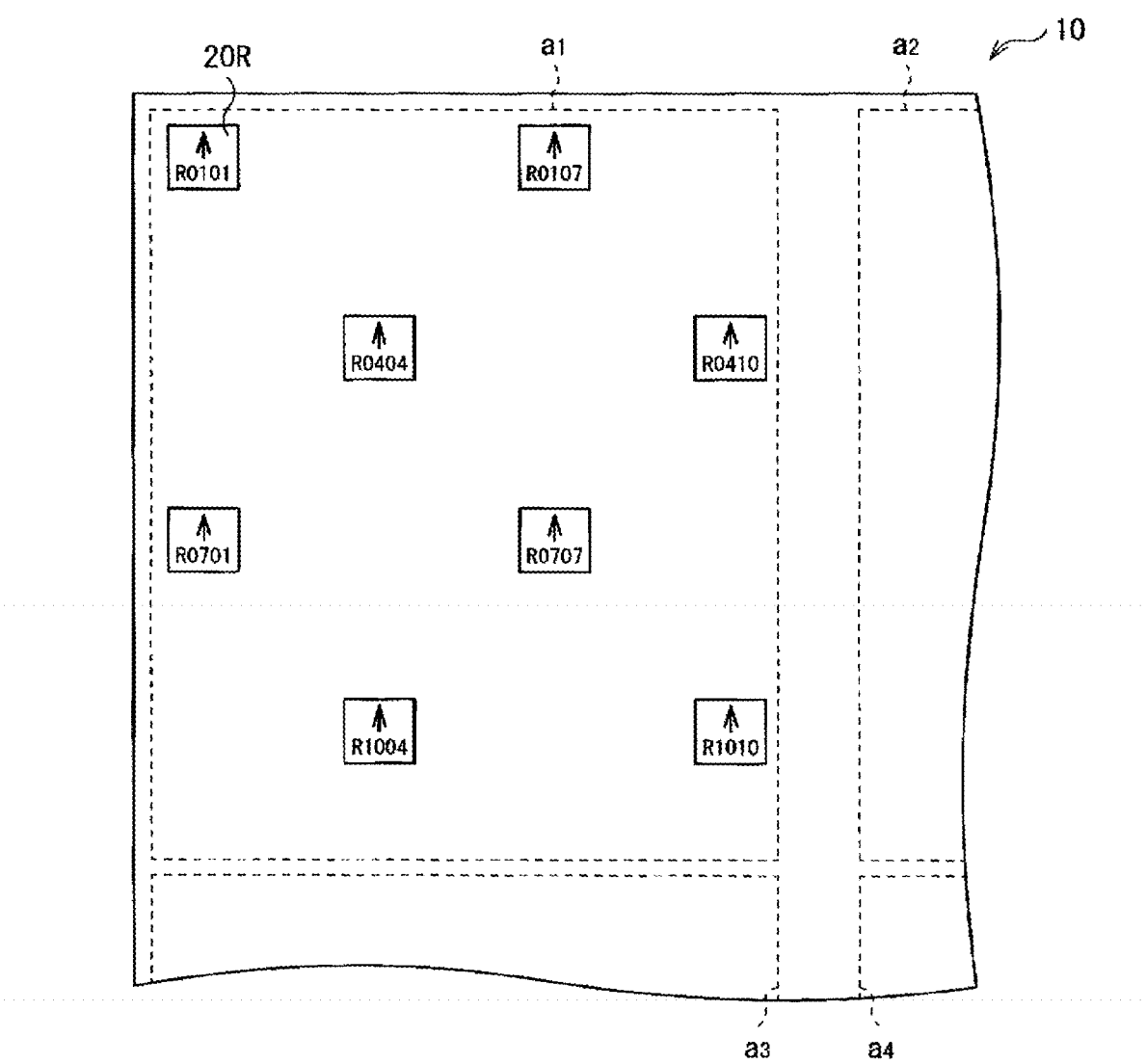
FIG. 39 is a schematic diagram illustrating an example of the manner in which the wiring board appears when some of the light-emitting elements are transferred from the temporary fastening substrate shown in FIG. 38 to the wiring board.
Figure 40:
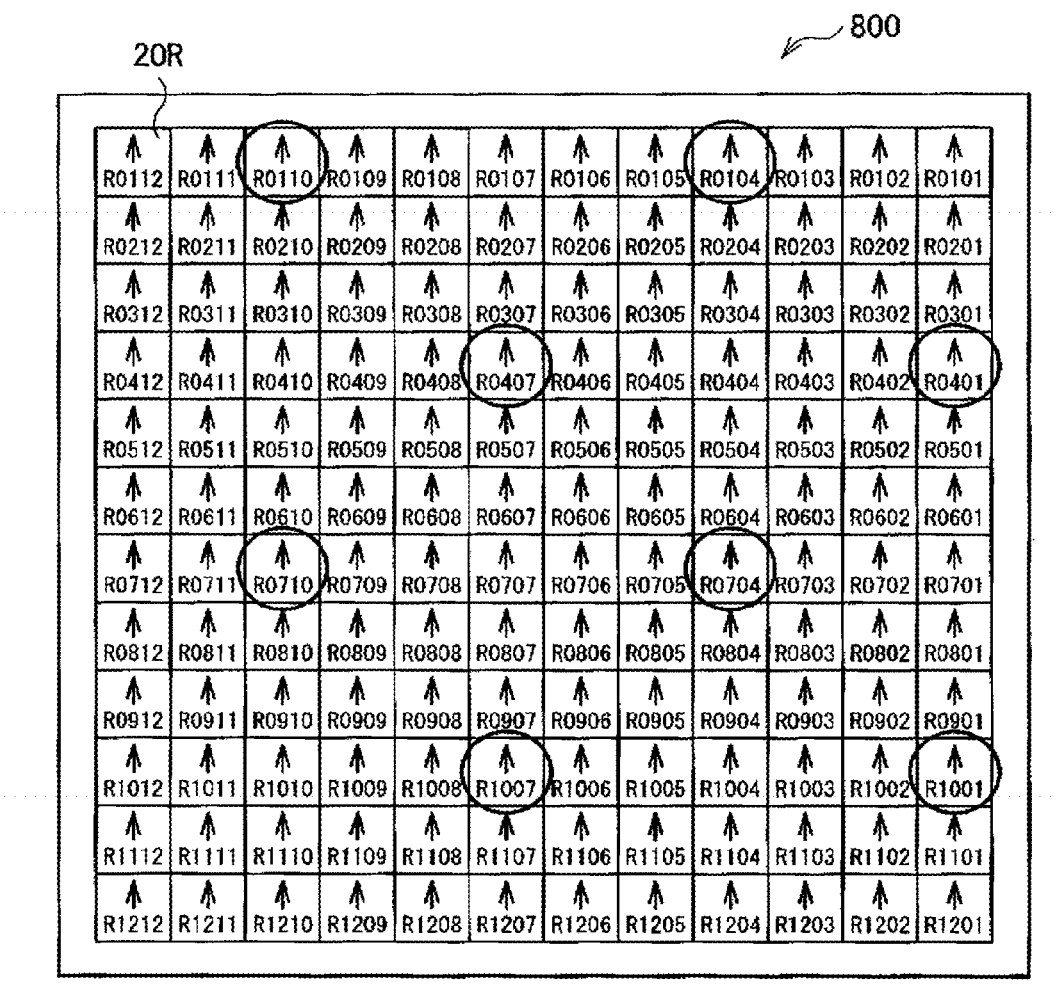
Figure 41:
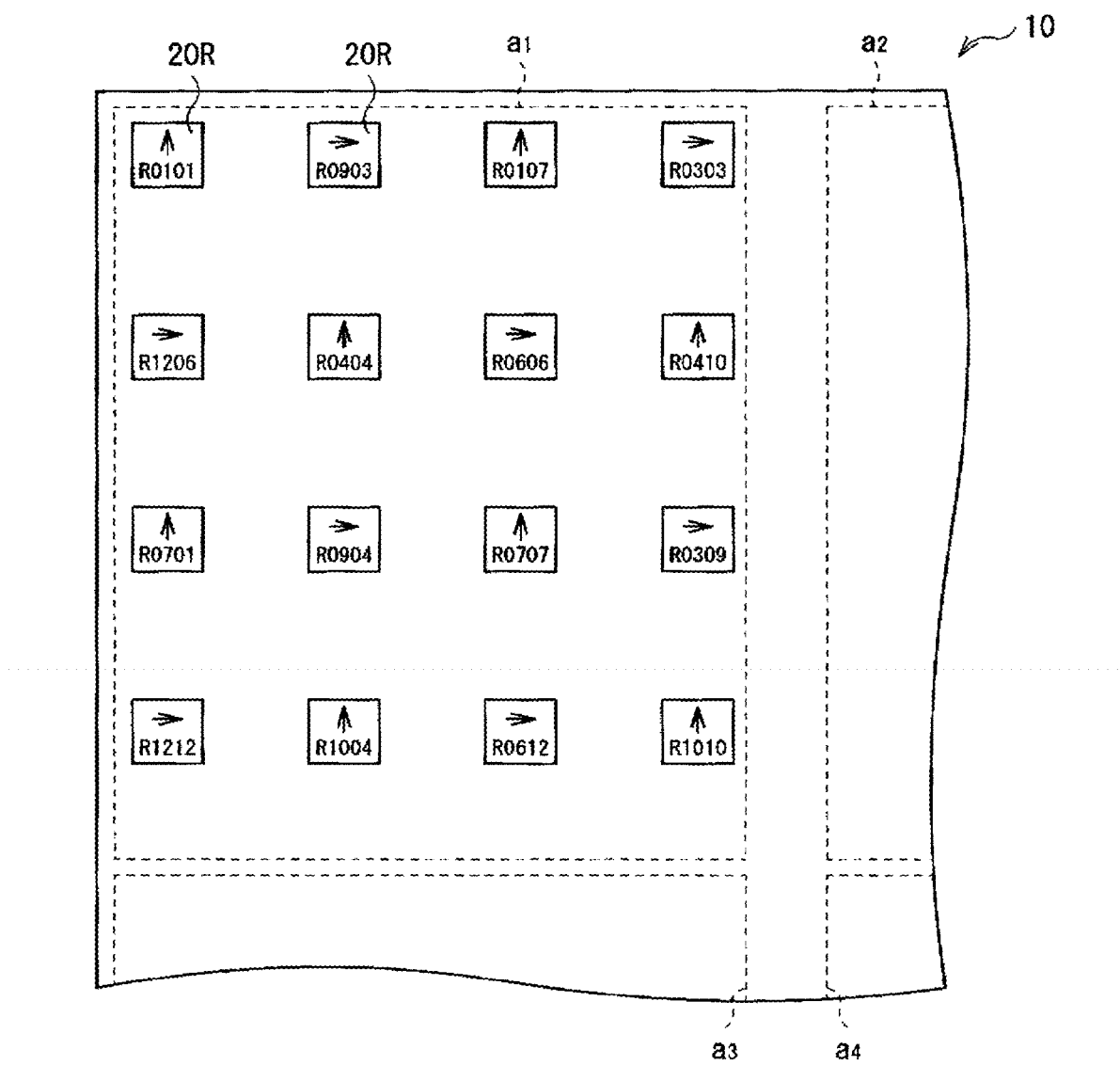
FIG. 41 is a schematic diagram illustrating an example of the manner in which the wiring board appears when the transfer continues after the step shown in FIG. 39.
Figure 42:
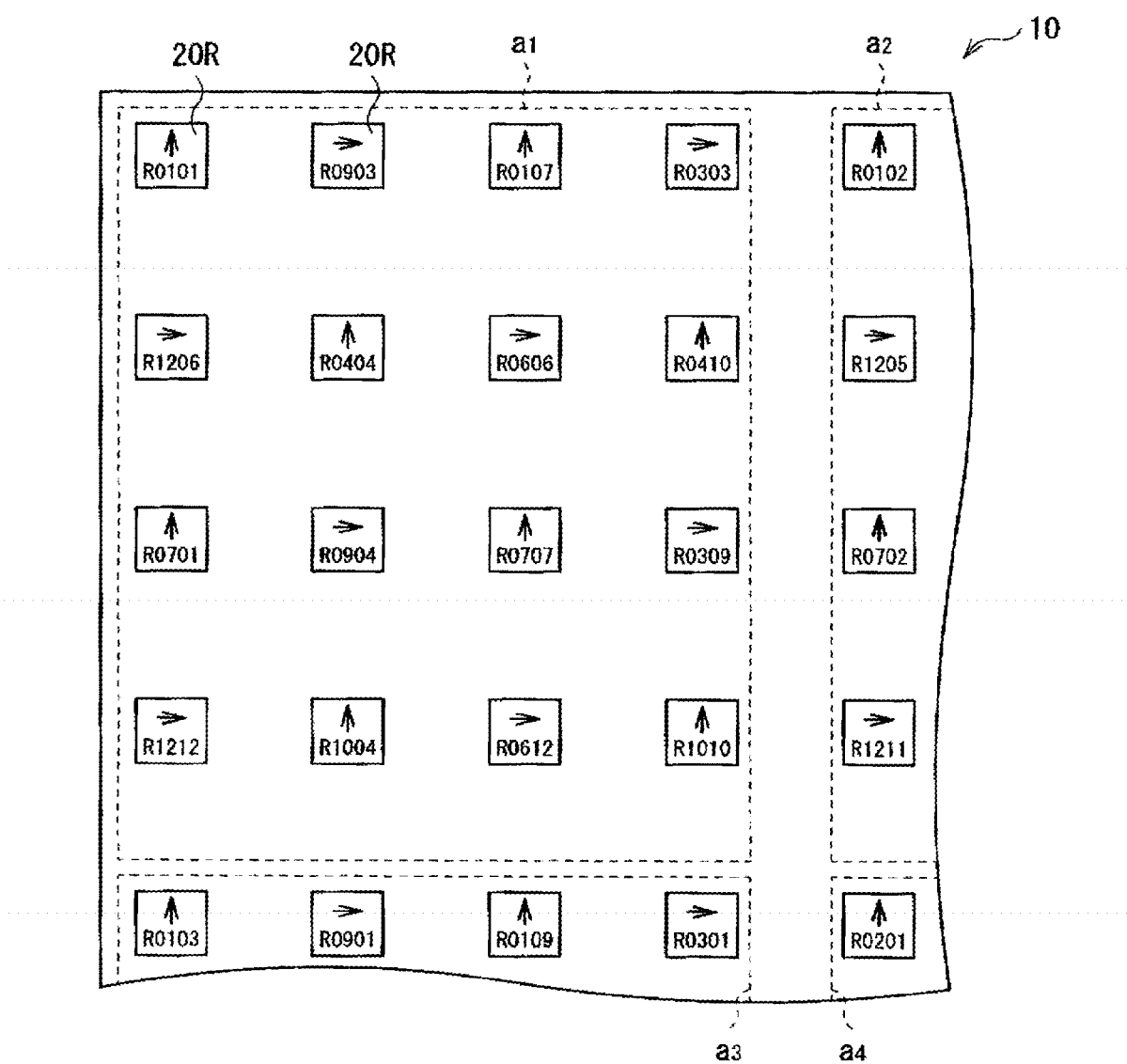
FIG. 42 is a schematic diagram illustrating an example of the manner in which the wiring board appears when the transfer continues after the step shown in FIG. 41.
Figure 43:
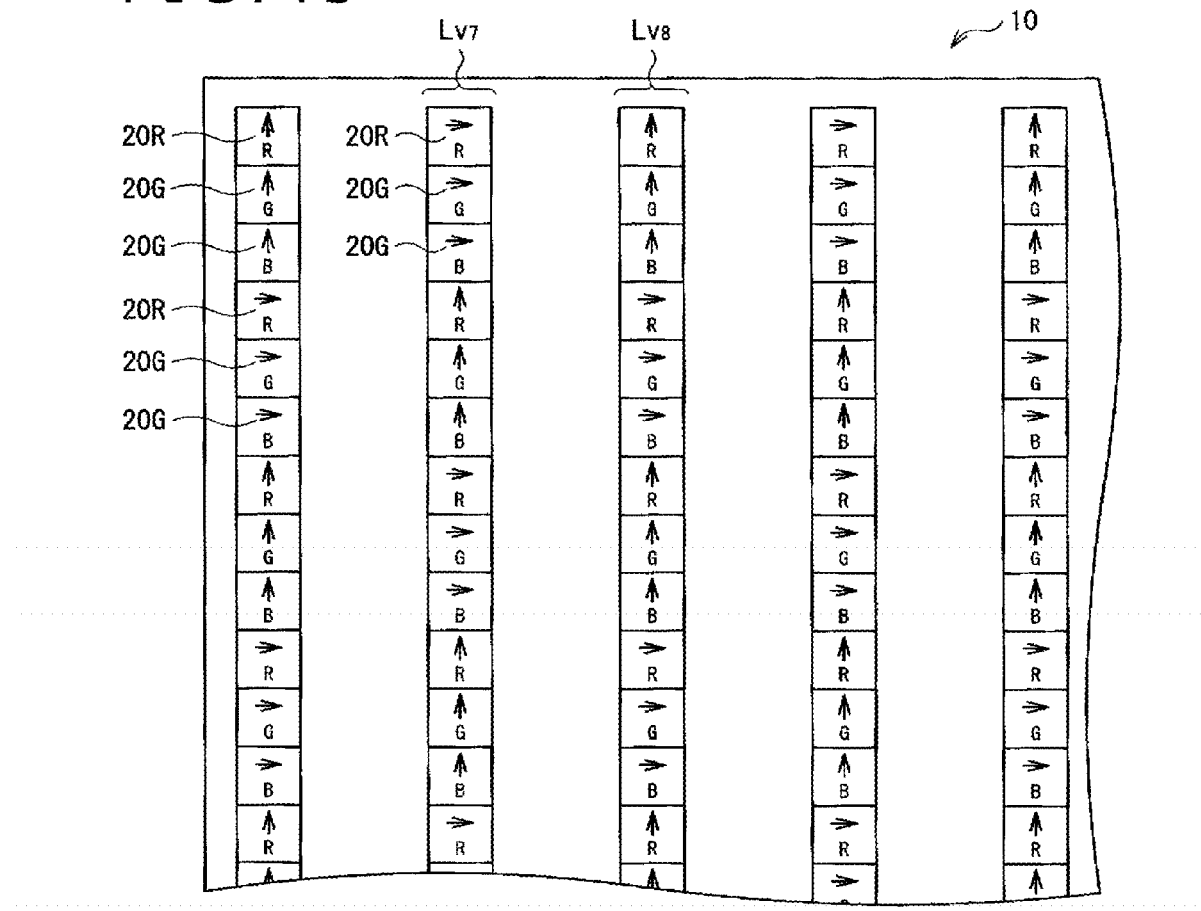
FIG. 43 is a schematic diagram illustrating another example of the manner in which the wiring board appears when the transfer continues after the step shown in FIG. 41.

Next, of all the plurality of light-emitting elements 20R on the temporary fastening substrate 800, the specific ones (those enclosed by circles in FIG. 38) are transferred to the given area a1 on the wiring board 10 (FIG. 39). For example, of the plurality of light-emitting elements 20R included in specific columns (e.g., first, fourth, seventh and tenth columns from right), one in every six light-emitting elements 20R is transferred to the wiring board 10. At this time, the light-emitting elements 20R are transferred to the wiring board 10 in a staggered manner as illustrated in FIG. 39. Next, the orientations of the crystal axes of the light-emitting elements 20R on the temporary fastening substrate 800 are rotated by 90 degrees by rotating the temporary fastening substrate 800 by 90 degrees, then which of all the plurality of light-emitting elements 20R on the temporary fastening substrate 800, the specific ones (those enclosed by circles in FIG. 40) are transferred to the given area a1 on the wiring board 10 (FIG. 41). For example, of the plurality of light-emitting elements 20R included in columns different from those from which the light-emitting elements 20R have been transferred (e.g., first, fourth, seventh and tenth columns from left in FIG. 40), one in every six light-emitting elements 20R is transferred between the same elements 20R on the wiring board 10. At this time, the light-emitting elements 20R are transferred to the wiring board 10 in a staggered manner as illustrated in FIG. 41. The light-emitting elements 20R are similarly transferred to the other areas a2, a3, a4 and so on of the wiring board 10 (FIG. 42). Further, the light-emitting elements 20G and 20B are similarly transferred to the wiring board 10 (FIG. 43).

As a result, when attention is focused on the plurality of light-emitting elements 20 of the same type (same emission color), the orientations of the common crystal axes of the light-emitting elements 20 of the same type (same emission color) adjacent to each other in the row direction differ by 90 degrees. Further, when attention is focused on the plurality of light-emitting elements 20 of the same type (same emission color), the orientations of the common crystal axes of the light-emitting elements 20 of the same type (same emission color) adjacent to each other in the column direction also differ by 90 degrees. For example, when attention is focused on the two columns Lv7 and Lv8 adjacent to each other of all the rows and columns made up of the plurality of light-emitting elements 20 of the same type (same emission color), the orientations of the common crystal axes adjacent to each other differ (more specifically, differ by 90 degrees) in the in-plane layout of the common axes of all the light-emitting elements 20 of the same type (same emission color) included in the columns Lv7 and Lv8. Further, the light-emitting elements 20 having the common crystal axes oriented in the same direction are arranged in a staggered manner every two adjacent columns.

It should be noted that if it is desired that the top surface of each of the light-emitting elements 20R (surface on the side of the electrode 24) as mounted to the wiring board 10 should face the side opposite to the wiring board 10, it is only necessary, for example, to transfer the light-emitting elements 20R to the temporary fastening substrate again before mounting the same elements 20R to the wiring board 10, flip the same elements 20R vertically and then mount the specific light-emitting elements 20R to the wiring board 10.

[Effect]

In the present embodiment, the orientations of the crystal axes of the light-emitting elements 20R mounted in a matrix form on the common wiring board 10 are not all the same, and the orientations of the common crystal axes of the light-emitting elements 20R adjacent to each other at least in one of the row and column directions differ. Further, the orientations of the crystal axes of the light-emitting elements 20G mounted in a matrix form on the common wiring board 10 are not all the same, and the orientations of the common crystal axes of the light-emitting elements 20G adjacent to each other at least in one of the row and column directions differ. Still further, the orientations of the crystal axes of the light-emitting elements 20B mounted in a matrix form on the common wiring board 10 are not all the same, and the orientations of the common crystal axes of the light-emitting elements 20B adjacent to each other at least in one of the row and column directions differ.

Because of this, the inclinations of the radiation angles of the red LEDs are not uniform in plane. The striped patterns formed on the front surfaces of the green LEDs are not uniform in plane. Further, the striped patterns formed on the front surfaces of the blue LEDs are not uniform in plane. This contributes to reduced in-plane unbalance in FFP (Far Field Pattern) as compared to if the orientations of the crystal axes of the red LEDs are uniform in plane, if the orientations of the crystal axes of the green LEDs are uniform in plane, and if the orientations of the crystal axes of the blue LEDs are uniform in plane, thus providing improved robustness against uneven color and luminance. It should be noted that the deviation of the orientation of the crystal axis of each light-emitting element from the main axis generates a piezo electric field and causes polarization property to manifest itself. In the present embodiment, however, the respective polarization properties cancel each other out, thus providing the light-emitting device 1 free from uneven color and luminance as a whole.

2. Modification Examples of First Embodiment

In the above embodiment, the orientations of the crystal axes of the LEDs of all colors are not uniform in plane. For example, however, the orientations of the crystal axes of the LEDs of one of the three colors may not be uniform in plane. For example, the orientations of the crystal axes of the red LEDs may not be uniform in plane. Alternatively, the orientations of the crystal axes of the green LEDs may not be uniform in plane. Still alternatively, the orientations of the crystal axes of the blue LEDs may not be uniform in plane. Still alternatively, the orientations of the crystal axes of the LEDs of two of the three colors may not be uniform in plane. For example, the orientations of the crystal axes of the red and green LEDs may not be uniform in plane. Alternatively, the orientations of the crystal axes of the red and blue LEDs may not be uniform in plane. Still alternatively, the orientations of the crystal axes of the green and blue LEDs may not be uniform in plane.

Further, in the above embodiment and modification examples thereof, the light-emitting device 1 includes the light-emitting elements (LEDs) of three colors in each group Gi. However, the light-emitting device 1 may include the light-emitting elements (LEDs) of four colors in each group Gi. Alternatively, the light-emitting device 1 may include the light-emitting elements (LEDs) of one or two colors in each group Gi. If the light-emitting device 1 includes the light-emitting elements (LEDs) of two colors in each group Gi, the data wires 14 and scan wires 15 are laid out identically in relation to the light-emitting elements (LEDs) of each color that belong in the area α.

3. Second Embodiment

[Configuration]

A description will be given next of a display device 2 according to a second embodiment of the present disclosure. The display device 2 includes the light-emitting devices 1 according to the above embodiment arranged over the entire surface of a display panel. It should be noted that the display device 2 may include the light-emitting devices 1 according to the above embodiment arranged in a matrix (grid) or honeycomb form over the entire surface of a display panel.

Figure 44:
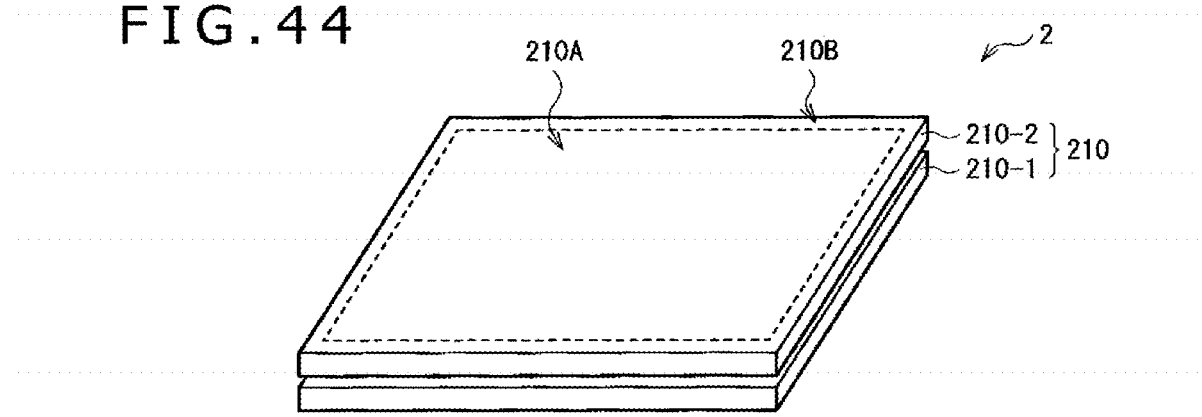
FIG. 44 is a perspective view illustrating an example of configuration of a display device according to a second embodiment of the present disclosure.

FIG. 44 perspectively illustrates an example of schematic configuration of the display device 2 according to the second embodiment of the present disclosure. The display device 2 is a so-called LED display that uses LEDs as its display pixels. The display device 2 includes, for example, a display panel 210 and a drive circuit (not shown) adapted to drive the display panel 210 as illustrated in FIG. 44.

(Display Panel 210)

The display panel 210 includes a mounted board 210-1 and transparent substrate 210-2 that are placed one on top of another. The front surface of the transparent substrate 210-2 serves as a video display surface that has a display area 210A in the center and a frame area 210B, i.e., a non-display area, around the display area 210A.

(Mounted Board 210-1)

Figure 45:
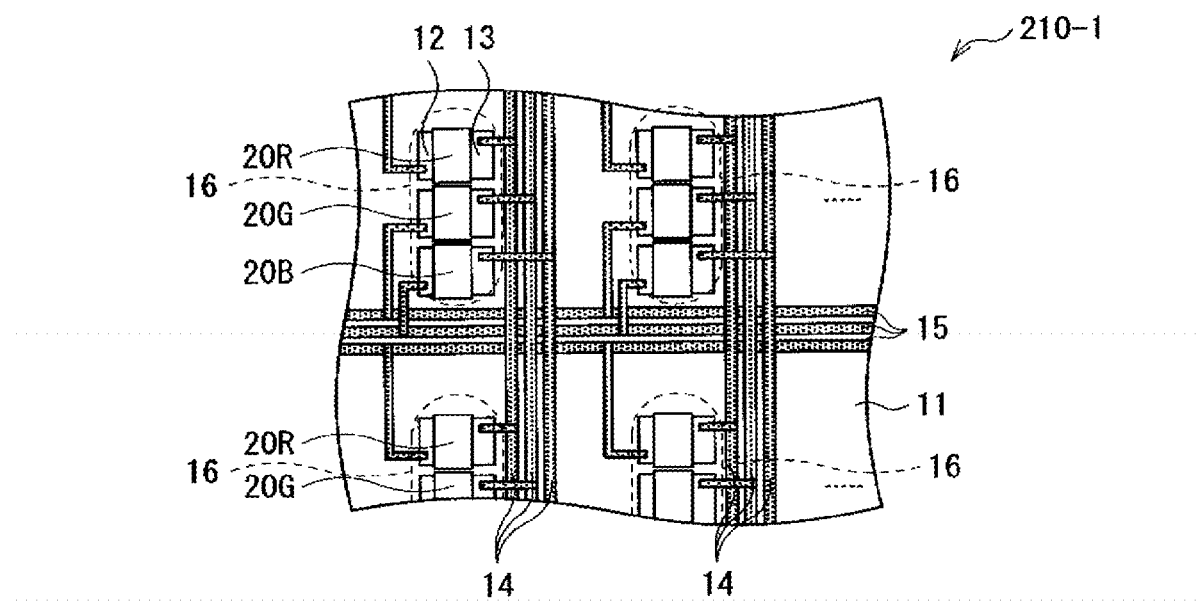
FIG. 45 is a plan view illustrating an example of layout on the front surface of a mounted board shown in FIG. 44.

FIG. 45 illustrates an example of layout in the area on the front surface of the mounted board 210-1 for the display area 210A of the transparent substrate 210-2. In the area on the front surface of the mounted board 210-1 for the display area 210A, for example, the plurality of data wires 14 are formed to extend in the column direction as illustrated in FIG. 45. The data wires 14 are arranged parallel to each other at predetermined pitches. Further, in the area on the front surface of the mounted board 210-1 for the display area 210A, for example, the plurality of scan wires 15 are formed to extend in such a direction as to intersect (e.g., be orthogonal to) the data wires 14. The scan wires 15 are arranged parallel to each other at predetermined pitches.

The scan wires 15 are formed, for example, in the outermost layer and formed, for example, on the insulating layer (not shown) formed on the surface of the base material. It should be noted that the base material of the mounted board 210-1 is, for example, a glass or resin substrate, and that the insulating layer on the base material is made of SiN, $SiO_2$ or $Al_2O_3$. On the other hand, the data wires 14 are formed in a layer (e.g., a layer below the outermost layer) different from the outermost layer that contains the scan wires 15 and are formed, for example, in the insulating layer on the base material. In addition to the scan wires 15, a black matrix, for example, is provided as necessary on the surface of the insulating layer. The black matrix is designed to provide improved contrast and made of a light absorbing material. The black matrix is formed, for example, at least in the area free from the pad electrodes 12 and 13 on the surface of the insulating layer. It should be noted that the black matrix can be omitted as necessary.

Display pixels 16 are provided near the intersections between the data wires 14 and scan wires 15. The plurality of display pixels 16 are arranged in a matrix (grid) or honeycomb form in the display area 210A. The plurality of light-emitting elements 20 are, for example, mounted in each of the display pixels 16 as illustrated in FIG. 45. Therefore, the plurality of light-emitting elements 20 are arranged in the same manner as the display pixels 16. More specifically, the light-emitting elements 20 are arranged in a matrix (grid) or honeycomb form. It should be noted that each of the light-emitting elements 20 has been mounted by the same method as described in the above embodiment, and that the top surface of each of the light-emitting elements 20 (i.e., surface on the side of the electrode 24) faces the transparent substrate 210-2. It should be noted that FIG. 45 shows a case in which the display pixels 16 each include the three light-emitting elements 20 (20R, 20G and 20B) so that the light-emitting element 20R emits red light, the light-emitting element 20G emits green light, and the light-emitting element 20B emits blue light. The light-emitting elements 20 are, for example, LED chips.

Each of the light-emitting elements 20 has, for example, the pair of electrodes 24 and 25 as illustrated in FIGS. 2A and 2B. The electrode 25 is, for example, electrically connected to the data wire 14, and the electrode 24 is, for example, electrically connected to the scan wire 15. Further, the electrode 25 is, for example, electrically connected to the data wire 14 via the pad electrode 13, and the electrode 24 is, for example, electrically connected to the scan wire 15 via the pad electrode 12. Still further, the data wires 14 and scan wires 15 are laid out identically in relation to all the light-emitting elements 20R, 20G and 20B that belong in the area α. That is, the data wires 14 and scan wires 15 are laid out identically in relation to the light-emitting elements 20R, 20G and 20B irrespective of the orientations of the crystal axes of the light-emitting elements 20.

The pad electrodes 12 and 13 are formed, for example, in the outermost layer and provided where each of the light-emitting devices 1 is mounted, for example, as illustrated in FIG. 45. Here, the pad electrodes 12 and 13 are made, for example, of a conductive material such as Au (gold).

The mounted board 210-1 further has, for example, a plurality of posts (not shown) adapted to restrict the gap between the mounted board 210-1 and transparent substrate 210-2. The posts may be provided in the area opposed to the display area 210A. Alternatively, the posts may be provided in the area opposed to the frame area 210B.
(Transparent Substrate 210-2)

The transparent substrate 210-2 is, for example, a glass or resin substrate. The surface of the transparent substrate 210-2 facing the mounted board 210-1 may be flat. However, the surface thereof should preferably be coarse. A coarse surface may be provided over the entire area opposed to the display area 210A. Alternatively, a coarse surface may be provided in areas opposed to the display pixels 16. A coarse surface has projections and depressions that are fine enough to scatter light emitted from the light-emitting elements 20 when the light strikes the coarse surface. The projections and depressions of the coarse surface can be produced, for example, by sand blasting or dry etching.
(Drive Circuit)

The drive circuit drives the plurality of display pixels 16 based on a video signal. The drive circuit includes, for example, a data driver and scan driver. The data driver drives the data wires 14 connected to the display pixels 16. The scan driver drives the scan wires 15 connected to the display pixels 16. The drive circuit may be mounted, for example, on the mounted board 210-1. Alternatively, the drive circuit may be provided separately from the display panel 210 and connected to the mounted board 210-1 via wires (not shown).
[Manufacturing Method of Display Panel 210]

A description will be given next of an example of the manufacturing method of the display panel 210.

First, a circuit board is prepared that has an insulating layer and wiring pattern (scan wires 15 and pad electrodes 12 and 13). The insulating layer includes the plurality of data wires 14. Next, the plurality of light-emitting elements 20 are mounted on the circuit board. At this time, the light-emitting elements 20 are mounted by the same method as described in the above embodiment, thus forming the mounted board 210-1. Next, the mounted board 210-1 and transparent substrate 210-2 are brought face to face and attached to each other. Thus, the display panel 210 is manufactured.
[Operation and Effect of Display Device 2]

In the present embodiment, the light-emitting elements 20 are driven (e.g., simple-matrix-driven) by the drive circuit via the data wires 14 and scan wires 15. This supplies a current sequentially to the light-emitting elements 20 provided near the intersections between the data wires 14 and scan wires 15, thus allowing for an image to be displayed in the display area 210A.

Incidentally, in the present embodiment, the light-emitting elements 20 used in the display pixels 16 are mounted on the circuit board by the same method as described in the above embodiment. Because of this, the inclinations of the radiation angles of the red LEDs are not uniform in plane. The striped patterns formed on the front surfaces of the green LEDs are not uniform in plane. Further, the striped patterns formed on the front surfaces of the blue LEDs are not uniform in plane. This contributes to reduced in-plane unbalance in FFP (Far Field Pattern) as compared to if the orientations of the crystal axes of the red LEDs are uniform in plane, if the orientations of the crystal axes of the green LEDs are uniform in plane, and if the orientations of the crystal axes of the blue LEDs are uniform in plane, thus providing improved robustness against uneven color and luminance. It should be noted that the deviation of the orientation of the crystal axis of each light-emitting element from the main axis generates a piezo electric field and causes polarization property to manifest itself. In the present embodiment, however, the respective polarization properties cancel each other out, thus providing a light-emitting device 2 free from uneven color and luminance as a whole.

4. Modification Examples of Second Embodiment

In the second embodiment, the orientations of the crystal axes of the LEDs of all colors are not uniform in plane. For example, however, the orientations of the crystal axes of the LEDs of one of the three colors may not be uniform in plane. For example, the orientations of the crystal axes of the red LEDs may not be uniform in plane. Alternatively, the orientations of the crystal axes of the green LEDs may not be uniform in plane. Still alternatively, the orientations of the crystal axes of the blue LEDs may not be uniform in plane. Still alternatively, the orientations of the crystal axes of the LEDs of two of the three colors may not be uniform in plane. For example, the orientations of the crystal axes of the red and green LEDs may not be uniform in plane. Alternatively, the orientations of the crystal axes of the red and blue LEDs may not be uniform in plane. Still alternatively, the orientations of the crystal axes of the green and blue LEDs may not be uniform in plane.

Further, in the second embodiment and modification examples thereof, the light-emitting elements 20 having the common crystal axes oriented in one direction and those having the common crystal axes oriented in another direction may emit different polarized light beams. For example, when of the plurality of light-emitting elements 20R, 20G and 20B that belong in the given area α, every three light-emitting elements 20, one light-emitting element 20R, one light-emitting element 20G and one light-emitting element 20B, adjacent to each other in the column direction are grouped together, the polarized light component emitted from one group (e.g., one display pixel 16) and that emitted from another group (e.g., another display pixel 16) may be different from each other. For example, if the off-angle is close to 90 degrees in each of the light-emitting elements 20R, 20G and 20B, polarized light is generated by the distortion effect. In this case, if the image for the right eye is displayed using one of the polarized light components and the image for the left eye is displayed using the other polarized light component, it is possible to visually perceive three-dimensional images.

Further, although, in the second embodiment and modification examples thereof, each of the display pixels 16 of the display device 2 includes LEDs of three colors, each of the display pixels 16 may include LEDs of four colors. Alternatively, each of the display pixels 16 may include LEDs of one or two colors.

5. Third Embodiment

[Configuration]

A description will be given next of a lighting device 3 according to a third embodiment of the present disclosure. The lighting device 3 has the light-emitting devices 1 according to the above embodiment arranged over the entire surface of a lighting panel. It should be noted that the lighting device 3 may include the plurality of light-emitting devices 1 according to the above embodiment arranged in a matrix (grid) or honeycomb form over the entire surface of a lighting panel.

Figure 46:
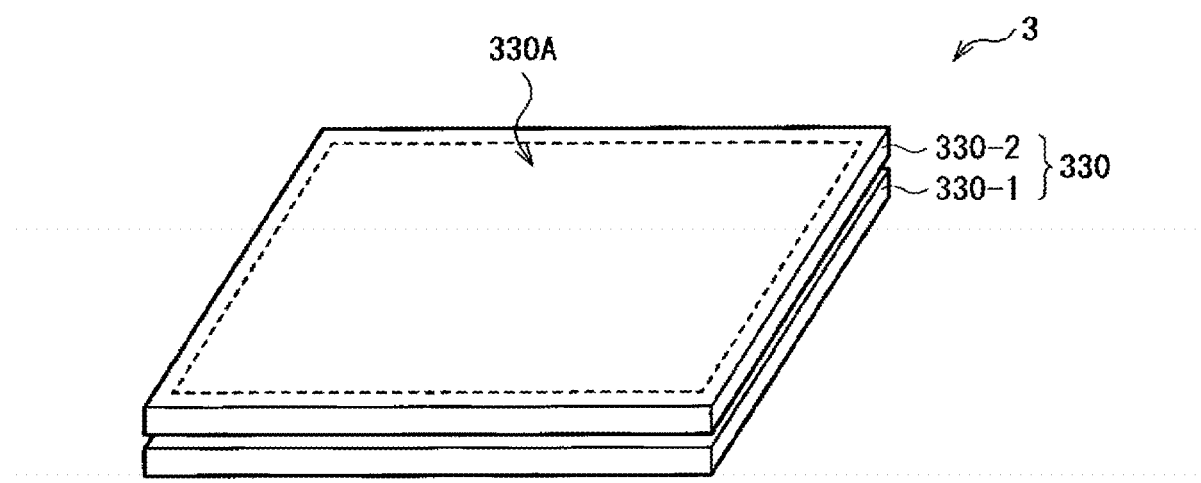
FIG. 46 is a perspective view illustrating an example of configuration of a lighting device according to a third embodiment of the present disclosure.

FIG. 46 perspectively illustrates an example of schematic configuration of the lighting device 3 according to the third embodiment of the present disclosure. The lighting device 3 is what is referred to as a LED light and uses LEDs as its light source. The lighting device 3 includes, for example, a lighting panel 330 and drive circuit (not shown) adapted to drive the lighting panel 330 as illustrated in FIG. 46.

(Lighting Panel 330)

The lighting panel 330 includes a mounted board 330-1 and transparent substrate 330-2 that are placed one on top of another. The surface of the transparent substrate 330-2 serves as an illumination light output surface that has a lighting area 330A in the center.

Figure 47:
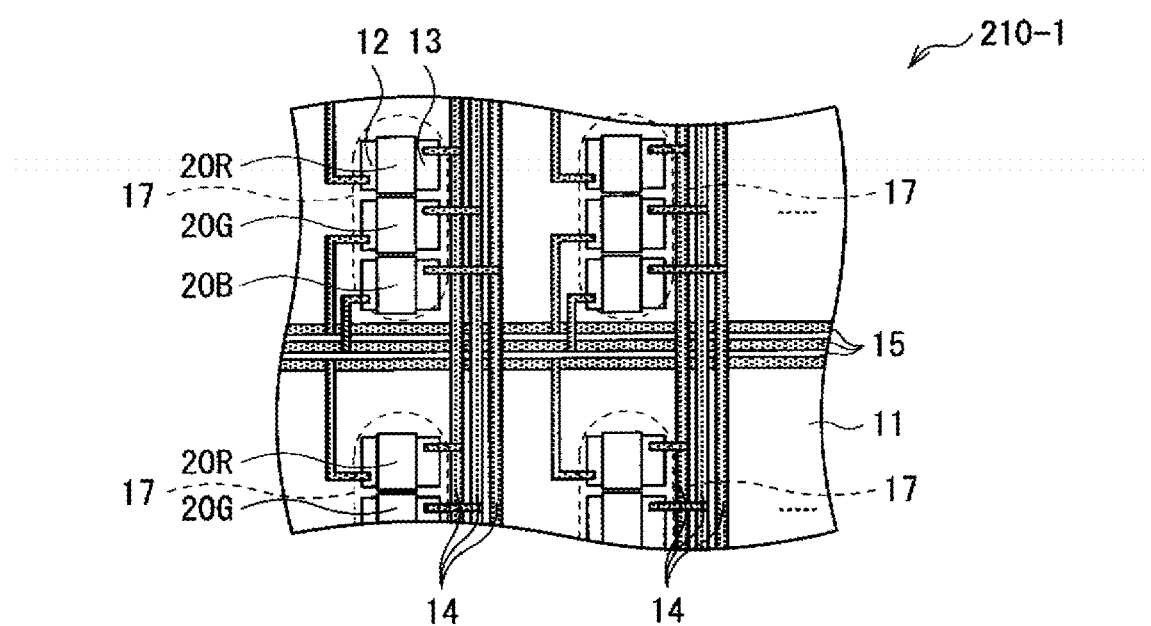
FIG. 47 is a plan view illustrating an example of layout on the front surface of the mounted board shown in FIG. 46.

FIG. 47 illustrates, of the surface of the mounted board 330-1 facing the transparent substrate 330-2, an example of layout in the area for the lighting area 330A. In the present embodiment, lighting pixels 17 are equivalent to the display pixels 16 shown in FIG. 45.

(Drive Circuit)

The drive circuit drives the plurality of lighting pixels 17. The drive circuit includes, for example, a data driver and scan driver. The data driver drives the data wires 14 connected to the lighting pixels 17. The scan driver drives the scan wires 15 connected to the lighting pixels 17. The drive circuit may be mounted, for example, on the mounted board 330-1. Alternatively, the drive circuit may be provided separately from the lighting panel 330.

[Manufacturing Method of Lighting Panel 330]

Next, an example of manufacturing method of the lighting panel 330 will be described.

First, for example, a circuit board is prepared that has an insulating layer and wiring pattern (scan wires 15 and pad electrodes 12 and 13). The insulating layer includes the plurality of data wires 14. At this time, the light-emitting elements 20 are mounted by the same method as already described in the above embodiment, thus forming the mounted board 330-1. Next, the mounted board 330-1 and transparent substrate 330-2 are brought face to face and attached to each other. Thus, the lighting panel 330 is manufactured.

[Operation and Effect of Lighting Device 3]

In the present embodiment, the light-emitting elements 20 are driven by the drive circuit via the data wires 14 and scan wires 15. This supplies a current to the light-emitting elements 20 provided near the intersections between the data wires 14 and scan wires 15, thus allowing for illumination light to be emitted from the lighting area 330A.

Incidentally, in the present embodiment, the light-emitting elements 20 used in the lighting pixels 17 are mounted on the circuit board by the same method as already described in the above embodiment. Because of this, the inclinations of the radiation angles of the red LEDs are not uniform in plane. The striped patterns formed on the surfaces of the green LEDs are not uniform in plane. Further, the striped patterns formed on the surfaces of the blue LEDs are not uniform in plane. As a result, as compared to if the orientations of the crystal axes of the red LEDs are uniform in plane, if the orientations of the crystal axes of the green LEDs are uniform in plane, and if the orientations of the crystal axes of the blue LEDs are uniform in plane, this contributes to improved robustness against uneven color and luminance. It should be noted that the deviation of the orientation of the crystal axis of each light-emitting element from the main axis generates a piezo electric field and causes polarization property to manifest itself. In the present embodiment, however, the respective polarization properties cancel each other out, thus providing the lighting device 3 free from uneven color and luminance as a whole.

6. Modification Examples of Third Embodiment

In the third embodiment, the orientations of the crystal axes of the LEDs of all colors are not uniform in plane. For example, however, the orientations of the crystal axes of the LEDs of one of the three colors may not be uniform in plane. For example, the orientations of the crystal axes of the red LEDs may not be uniform in plane. Alternatively, the orientations of the crystal axes of the green LEDs may not be uniform in plane. Still alternatively, the orientations of the crystal axes of the blue LEDs may not be uniform in plane. Still alternatively, the orientations of the crystal axes of the LEDs of two of the three colors may not be uniform in plane. For example, the orientations of the crystal axes of the red and green LEDs may not be uniform in plane. Alternatively, the orientations of the crystal axes of the red and blue LEDs may not be uniform in plane. Still alternatively, the orientations of the crystal axes of the green and blue LEDs may not be uniform in plane.

Further, although, in the third embodiment and modification examples thereof, each of the lighting pixels 17 of the lighting device 3 includes LEDs of three colors, each of the lighting pixels 17 may include LEDs of four colors. Alternatively, each of the lighting pixels 17 may include LEDs of one or two colors.

Although the present disclosure has been described with reference to the plurality of preferred embodiments and modification examples thereof, the present disclosure is not limited to the foregoing embodiments but may be modified in various ways.

In the above embodiments and so on, for example, the electrode 24 is formed on the top surface of the light-emitting element 20, and the electrode 25 is formed on the bottom surface of the same element 20. However, both of the electrodes 24 and 25 may be formed on the bottom surface of the light-emitting element 20. In this case, a mesa in a column form is, for example, formed that includes the first conductivity type layer 21, active layer 22 and second conductivity type layer 23 so that the electrode 24 is electrically connected to the top portion (first conductivity type layer 21) of the mesa in a column form and the electrode 25 is electrically connected to the foot portion of the mesa in a column form. The electrical connection between the second conductivity type layer 23 and electrode 25 is achieved, for example, by using a bump in a column form. It should be noted that the electrical connection between the first conductivity type layer 21 and electrode 24 may also be achieved, for example, by using a bump in a column form.

A description will be given below of an example of a transfer method of the light-emitting elements 20 if the electrodes 24 and 25 are formed on the bottom surface of each of the light-emitting elements 20. First, a wafer 1000R (not shown) is prepared that has a number of portions (light-emitting elements 220R (not shown)) of the light-emitting elements 20R, each without the electrodes 24 and 25, formed on a crystal growth substrate. Further, a wafer 1000G (not shown) is prepared that has a number of portions (light-emitting elements 220G (not shown)) of the light-emitting elements 20G, each without the electrodes 24 and 25, formed on a crystal growth substrate. Still further, a wafer 1000B (not shown) is prepared that has a number of portions (light-emitting elements 220B (not shown)) of the light-emitting elements 20B, each without the electrodes 24 and 25, formed on a crystal growth substrate. It should be noted that each of the light-emitting elements 220R, 220G and 220B has a multilayer structure made up of the second conductivity type layer 23, active layer 22 and first conductivity type layer 21 stacked in this order from the side of the crystal growth substrate. It should be noted that the second conductivity type layer 23, active layer 22 and first conductivity type layer 21 are not separated for each of the light-emitting elements 220R, 220G and 220B in this stage.

Further, a temporary fastening substrate 2000R (not shown) is prepared that is used to temporarily fasten the light-emitting elements 220R on the wafer 1000R. Similarly, a temporary fastening substrate 2000G (not shown) is prepared that is used to temporarily fasten the light-emitting elements 220G on the wafer 1000G, and a temporary fastening substrate 2000B (not shown) is prepared that is used to temporarily fasten the light-emitting elements 220B on the wafer 1000B. Each of the temporary fastening substrates 2000R, 2000G and 2000B includes a transparent substrate (e.g., quartz or sapphire substrate) and an unhardened adhesive layer provided on the transparent substrate.

Next, the wafer 1000R and temporary fastening substrate 2000R are attached to each other in such a manner that the light-emitting elements 220R on the wafer 1000R come into contact with the adhesive layer on the temporary fastening substrate 2000R, after which the adhesive layer is hardened. Next, the substrate of the wafer 1000R is removed, for example, by lapping, thus exposing the second conductivity type layer 23. Then, the electrodes 24 and 25 are formed on the exposed second conductivity type layer 23, and the light-emitting elements 220R are isolated from each other. Thus, the plurality of light-emitting elements 20R are formed on the temporary fastening substrate 2000R.

Next, the wafer 1000G and temporary fastening substrate 2000G are attached to each other in such a manner that the light-emitting elements 220G on the wafer 1000G come into contact with the adhesive layer on the temporary fastening substrate 2000G, after which the adhesive layer is hardened. Next, the substrate of the wafer 1000G is removed, for example, by laser irradiation, thus exposing the second conductivity type layer 23. Then, the electrodes 24 and 25 are formed on the exposed second conductivity type layer 23, and the light-emitting elements 220G are isolated from each other. Thus, the plurality of light-emitting elements 20G are formed on the temporary fastening substrate 2000G.

Similarly, the wafer 1000B and temporary fastening substrate 2000B are attached to each other in such a manner that the light-emitting elements 220B on the wafer 1000B come into contact with the adhesive layer on the temporary fastening substrate 2000B, after which the adhesive layer is hardened. Next, the substrate of the wafer 1000B is removed, for example, by laser irradiation, thus exposing the second conductivity type layer 23. Then, the electrodes 24 and 25 are formed on the exposed second conductivity type layer 23, and the light-emitting elements 220B are isolated from each other. Thus, the plurality of light-emitting elements 20B are formed on the temporary fastening substrate 2000B.

Next, the wiring board 10 is prepared to which the light-emitting elements 20R, 20G and 20B will be mounted (FIG. 10A or 10B). Next, the light-emitting elements 20R, 20G and 20B are mounted to the pad electrodes 13 on the wiring board 10 by the same method as described in the above embodiments. Further, the minute packages P may be formed or mounted to other wiring board as necessary by the same method as described in the above embodiments.

On the other hand, although the plurality of light-emitting elements 20 are mounted in a grid form in the above embodiments and so on, the same elements 20 may be mounted in a honeycomb form or in a line form. It should be noted that if the plurality of light-emitting elements 20 are mounted in a honeycomb form, it can be said in a broad sense that the same elements 20 are mounted in a matrix form. At this time, the column direction corresponds, for example, to the vertical direction, and the row direction corresponds, for example, to the direction in which a straight line connecting the adjacent light-emitting elements 20 extends. At this time, therefore, the row direction corresponds, for example, to the direction in which an upward sloping straight line or a downward sloping straight line extends.

Further, although the data wires 14 and scan wires 15 are used to drive the light-emitting elements 20 in the above embodiments and so on, other wiring pattern may be used.

The present disclosure contains subject matter related to that disclosed in Japanese Priority Patent Application JP 2010-232752 filed in the Japan Patent Office on Oct. 15, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
a display panel having a plurality of first light-emitting elements mounted in a matrix form on a common wiring board; and
a drive circuit adapted to drive the plurality of first light-emitting elements based on a video signal, wherein
each of the plurality of first light-emitting elements has a single crystal semiconductor multilayer structure and is a semiconductor element in a form of a chip that emits light in a given band of wavelengths, and
wherein each multilayer structure includes an active layer and at least one semiconductor layer formed over the active layer such that the active layer is between the at least one semiconductor layer and the common wiring board,
wherein each of the plurality of first light-emitting elements has a crystal axis, being a crystal growth axis, oriented at a non-zero angle to a direction normal to a surface of the light-emitting element, and
wherein first light-emitting elements adjacent to each other at least in one of row and column directions have crystal axes oriented at different non-zero angles.

2. The display device of claim 1 comprising:
a plurality of second light-emitting elements mounted in a matrix form on the wiring board together with the plurality of first light-emitting elements, wherein
each of the second light-emitting elements has a single crystal semiconductor multilayer structure and is a semiconductor element in a form of a chip that emits light in a band of wavelengths different from that for the first light-emitting elements, and
wherein each of the plurality of second light-emitting elements has a crystal axis oriented at a non-zero angle to a direction normal to a surface of the light-emitting element, and
wherein second light-emitting elements adjacent to each other at least in one of the row and column directions have crystal axes oriented at different non-zero angles.

3. The display device of claim 2, wherein
each of the first and second light-emitting elements has a plurality of electrodes,
the wiring board has first wires, each connected to one of the plurality of electrodes and second wires each connected to another of the plurality of electrodes, and
the first and second wires are laid out identically in relation to all the plurality of first and second light-emitting elements located in a first area of the wiring board.

4. The display device of claim 2, wherein
the first and second light-emitting elements are arranged alternately in the column direction, and
at least one first light-emitting element and at least one second light-emitting element adjacent to each other in the column direction emit different polarized light components.

* * * * *